US012588356B2

(12) United States Patent
Yamazaki et al.

(10) Patent No.: US 12,588,356 B2
(45) Date of Patent: Mar. 24, 2026

(54) DISPLAY APPARATUS

(71) Applicant: Semiconductor Energy Laboratory Co., Ltd., Atsugi (JP)

(72) Inventors: Shunpei Yamazaki, Setagaya (JP); Kenichi Okazaki, Atsugi (JP); Daiki Nakamura, Atsugi (JP); Rai Sato, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 408 days.

(21) Appl. No.: 18/276,077

(22) PCT Filed: Feb. 10, 2022

(86) PCT No.: PCT/IB2022/051180
§ 371 (c)(1),
(2) Date: Aug. 7, 2023

(87) PCT Pub. No.: WO2022/175789
PCT Pub. Date: Aug. 25, 2022

(65) Prior Publication Data
US 2024/0196712 A1 Jun. 13, 2024

(30) Foreign Application Priority Data

Feb. 19, 2021 (JP) ................................ 2021-025209
Feb. 19, 2021 (JP) ................................ 2021-025278

(51) Int. Cl.
*H10K 59/124* (2023.01)
*H10K 50/00* (2023.01)
(Continued)

(52) U.S. Cl.
CPC ............. *H10K 50/19* (2023.02); *H10K 50/00* (2023.02); *H10K 59/00* (2023.02); *H10K 59/124* (2023.02);
(Continued)

(58) Field of Classification Search
CPC ........ H10K 50/19; H10K 50/00; H10K 59/00; H10K 59/124; H10K 59/127; H10K 59/40;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 110323256 A 10/2019
JP 2000-036385 A 2/2000
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Donald L Raleigh
(74) *Attorney, Agent, or Firm* — Eric J. Robinson; Robinson Intellectual Property Law Office, P.C.

(57) ABSTRACT

A display apparatus with high display quality is provided. A highly reliable display apparatus is provided. A display apparatus with low power consumption is provided. A display apparatus with a high resolution is provided. A display apparatus with high contrast is provided. The display apparatus includes a plurality of pixels over a first insulating layer. Each of the plurality of pixels includes a first conductive layer provided along an opening portion of the first insulating layer, a second insulating layer over the first conductive layer, an EL layer over the first conductive layer and the second insulating layer, and a common electrode over the EL layer. The second insulating layer is over and in (Continued)

contact with the first conductive layer and placed below the EL layer. The first conductive layers of adjacent pixels are separated by a third insulating layer containing an inorganic material and a fourth insulating layer containing an organic material. A side surface of the first conductive layer and a side surface of the EL layer each include a region in contact with the third insulating layer. The fourth insulating layer is over and in contact with the third insulating layer and placed below the common electrode.

9 Claims, 26 Drawing Sheets

(51) Int. Cl.
| | |
|---|---|
| *H10K 50/19* | (2023.01) |
| *H10K 59/00* | (2023.01) |
| *H10K 59/127* | (2023.01) |
| *H10K 59/40* | (2023.01) |
| *H10K 59/65* | (2023.01) |
| *H10K 59/80* | (2023.01) |

(52) U.S. Cl.
CPC ........... *H10K 59/127* (2023.02); *H10K 59/40* (2023.02); *H10K 59/65* (2023.02); *H10K 59/8791* (2023.02)

(58) Field of Classification Search
CPC .. H10K 59/65; H10K 59/8791; H10K 59/122; H10K 59/121; H10K 39/34; G06F 3/042; G09F 9/00; G09F 9/30; H05B 33/12; H05B 33/14; H05B 33/22; H05B 33/26; H05B 33/28; H05B 33/06
See application file for complete search history.

(56) References Cited

U.S. PATENT DOCUMENTS

| | | | |
|---|---|---|---|
| 6,420,834 | B2 | 7/2002 | Yamazaki et al. |
| 6,555,968 | B2 | 4/2003 | Yamazaki et al. |
| 6,750,618 | B2 | 6/2004 | Yamazaki et al. |
| 7,098,602 | B2 | 8/2006 | Yamazaki et al. |
| 7,399,991 | B2 | 7/2008 | Seo et al. |
| 9,236,581 | B2 | 1/2016 | Kato et al. |
| 9,246,133 | B2 | 1/2016 | Yamazaki et al. |
| 10,698,481 | B1 | 6/2020 | Najafi Shoushtari et al. |
| 11,073,903 | B1 | 7/2021 | Ouderkirk et al. |
| 2001/0026125 | A1* | 10/2001 | Yamazaki ............ H10K 71/166 |
| | | | 313/506 |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2013/0300636 | A1 | 11/2013 | Cunningham et al. |
| 2014/0004640 | A1 | 1/2014 | Hamaguchi et al. |
| 2014/0004642 | A1 | 1/2014 | Otsuka et al. |
| 2014/0084258 | A1 | 3/2014 | Choi |
| 2014/0306201 | A1 | 10/2014 | Yamazaki et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0057330 | A1 | 2/2020 | Yamazaki et al. |
| 2020/0203662 | A1 | 6/2020 | Mollard et al. |
| 2021/0089118 | A1 | 3/2021 | Jaeken et al. |
| 2021/0165213 | A1 | 6/2021 | Balachandreswaran |
| 2022/0173174 | A1 | 6/2022 | Hatsumi et al. |
| 2022/0278177 | A1 | 9/2022 | Kubota et al. |
| 2022/0350150 | A1 | 11/2022 | Ikeda et al. |

FOREIGN PATENT DOCUMENTS

| | | |
|---|---|---|
| JP | 2001-345179 A | 12/2001 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-220235 A | 11/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| TW | 484238 | 4/2002 |
| TW | 201413934 | 4/2014 |
| WO | WO-2018/087625 | 5/2018 |
| WO | WO-2021/009621 | 1/2021 |
| WO | WO-2022/175789 | 8/2022 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/051180) Dated Apr. 26, 2022.

Written Opinion (Application No. PCT/IB2022/051180) Dated Apr. 26, 2022.

(56)          References Cited

OTHER PUBLICATIONS

Taiwanese Office Action (Application No. 111105203) dated Nov. 4, 2025.

\* cited by examiner

FIG. 1A
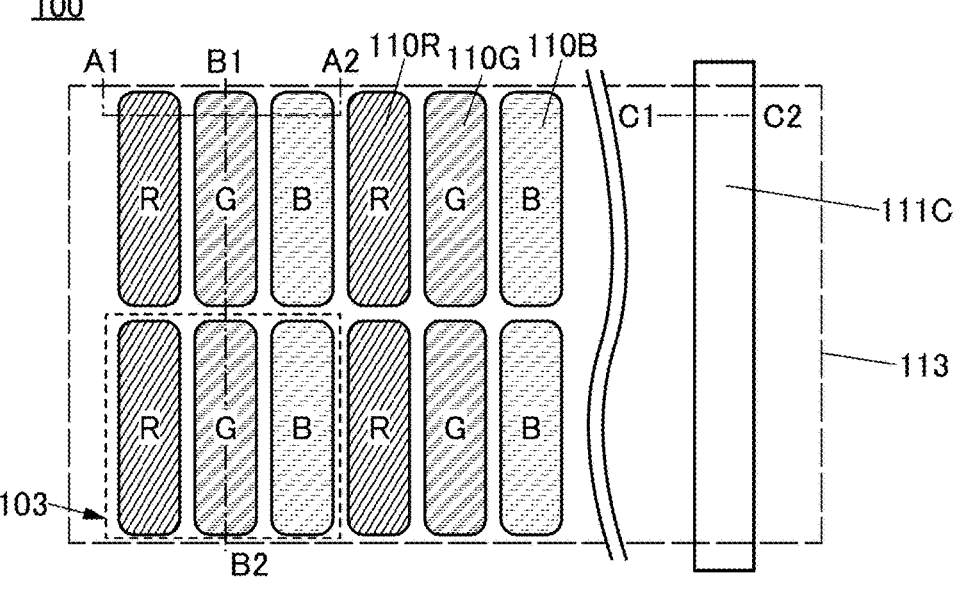
FIG. 1B
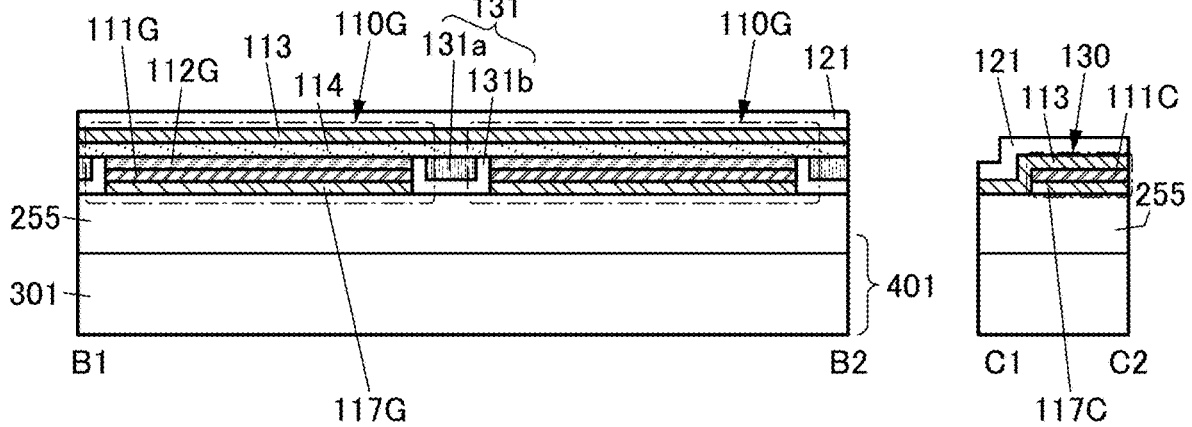
FIG. 1C
FIG. 1D

FIG. 16A     FIG. 16B     FIG. 16C
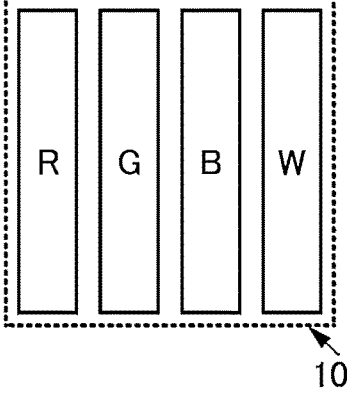
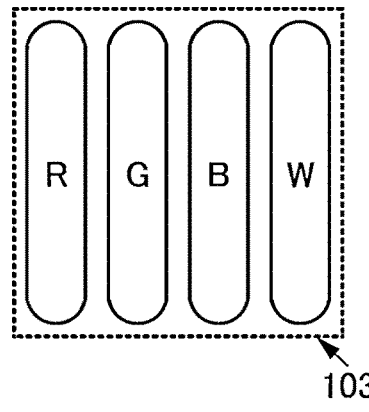
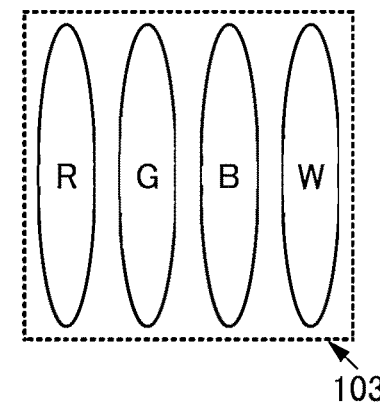
FIG. 16D     FIG. 16E     FIG. 16F
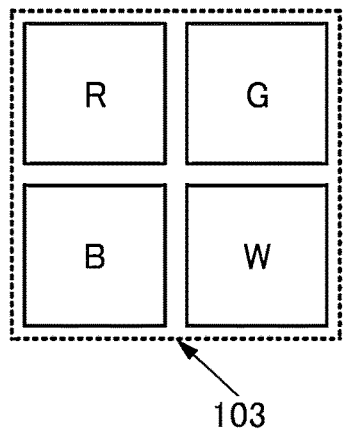
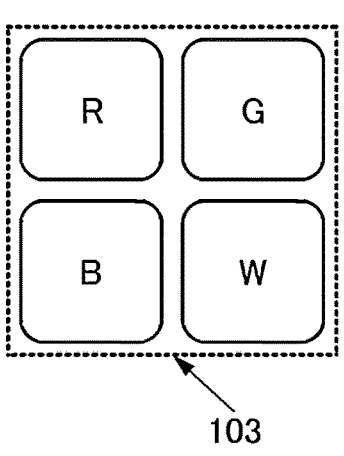
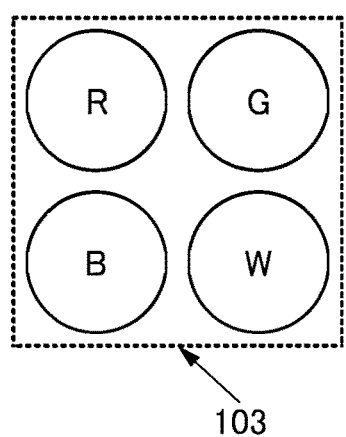
FIG. 16G
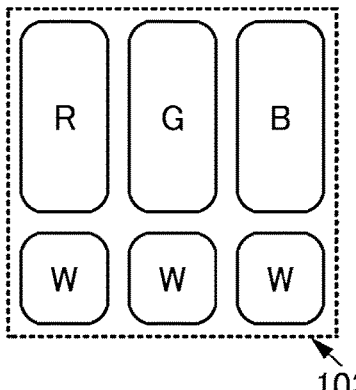

FIG. 20A
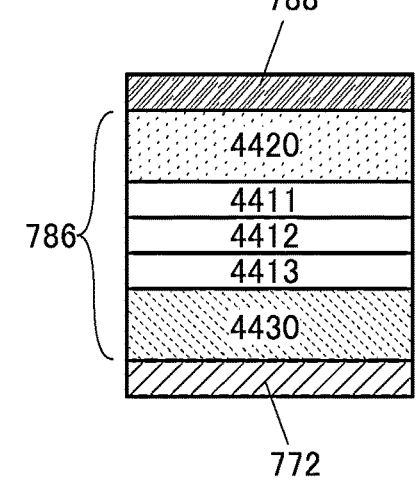
FIG. 20B
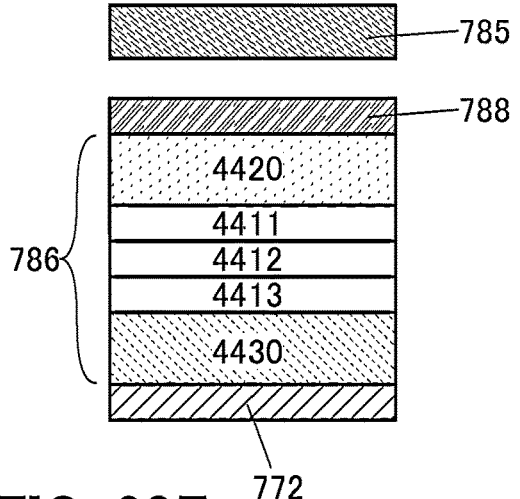
FIG. 20C
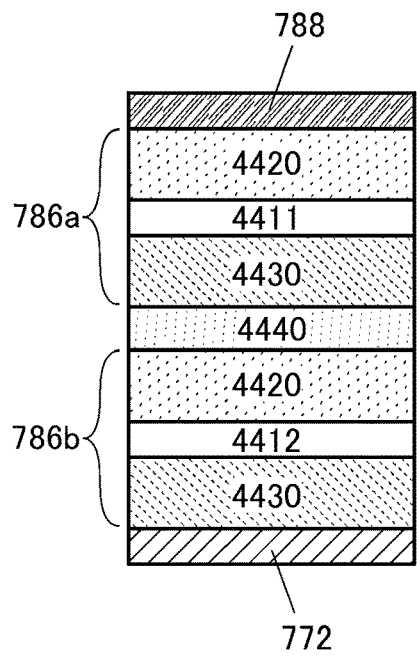
FIG. 20D
FIG. 20E
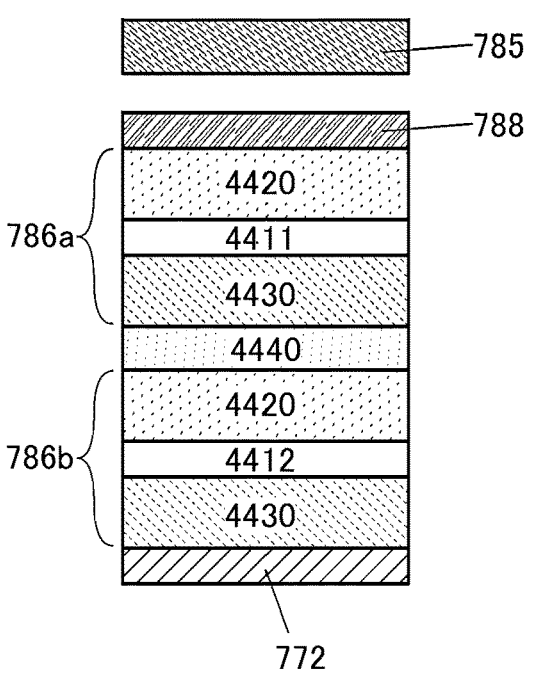
FIG. 20F

FIG. 24A
7100
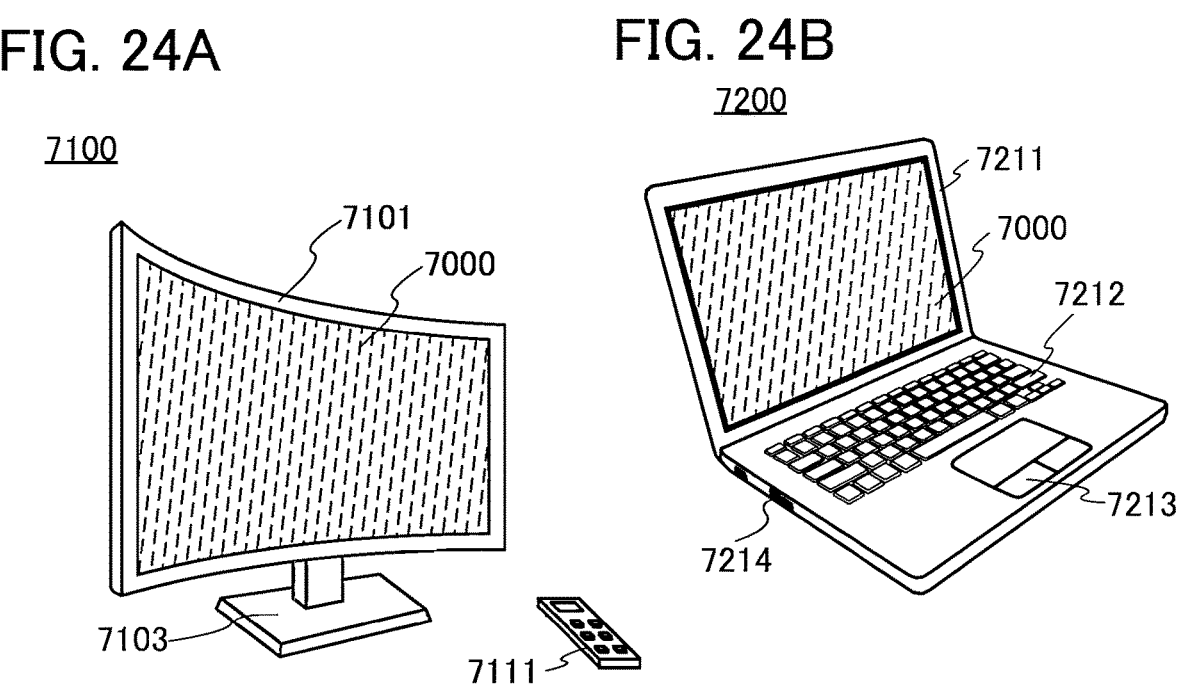
FIG. 24B
7200
FIG. 24C
7300
FIG. 24D
7400
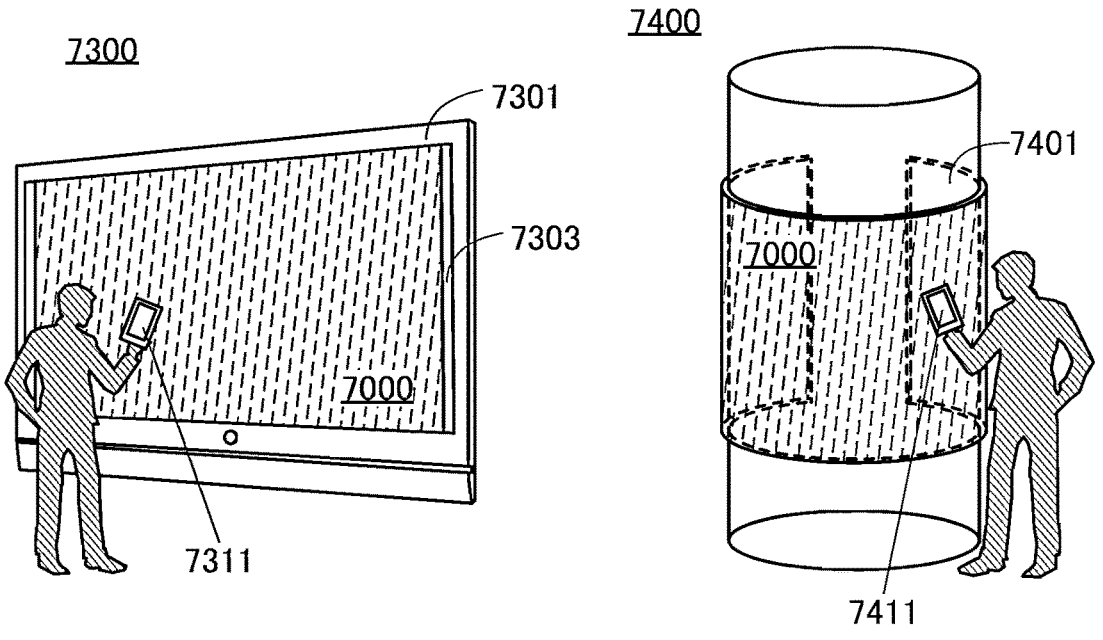

9101

9102

9103

9200

9201

9201

9201

DISPLAY APPARATUS

TECHNICAL FIELD

One embodiment of the present invention relates to a display apparatus. One embodiment of the present invention relates to a method for fabricating a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display apparatus such as a television device or a monitor device along with an increase in definition. An example of a device required to have the highest resolution is a device for virtual reality (VR) or augmented reality (AR).

Examples of a display apparatus that can be used for a display panel include, typically, a liquid crystal display apparatus, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure where a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. Patent Document 1, for example, discloses an example of a display apparatus using an organic EL element.

Patent Document 2 discloses a display apparatus using an organic EL device for VR.

REFERENCES

Patent Documents

[Patent Document 1] Japanese Published Patent Application No. 2002-324673
[Patent Document 2] PCT International Publication No. 2018/087625

SUMMARY OF THE INVENTION

Problems to be Solved by the Invention

An object of one embodiment of the present invention is to provide a display apparatus with high display quality. An object of one embodiment of the present invention is to provide a highly reliable display apparatus. An object of one embodiment of the present invention is to provide a display apparatus with low power consumption. An object of one embodiment of the present invention is to provide a display apparatus that can easily achieve a higher resolution. An object of one embodiment of the present invention is to provide a display apparatus having both high display quality and a high resolution. An object of one embodiment of the present invention is to provide a display apparatus with high contrast.

An object of one embodiment of the present invention is to provide a display apparatus having a novel structure or a method for fabricating a display apparatus. An object of one embodiment of the present invention is to provide a method for manufacturing the above-described display apparatus with high yield. An object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a plurality of pixels over a first insulating layer. Each of the plurality of pixels includes a first conductive layer provided along an opening portion of the first insulating layer, a second insulating layer over the first conductive layer, an EL layer over the first conductive layer and the second insulating layer, and a common electrode over the EL layer. The common electrode is shared by the plurality of pixels. The second insulating layer is over and in contact with the first conductive layer and placed below the EL layer. The first conductive layers of adjacent pixels among the plurality of pixels are separated by a third insulating layer containing an inorganic material and a fourth insulating layer containing an organic material. A side surface of the first conductive layer and a side surface of the EL layer each include a region in contact with the third insulating layer. The fourth insulating layer is over and in contact with the third insulating layer and placed below the common electrode.

In the above structure, the third insulating layer preferably contains aluminum and oxygen. It is also preferable that the second insulating layer be formed by an ALD method and a temperature of formation of the second insulating layer by an ALD method be higher than or equal to 60° C. and lower than or equal to 150° C. Note that aluminum oxide formed by an ALD method contains carbon in some cases.

Another embodiment of the present invention is a display apparatus including a first pixel and a second pixel placed to be adjacent to the first pixel over a first insulating layer. The first pixel includes a first light-emitting element including a first conductive layer provided along a first opening portion of the first insulating layer, a second insulating layer over the first conductive layer, a first EL layer over the first conductive layer and the second insulating layer, and a common electrode over the first EL layer. The second pixel includes a second light-emitting element including a second conductive layer provided along a second opening portion of the first insulating layer, a third insulating layer over the second conductive layer, a second EL layer over the second conductive layer and the third insulating layer, and the common electrode over the second EL layer. A fourth insulating layer is further included. A side surface of the first conductive layer, a side surface of the first EL layer, a side surface of the second conductive layer, and a side surface of the second EL layer each include a region in contact with the fourth insulating layer. A fifth insulating layer provided over and in contact with the fourth insulating layer and placed below the common electrode is further included. The second insulating layer is provided over and in contact with the first conductive layer and placed below the first EL layer. The third insulating layer is over and in contact with the second conductive layer and placed below the second EL layer. The fourth insulating layer contains an inorganic material. The fifth insulating layer contains an organic material.

In the above structure, it is preferable that the fourth insulating layer be formed by an ALD method and a temperature of formation of the fourth insulating layer by an ALD method be higher than or equal to 60° C. and lower than or equal to 150° C.

One embodiment of the present invention is a display apparatus including a plurality of pixels over a first insulating layer. Each of the plurality of pixels includes a light-emitting device and a light-receiving device. The light-emitting device includes a first conductive layer provided along an opening portion of the first insulating layer, a second insulating layer over the first conductive layer, an EL layer over the first conductive layer and the second insulating layer, and a common electrode over the EL layer. The common electrode is shared by the plurality of pixels. The second insulating layer is over and in contact with the first conductive layer and placed below the EL layer. The first conductive layers of adjacent pixels among the plurality of pixels are separated by a third insulating layer containing an inorganic material and a fourth insulating layer containing an organic material. A side surface of the first conductive layer and a side surface of the EL layer each include a region in contact with the third insulating layer. The fourth insulating layer is over and in contact with the third insulating layer and placed below the common electrode. The light-receiving device has a function of detecting at least one of visible light and infrared light.

In the above structure, the light-receiving device preferably has a function of an image sensor.

In the above structure, the light-receiving device preferably has a function of a touch sensor or a near touch sensor.

Another embodiment of the present invention is a display apparatus including a first pixel and a second pixel placed to be adjacent to the first pixel over a first insulating layer. The first pixel includes a light-emitting device including a first conductive layer provided along a first opening portion of the first insulating layer, a second insulating layer over the first conductive layer, and an EL layer over the first conductive layer and the second insulating layer. The second pixel includes a light-receiving device including a second conductive layer provided along a second opening portion of the first insulating layer, a third insulating layer over the second conductive layer, and an active layer over the second conductive layer and the third insulating layer. A side surface of the first conductive layer, a side surface of the EL layer, and a side surface of the second conductive layer each include a region in contact with the fourth insulating layer. A fifth insulating layer provided over and in contact with the fourth insulating layer is further included. The second insulating layer is over and in contact with the first conductive layer and placed below the EL layer. The third insulating layer is over and in contact with the second conductive layer and placed below the active layer. The fourth insulating layer contains an inorganic material. The fifth insulating layer contains an organic material.

In the above structure, it is preferable that a common electrode over the EL layer and the active layer be further included, and the third insulating layer and the fifth insulating layer be placed below the common electrode.

Effect of the Invention

According to one embodiment of the present invention, a display apparatus with high display quality can be provided. A highly reliable display apparatus can be provided. A display apparatus with low power consumption can be provided. A display apparatus that can easily achieve a higher resolution can be provided. A display apparatus with both high display quality and a high resolution can be provided. A display apparatus with high contrast can be provided.

According to one embodiment of the present invention, a display apparatus having a novel structure or a method for fabricating a display apparatus can be provided. A method for manufacturing the above-described display apparatus with high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 1A to FIG. 1D are diagrams illustrating a structure example of a display apparatus.

FIG. 9A, FIG. 9B, and FIG. 9C are cross-sectional views illustrating an example of a display apparatus.

FIG. 16A to FIG. 16G are diagrams illustrating examples of a pixel of a display apparatus.

FIG. 20A to FIG. 20F are diagrams illustrating structure examples of a light-emitting device.

FIG. 24A to FIG. 24D are diagrams illustrating examples of an electronic device.

MODE FOR CARRYING OUT THE INVENTION

Figure 2A:
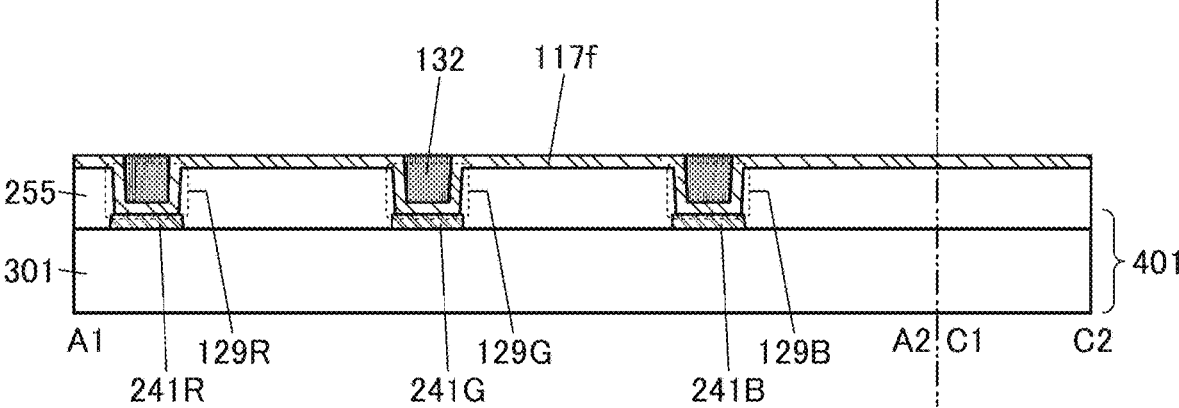
FIG. 2A to FIG. 2C are diagrams illustrating a fabrication method example of a display apparatus.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first" and "second" are used in order to avoid confusion among components and do not limit the number.

In addition, in this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the light-emitting layer and the layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. The material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

In this specification and the like, a device formed using a metal mask or an FMM (fine metal mask) is sometimes referred to as a device having an MM (metal mask) structure. In this specification and the like, a device formed without using a metal mask or an FMM is sometimes referred to as a device having an MML (metal maskless) structure.

In this specification and the like, a structure where light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light is sometimes referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more of light-emitting layers are selected such that their emission colors are complementary to each other. For example, when the emission color of a first light-emitting layer and the emission color of a second light-emitting layer are complementary colors, the light-emitting device can be configured to emit white light as a whole. The same applies to a light-emitting device including three or more light-emitting layers.

When light-emitting layers that emit light of the same color are used in each light-emitting unit, luminance per predetermined current can be increased, and the light-emitting device can have higher reliability than that with a single structure. To obtain white light emission with a tandem structure, the structure is made so that light from light-emitting layers of the plurality of light-emitting units can be combined to be white light. Note that a combination of emission colors for obtaining white light emission is similar to that in the case of a single structure. In the device having a tandem structure, an intermediate layer such as a charge generation layer is suitably provided between the plurality of light-emitting units.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device having a tandem structure, an intermediate layer such as a charge generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

Embodiment 1

In this embodiment, a structure example of a display apparatus of one embodiment of the present invention and an example of a method for fabricating the display apparatus will be described.

One embodiment of the present invention is a display apparatus including a light-emitting element (also referred to as a light-emitting device). The display apparatus includes at least two light-emitting elements that emit light of different colors. The light-emitting elements each include a pair of electrodes and an EL layer therebetween. As the light-emitting element, an electroluminescent element such as an organic EL element or an inorganic EL element can be used. Besides, a light-emitting diode (LED) can be used. The light-emitting element of one embodiment of the present invention is preferably an organic EL element (organic electroluminescent element). The two or more light-emitting elements that exhibit different colors include EL layers containing different materials. For example, three kinds of light-emitting elements emitting light of red (R), green (G), and blue (B) are included, whereby a full-color display apparatus can be achieved.

Here, in the case where the EL layers are separately formed for light-emitting elements of different colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the vapor-scattering-induced expansion of outline of the formed film; accordingly, it is difficult to achieve a high resolution and a high aperture ratio of the display apparatus. In addition, dust derived from a material attached to the metal mask in evaporation is generated in some cases. Such dust might cause defective patterning of the light-emitting elements. In addition, a short circuit derived from the dust may occur. A step of cleaning the material attached to the metal mask is necessary. Thus, a measure has been taken for pseudo improvement in resolution (also referred to as a pixel density) by employing a unique pixel arrangement method such as PenTile arrangement, for example.

In one embodiment of the present invention, fine patterning of an EL layer is performed without a shadow mask such as a metal mask. This allows fabrication of a display apparatus with a high resolution and a high aperture ratio that has been difficult to achieve. Moreover, EL layers can be formed separately, enabling the display apparatus to perform extremely clear display with high contrast and high display quality.

Here, description is made on the case where EL layers in light-emitting elements of two colors are separately formed, for simplicity. First, a stack of a first EL film and a first sacrificial film is formed to cover a conductive film to be pixel electrodes. Next, a resist mask is formed over the first sacrificial film. Then, part of the first sacrificial film and part of the first EL film are etched using the resist mask, so that a first EL layer and a first sacrificial layer over the first EL layer are formed.

Next, a stack of a second EL film and a second sacrificial film is formed. Then, part of the second sacrificial film and part of the second EL film are etched using the resist mask, so that a second EL layer and a second sacrificial layer over the second EL layer are formed. Next, the conductive film to be the pixel electrodes is processed using the first sacrificial layer and the second sacrificial layer as a mask, so that a first pixel electrode overlapping with the first EL layer and a second pixel electrode overlapping with the second EL layer are formed. In this manner, the first EL layer and the second EL layer can be formed separately. Finally, the first sacrificial layer and the second sacrificial layer are removed, and a common electrode is formed, whereby light-emitting elements of two colors can be formed separately.

Furthermore, by repeating the above-described steps, EL layers in light-emitting elements of three or more colors can be separately formed; thus, a display apparatus including light-emitting elements of three colors or four or more colors can be achieved.

In one embodiment of the present invention, the sacrificial layer is formed using a resist mask, and the EL layer and the pixel electrode can be processed using the formed sacrificial layer; thus, a light-emitting element can be formed without use of different resist masks for processing the pixel electrode and processing the EL layer. Accordingly, a margin for the positions of the end portions of the pixel electrode and the EL layer is not necessarily provided for forming a light-emitting element. With a reduction in the margin for the positions, a light-emitting region can be extended, whereby the aperture ratio of the light-emitting element can be increased. Moreover, with a reduction in the margin for the positions, a reduction in the pixel size is possible, whereby the display apparatus can have a higher resolution. Furthermore, the number of uses of the resist masks can be reduced and accordingly the process can be simplified, which enables a reduction in cost and an improvement in yield.

In the case where EL layers for different colors are adjacent to each other, it is difficult to set the distance between the EL layers adjacent to each other to less than 10 µm with a formation method using a metal mask, for example; however, with the use of the above method, the distance can be decreased to less than or equal to 3 µm, less than or equal to 2 µm, or less than or equal to 1 µm. For example, with the use of an exposure apparatus for LSI, the distance can be decreased to less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern, which causes a reduction in an effective area that can be used as a light-emitting region with respect to the entire pattern area. By contrast, in the above fabrication method, a pattern is formed by processing a film formed to have a uniform thickness, which enables a uniform thickness in the pattern; thus, even with a fine pattern, almost the entire area can be used as a light-emitting region. Therefore, the above fabrication method makes it possible to achieve both a high resolution and a high aperture ratio.

As described above, with the above fabrication method, a display apparatus in which minute light-emitting elements are integrated can be obtained, and it is not necessary to conduct a pseudo improvement in resolution by employing a unique pixel arrangement such as a PenTile arrangement; thus, the display apparatus can achieve a resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

In addition, one embodiment of the present invention enables highly accurate fabrication of minute light-emitting elements, and thus can achieve a complicated pixel arrangement method. For example, not only stripe arrangement, but also a variety of arrangement methods such as S stripe arrangement, Bayer arrangement, and delta arrangement can be employed.

Note that in this specification and the like, the aperture ratio (effective light-emitting area ratio) refers to a proportion of the area of a region that can be regarded as a light-emitting region in one pixel in the area of one pixel calculated from a repeated pixel pitch in a display apparatus.

More specific structure examples and fabrication method examples of a display apparatus of one embodiment of the present invention will be described below with reference to drawings.

[Structure Example 1 of Display Apparatus]

FIG. 1A is a schematic top view of a display apparatus 100 of one embodiment of the present invention. The display apparatus 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called stripe arrangement, in which the light-emitting elements of the same color are arranged in one direction. Note that the arrangement method of the light-emitting elements is not limited thereto; another arrangement method such as delta arrangement or zigzag arrangement may be used, or PenTile arrangement can be used.

As the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. As examples of a light-emitting substance contained in the EL element, a substance that emits fluorescent light (a fluorescent material), a substance that emits phosphorescent light (a phosphorescent material), an inorganic compound (e.g., a quantum dot material), a substance exhibiting thermally activated delayed fluorescence (a thermally activated delayed fluorescence (TADF) material), and the like can be given.

FIG. 1B is a schematic cross-sectional view taken along a dashed-dotted line A1-A2 and a dashed-dotted line C1-C2 in FIG. 1A, and FIG. 1C is a schematic cross-sectional view taken along a dashed-dotted line B1-B2.

In the cross-sectional view illustrated in FIG. 1B, a light-emitting element 110R, a light-emitting element 110G, and a light-emitting element 110B (hereinafter collectively referred to as a light-emitting element 110) are provided over a layer 401. The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113. Note that the pixel electrode 111R, the pixel electrode 111G, and the pixel electrode 111B are collectively referred to as a pixel electrode 111 below.

FIG. 1B illustrates, as a simplified example of the layer 401, an example where a conductive layer 241R, a conductive layer 241G, and a conductive layer 241B (hereinafter collectively referred to as a conductive layer 241) are provided over a substrate 301; however, the layer 401 is preferably provided with a semiconductor element. Examples of the semiconductor element include a transistor, a diode, and a capacitor.

Specifically, for example, the layer 401 is provided with a transistor, and the conductive layer 241 has a function of a source electrode, a drain electrode, or a gate electrode of the transistor.

Alternatively, for example, the conductive layer 241 is electrically connected to the semiconductor element provided in the layer 401. The conductive layer 241 has a function of a wiring or an electrode, for example.

The conductive layer 241R, the conductive layer 241G, and the conductive layer 241B are electrically connected to the light-emitting element 110R, the light-emitting element 110G, and the light-emitting element 110B, respectively.

An insulating layer 255 is provided over the layer 401 including the conductive layer 241, and a plurality of opening portions are provided in the insulating layer 255 over the conductive layer 241. FIG. 1B illustrates an opening portion 129R, an opening portion 129G, and an opening portion 129B (hereinafter collectively referred to as an opening portion 129) as the opening portions. In the illustrated example, the opening portion 129R, the opening portion 129G, and the opening portion 129B are provided over the conductive layer 241R, the conductive layer 241G, and the conductive layer 241B, respectively. A conductive layer 117R, a conductive layer 117G, and a conductive layer 117B (hereinafter collectively referred to as a conductive layer 117) are provided in the opening portion 129R, the opening portion 129G, and the opening portion 129B, respectively. The conductive layer 117 is provided in the opening portion 129 and over the insulating layer 255. The conductive layer 117 is preferably provided along the bottom surface and side surface of the opening portion 129. The conductive layer 117 is electrically connected to the conductive layer 241. The conductive layer 117 is preferably in contact with the top surface of the conductive layer 241 in the opening portion 129.

The conductive layer 117 illustrated in FIG. 1C is provided along the opening portion of the insulating layer 255 and includes a depressed portion. An insulating layer 132 is preferably provided to be embedded in the depressed portion.

The insulating layer 132 has a function of planarizing the depressed portion of the conductive layer 117. In other words, the insulating layer 132 has an effect of improving the planarity of the formation surface of the layers of the light-emitting element 110. When coverage with an EL layer is poor in a light-emitting element, for example, a region where the EL layer is thin might be generated and a lower electrode and a common electrode might be short-circuited. In addition, the coverage with the common electrode might be poor, resulting in disconnection, thinning, resistance increase, or the like of the common electrode. Provision of the insulating layer 132 enables the layers of the light-emitting element to be provided uniformly, thereby achieving a display apparatus with high reliability and high display quality.

An insulating layer containing an organic material can be suitably used for the insulating layer 132. For the insulating layer 132, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. Alternatively, the insulating layer 132 can be formed using a photosensitive resin. As the photosensitive resin, a positive material or a negative material can be used.

When the insulating layer 132 is formed using a photosensitive resin, the insulating layer 132 can be fabricated only by light exposure and development steps; hence, adverse effects of dry etching, wet etching, or the like on the surface of the conductive layer 117 can be reduced. When the insulating layer 132 is formed using a negative photosensitive resin, the insulating layer 132 can sometimes be formed using the same photomask (light-exposure mask) as a photomask used for forming the opening portion 129.

The pixel electrode 111R is provided over the conductive layer 117R and the insulating layer 132. The pixel electrode 111R preferably includes a first region in contact with the top surface of the conductive layer 117R and a second region in contact with the top surface of the insulating layer 132. The top surface of the conductive layer 117R in contact with the first region and the top surface of the insulating layer 132 in contact with the second region are preferably substantially level with each other.

The pixel electrode 111G is provided over the conductive layer 117G and the insulating layer 132. The pixel electrode 111G preferably includes a first region in contact with the top surface of the conductive layer 117G and a second region in contact with the top surface of the insulating layer 132. The top surface of the conductive layer 117G in contact with the first region and the top surface of the insulating layer 132 in contact with the second region are preferably substantially level with each other.

The pixel electrode 111B is provided over the conductive layer 117B and the insulating layer 132. The pixel electrode 111B preferably includes a first region in contact with the top surface of the conductive layer 117B and a second region in contact with the top surface of the insulating layer 132. The top surface of the conductive layer 117B in contact with the first region and the top surface of the insulating layer 132 in contact with the second region are preferably substantially level with each other.

The EL layer 112R, the EL layer 112G, and the EL layer 112B are provided over the pixel electrode 111R, the pixel electrode 111G, and the pixel electrode 111B, respectively. The common electrode 113 is provided over the EL layer 112R, the EL layer 112G, and the EL layer 112B (hereinafter collectively referred to as an EL layer 112).

The EL layer 112R contains at least a light-emitting organic compound that emits red light. The EL layer 112G contains at least a light-emitting organic compound that emits green light. The EL layer 112B contains at least a light-emitting organic compound that emits blue light.

The EL layer 112R, the EL layer 112G, and the EL layer 112B each include a layer containing a light-emitting organic compound (a light-emitting layer). The light-emitting layer may contain one or more kinds of compounds (e.g., a host material and an assist material) in addition to the light-emitting substance (a guest material). As the host material and the assist material, one or more kinds of substances whose energy gap is larger than the energy gap of the light-emitting substance (the guest material) can be selected and used. As the host material and the assist material, compounds that form an exciplex are preferably used in combination. In order to form an exciplex efficiently, it is particularly preferable to combine a compound that easily accepts holes (a hole-transport material) and a compound that easily accepts electrons (an electron-transport material).

Either a low molecular compound or a high molecular compound can be used for the light-emitting element, and an inorganic compound (e.g., a quantum dot material) may also be contained.

The EL layer 112R, the EL layer 112G, and the EL layer 112B may each include one or more of an electron-injection layer, an electron-transport layer, a hole-injection layer, and a hole-transport layer in addition to the light-emitting layer.

In addition, a common layer 114 may be provided between the EL layer 112 and the common electrode 113. Like the common electrode 113, the common layer 114 is provided across a plurality of light-emitting elements. The common layer 114 is provided to cover the EL layer 112R, the EL layer 112G, and the EL layer 112B. The structure including the common layer 114 can simplify the fabrication process, reducing the fabrication cost. The common layer 114 and the common electrode 113 can be formed successively without an etching step or the like between formations of the common layer 114 and the common electrode 113. Thus, the interface between the common layer 114 and the common electrode can be clean, and the light-emitting element can have favorable characteristics.

The common layer 114 is preferably in contact with one or more of the top surfaces of the EL layer 112R, the EL layer 112G, and the EL layer 112B.

Each of the EL layer 112R, the EL layer 112G, and the EL layer 112B preferably includes at least a light-emitting layer containing a light-emitting material emitting light of one color, for example. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114, for example.

The pixel electrode 111R, the pixel electrode 111G, and the pixel electrode 111B are provided for the respective light-emitting elements. The common electrode 113 is provided as a continuous layer shared by the light-emitting elements. A conductive film that has a property of transmitting visible light is used for either the respective pixel electrodes or the common electrode 113, and a reflective conductive film is used for the other. When the pixel electrodes have light-transmitting properties and the common electrode 113 has a reflective property, a bottom-emission display apparatus can be obtained; in contrast, when the pixel electrodes have reflective properties and the common electrode 113 has a light-transmitting property, a top-emission display apparatus can be obtained. Note that when both the pixel electrodes and the common electrode 113 have light-transmitting properties, a dual-emission display apparatus can be obtained.

A protective layer 121 is provided over the common electrode 113 to cover the light-emitting element 110R, the light-emitting element 110G, and the light-emitting element 110B. The protective layer 121 has a function of preventing diffusion of impurities such as water into the light-emitting elements from above. When both the pixel electrodes and the common electrode have light-transmitting properties, the light-emitting elements can transmit external light; thus, a display through which the background can be seen, that is, what is called a transparent display can be obtained.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

As the protective layer 121, a stacked-layer film of an inorganic insulating film and an organic insulating film can be used. For example, a structure where an organic insulating film is interposed between a pair of inorganic insulating films is preferable. Furthermore, the organic insulating film preferably functions as a planarization film. This enables the top surface of the organic insulating film to be flat, and accordingly coverage with the inorganic insulating film thereover is improved, leading to an improvement in barrier properties. Moreover, this structure is preferable because when a component (e.g., a color filter, an electrode of a touch sensor, a lens array, or the like) is provided above the protective layer 121, the flat top surface of the protective layer 121 allows the component to be less affected by an uneven shape caused by the lower components.

A structure may be employed where a substrate is bonded to the top surface of the protective layer 121 with a resin layer.

In the cross section illustrated in FIG. 1C, two light-emitting elements 110G are provided to be adjacent to each other. In the cross section illustrated in FIG. 1C, the layer 401 is not provided with the conductive layer 241 and the insulating layer 255 is not provided with an opening portion overlapping with the conductive layer 241. Thus, the pixel electrode 111G included in the light-emitting element 110G is provided over a flat region of the insulating layer 255.

FIG. 1A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or may be provided along two or more sides of the outer periphery of the display region. That is, in the case where the display region has a rectangular top surface, the top surface of the connection electrode 111C can have a belt-like shape, an L-like shape, a U-like shape (a square bracket shape), a quadrangular shape, or the like.

FIG. 1B illustrates a cross section corresponding to the dashed-dotted line C1-C2 shown in FIG. 1A. In the illustrated cross section along C1-C2, a region 130 where the connection electrode 111C and the common electrode 113 that are provided over the conductive layer 117C are electrically connected to each other is provided. In the region 130, the common electrode 113 is provided over the connection electrode 111C and the protective layer 121 is provided to cover the common electrode 113. The connection electrode 111C and the common electrode 113 are preferably in contact with each other. In addition, in the connection portion of the connection electrode 111C and the common electrode 113, an insulating layer 131 is provided to be in contact with end portions of the connection electrode 111C and the conductive layer 117C.

As illustrated in FIG. 1D, a structure may be employed where the insulating layer 131 is not provided in the vicinity of the connection portion of the connection electrode 111C and the common electrode 113.

The insulating layer 131 is provided between adjacent light-emitting elements 110. In FIG. 1B, the insulating layer 131 is provided between the pixel electrodes 111 and the EL layers 112 included in the light-emitting elements 110. The common electrode 113 is provided over the insulating layer 131.

The insulating layer 131 includes an insulating layer 131a and an insulating layer 131b. The insulating layer 131b is provided to be in contact with the side surfaces of the pixel electrodes 111 and the side surfaces of the EL layers 112 included in the light-emitting elements 110. Furthermore, the insulating layer 131a is provided over and in contact with the insulating layer 131b so as to fill a depressed portion of the insulating layer 131b in a cross-sectional view.

In the top view of FIG. 1, the insulating layer 131 is placed between the EL layers 112 of adjacent pixels so as to have a mesh (also referred to as grid or matrix) shape.

The insulating layer 131 is provided, for example, between two EL layers 112 exhibiting different colors. Alternatively, the insulating layer 131 is provided, for example, between two EL layers 112 exhibiting the same color. Alternatively, the following structure may be employed: the insulating layer 131 is provided between two EL layers 112 exhibiting different colors and is not provided between two EL layers 112 exhibiting the same color.

The insulating layer 131 is provided, for example, between two EL layers 112 in a top view.

The end portion of the EL layer 112 preferably includes a region in contact with the insulating layer 131b.

When the insulating layer 131 is provided between the light-emitting elements of different colors, the EL layer 112R, the EL layer 112G, and the EL layer 112G can be inhibited from being in contact with each other. This can suitably prevent unintentional light emission due to a current flowing through the two adjacent EL layers. As a result, the contrast can be increased to achieve a display apparatus with high display quality.

The insulating layer 131 may be provided not between adjacent pixels exhibiting the same color but only between pixels exhibiting different colors. In this case, the insulating layer 131 can have a stripe shape in a top view. When the insulating layer 131 has a stripe shape, the space necessary to form the insulating layer 131 becomes unnecessary and a high aperture ratio can be achieved compared with the case where the insulating layer 131 has a grid shape. In the case where the insulating layer 131 has a stripe shape, the adjacent EL layers of the same color may be processed in a band shape so as to be continuous in a column direction.

The common electrode 113 is provided to be in contact with the top surface of the EL layer 112, the top surface of the insulating layer 131a, and the top surface of the insulating layer 131b. Between the adjacent light-emitting elements, a level difference is generated at the end portions of the pixel electrode 111 and the EL layer 112 owing to the region where the pixel electrode 111 and the EL layer 112 are provided and the region where the pixel electrode 111 and the EL layer 112 are not provided. In the display apparatus of one embodiment of the present invention, the insulating layer 131a and the insulating layer 131b eliminate the level difference and improve coverage with the common electrode as compared with the case where the common electrode 113 is provided to be in contact with the insulating layer 255 or the like between adjacent light-emitting elements. Thus, connection failures due to the disconnection at the step can be inhibited. Alternatively, it is possible to inhibit an increase in electric resistance due to local thinning of the common electrode 113 by the step.

In the case where the end portion of the pixel electrode 111 is substantially aligned with the end portion of the EL layer 112, the common electrode 113 and the pixel electrode 111 are sometimes short-circuited at the time of forming the common electrode 113 over the EL layer 112. In one embodiment of the present invention, provision of the insulating layer 131a and the insulating layer 131b between the EL layers 112 that are placed adjacent to each other can make the unevenness on the formation surface of the common electrode 113 smaller, whereby coverage with the common electrode 113 at the end portion of the EL layer 112 can be increased and favorable conductivity of the common electrode 113 can be achieved. In addition, a short circuit between the common electrode 113 and the pixel electrode 111 can be inhibited.

For higher planarity of the formation surface of the common electrode 113, the top surface of the insulating layer 131a and the top surface of the insulating layer 131b are preferably substantially aligned with the top surface of the EL layer 112. In addition, the top surface of the insulating layer 131 preferably has a flat shape. Note that it is not always necessary that the top surface of the insulating layer 131a, the top surface of the insulating layer 131b, and the top surface of the EL layer 112 are aligned with each other.

The insulating layer 131b includes a region in contact with the side surface of the EL layer 112 and functions as a protective insulating layer of the EL layer 112. Provision of the insulating layer 131b can inhibit oxygen, moisture, or constituent elements thereof from entering the inside of the EL layer 112 through the side surface thereof, whereby a highly reliable display apparatus can be provided.

If the width of the insulating layer 131b in the region in contact with the side surface of the EL layer 112 is large in a cross-sectional view, the distance between the EL layers 112 is increased and the aperture ratio is lowered in some cases. If the width of the insulating layer 131b is small, the effect of inhibiting the entry of oxygen, moisture, or constituent elements thereof into the inside of the EL layer 112 through the side surface thereof becomes small in some cases. The width of the insulating layer 131b in the region in contact with the side surface of the EL layer 112 is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width of the insulating layer 131b is within the above-described range, a highly reliable display apparatus with a high aperture ratio can be obtained.

The insulating layer 131b can be an insulating layer containing an inorganic material. As the insulating layer 131b, a single layer or stacked layers of aluminum oxide, magnesium oxide, hafnium oxide, gallium oxide, indium gallium zinc oxide, silicon oxide, silicon oxynitride, silicon nitride, silicon nitride oxide, or the like can be used, for example. In particular, aluminum oxide is preferable because it has high selectivity with respect to the EL layer 112 in etching and has a function of protecting the EL layer 112 in forming the insulating layer 131b which is to be described later. In particular, with the use of an inorganic insulating material such as aluminum oxide, hafnium oxide, or silicon oxide formed by an ALD method for the insulating layer 131b, the insulating layer 131b can be a film with few pinholes and can have an excellent function of protecting the EL layer 112.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 131b, a sputtering method, a chemical vapor deposition (CVD) method, a molecular beam epitaxy (MBE) method, a pulsed laser deposition (PLD) method, an atomic layer deposition (ALD) method, or the like can be used. An ALD method achieving favorable coverage can be suitably used for forming the insulating layer 131b.

The insulating layer 131a provided over the insulating layer 131b has a function of filling the depressed portion of the insulating layer 131b, which is formed between the adjacent light-emitting elements. In other words, the insulating layer 131a has an effect of improving the planarity of the formation surface of the common electrode 113. An insulating layer containing an organic material can be suitably used for the insulating layer 131a. As the insulating layer 131a, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. Moreover, the insulating layer 131a can be formed using a photosensitive resin. As the photosensitive resin, a positive material or a negative material can be used.

When the insulating layer 131a is formed using a photosensitive resin, the insulating layer 131a can be fabricated only by light exposure and development steps; hence, adverse effects of dry etching, wet etching, or the like on the surface of the conductive layer 117 can be reduced.

For example, the difference in level between the top surface of the insulating layer 131a and the top surface of the EL layer 112 is preferably less than or equal to 0.5 times as larger as the thickness of the insulating layer 131a, further preferably less than or equal to 0.3 times as larger as the thickness of the insulating layer 131a. In addition, for example, the insulating layer 131a may be provided so that the top surface of the EL layer 112 is higher than the top surface of the insulating layer 131a. Furthermore, for example, the insulating layer 131a may be provided so that the top surface of the insulating layer 131a is higher than the top surface of the light-emitting layer included in the EL layer 112. It is preferable that the thickness of the insulating layer 131a be, for example, greater than or equal to 0.3 times, greater than or equal to 0.5 times, or greater than or equal to 0.7 times as large as the thickness from the bottom surface of conductive layer 117 over the insulating layer 255 to the top surface of the EL layer 112.

In the case where a conductive film having a property of reflecting visible light is used as the pixel electrode 111, silver, aluminum, titanium, tantalum, molybdenum, platinum, gold, titanium nitride, tantalum nitride, or the like can be used, for example. Alternatively, an alloy can be used for the pixel electrode 111. For example, an alloy containing silver can be used. As the alloy containing silver, an alloy containing silver, palladium, and copper can be used, for example. Alternatively, an alloy containing aluminum can be used, for example. Alternatively, a stack including two or more of these materials may be used.

As the pixel electrode 111, a conductive film having a property of reflecting visible light and a conductive film thereover having a property of transmitting visible light can be used. As a conductive material having a property of transmitting visible light, a conductive oxide such as indium oxide, indium tin oxide, indium zinc oxide, zinc oxide, zinc oxide containing gallium, indium-tin oxide containing silicon, or an indium-zinc oxide containing silicon can be used. Alternatively, an oxide of a conductive material having a property of reflecting visible light may be used, and the oxide may be formed by oxidation of a surface of the conductive material having a property of reflecting visible light. Specifically, titanium oxide may be used, for example. The titanium oxide may be formed by oxidation of a surface of titanium, for example.

Provision of an oxide over the surface of the pixel electrode 111 can inhibit, for example, an oxidation reaction with the pixel electrode 111 in formation of the EL layer 112.

When a stack of a conductive film having a property of reflecting visible light and a conductive film thereover having a property of transmitting visible light is provided as the pixel electrode 111, the conductive film having a property of transmitting visible light can function as an optical adjustment layer.

When the pixel electrode 111 includes an optical adjustment layer, an optical path length can be adjusted. The optical path length of the light-emitting element corresponds to, for example, the sum of the thickness of the optical adjustment layer and the thicknesses of the layers provided below the film including a light-emitting compound in the EL layer 112.

The optical path length is set different among the light-emitting elements using a microcavity structure, whereby light of a specific wavelength can be intensified. This can achieve a display apparatus having a high color purity.

For example, the thickness of the EL layer 112 is set different among the light-emitting elements, whereby a microcavity structure can be achieved. For example, the EL layer 112R of the light-emitting element 110R emitting light whose wavelength is the longest can be made to have the largest thickness, and the EL layer 112B of the light-emitting element 110B emitting light whose wavelength is the shortest can be made to have the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

FIG. 1B and the like do not clearly show the difference in the thickness of the EL layer 112 among the light-emitting elements for simplicity; however, as described above, the thickness is preferably adjusted as appropriate in each light-emitting element to intensity light with a wavelength corresponding to the light-emitting element, for adjustment of the optical path length.

[Fabrication Method Example 1]

An example of a method for fabricating the display apparatus of one embodiment of the present invention will be described below with reference to drawings. Here, description is made using the display apparatus 100 illustrated in FIG. 1A as an example. FIG. 2A to FIG. 5B are schematic cross-sectional views in steps of the method for fabricating the display apparatus illustrated below.

Note that thin films that constitute the display apparatus (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, an example of a thermal CVD method is a metal organic CVD (MOCVD) method.

Alternatively, thin films that constitute the display apparatus (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

Thin films that constitute the display apparatus can be processed by a photolithography method or the like. Besides, a nanoimprinting method, a sandblasting method, a lift-off method, or the like may be used for the processing of the thin films. Alternatively, island-shaped thin films may be directly formed by a film formation method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. In addition, light exposure may be performed by liquid immersion exposure technique. As the light used for light exposure, extreme ultraviolet (EUV) light or X-rays may also be used. Furthermore, instead of the light used for the light exposure, an electron beam can also be used. It is preferable to use EUV light, X-rays, or an electron beam because they can perform extremely minute processing. Note that a photomask is not needed when light exposure is performed by scanning with a beam such as an electron beam.

For etching of thin films, a dry etching method, a wet etching method, a sandblast method, or the like can be used.

[Preparation for Substrate 301]

As the substrate 301, a substrate having at least heat resistance high enough to withstand the following heat treatment can be used. In the case where an insulating substrate is used as the substrate 301, a glass substrate, a quartz substrate, a sapphire substrate, a ceramic substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used.

Next, a semiconductor element or the like is formed over the substrate 301, so that the layer 401 is provided. The layer 401 is a layer where a semiconductor circuit is formed over the semiconductor substrate or the insulating substrate. The layer 401 includes the substrate 301 and the semiconductor circuit formed over the substrate 301. The semiconductor circuit includes a semiconductor element including the conductive layer 241 (the conductive layer 241R, the conductive layer 241G, and the conductive layer 241B in FIG. 2A). Alternatively, the semiconductor circuit includes the conductive layer 241 as a wiring or a plug electrically connected to the semiconductor element. Examples of the semiconductor element include a transistor, a diode, and a capacitor. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

Subsequently, the insulating layer 255 is formed over the layer 401 including the conductive layer 241R, the conductive layer 241G, and the conductive layer 241B.

As the insulating layer 255, an inorganic insulating layer, an organic insulating layer, or a stacked-layer structure of an inorganic insulating layer and an organic layer can be used, for example. An organic insulating layer sometimes functions as a planarization film and thus is preferable.

An insulating film to be an insulating layer such as the insulating layer 255 is formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that contains more oxygen than nitrogen in its composition, and silicon nitride oxide refers to a material that contains more nitrogen than oxygen in its composition. Moreover, in this specification, aluminum oxynitride refers to a material that contains more oxygen than nitrogen in its composition, and aluminum nitride oxide refers to a material that contains more nitrogen than oxygen in its composition.

As the insulating film to be an insulating layer such as the insulating layer 255, an organic insulating film can be used, for example. Examples of a material that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

After the insulating film to be the insulating layer 255 is formed, planarization treatment by a chemical mechanical polishing (CMP) method or the like may be performed.

Planarization of the surface of the insulating layer 255 can sometimes improve the thickness uniformity of the layers included in the light-emitting elements formed over the insulating layer 255. By improvement in thickness uniformity of the layers, a short circuit or the like of the light-emitting elements can be inhibited in some cases. In addition, improvement in thickness uniformity of the layers can increase the reliability of the light-emitting elements in some cases.

Then, the opening portion 129 is provided in the insulating layer 255 so as to expose the top surface of the conductive layer 241.

Next, a conductive film 117f to be the conductive film 117 is provided over the insulating layer 255 and the exposed conductive layer 241. The conductive film 117f is preferably provided along the bottom surface and side surface of the opening portion 129.

[Formation of Insulating Layer 132]

Subsequently, the insulating layer 132 is formed to fill a depressed portion of the conductive film 117f (FIG. 2A).

The insulating layer 132 can be formed in such a manner that, for example, an insulating film to be the insulating layer 132 is formed over the entire surface of the substrate 301, and then etching is performed on the top surface of the insulating film substantially uniformly without using a resist mask. Such uniform etching for planarization is also referred to as etch back.

Alternatively, the insulating layer 132 can be formed in such a manner that, for example, a film to be the insulating layer 132 is formed over the entire surface, and then part of the film to be the insulating layer 132 is removed. Here, when a photosensitive resin is used for the film to be the insulating layer 132, the insulating layer 132 can be formed without etching using an etching mask such as a resist mask or a hard mask. Since a photosensitive resin can be processed only by light exposure and development steps, the insulating layer 132 can be formed without using a dry etching method or the like. Thus, the process can be simplified. Furthermore, an upper portion of the insulating layer 132 may be partly etched to adjust the level of the surface.

Examples of a material that can be used for the insulating film to be the insulating layer 132 include an acrylic resin, a polyimide resin, an epoxy resin, a polyamide resin, a polyimide-amide resin, a siloxane resin, a benzocyclobutene-based resin, a phenol resin, and precursors of these resins. Moreover, the insulating film to be the insulating layer 132 can be formed using a photosensitive resin. As the photosensitive resin, a positive material or a negative material can be used.

A dry etching method or a wet etching method can be used for the etching of the insulating layer 132. The etching of the insulating layer 132 may be performed by ashing using oxygen plasma or the like. Note that the ashing using oxygen plasma has advantages such as high controllability, good in-plane uniformity, and high suitability for treatment using a large-sized substrate and thus can be suitably used for removal of part of the insulating layer 132. Chemical mechanical polishing (CMP) may be used for the etching of the insulating layer 132.

Then, a conductive film 111*f* to be the pixel electrode 111 is provided over the conductive film 117*f*.

In the case where a conductive film having a property of reflecting visible light is used as the pixel electrode 111, a material that has a reflectance as high as possible in the whole wavelength range of visible light (e.g., silver, aluminum, or the like) is preferably used. This can increase color reproducibility as well as light extraction efficiency of the light-emitting elements.

[Formation of EL Film 112Rf]

Next, an EL film 112Rf to be the EL layer 112R later is formed over the conductive film 1/1*f*.

The EL film 112Rf includes at least a film containing a light-emitting compound. Besides, a structure where one or more of films functioning as an electron-injection layer, an electron-transport layer, a charge generation layer, a hole-transport layer, and a hole-injection layer are stacked may be employed. The EL film 112Rf can be formed by, for example, an evaporation method, a sputtering method, an inkjet method, or the like. Note that without limitation to this, the above deposition method can be used as appropriate.

[Formation of Sacrificial Film 144*a* and Sacrificial Film 146*a*]

Next, a sacrificial film 144*a* is formed to cover the EL film 112Rf. The sacrificial film 144*a* is provided to be in contact with the top surface of the connection electrode 111C.

Then, a sacrificial film 146*a* is formed over the sacrificial film 144*a*.

The sacrificial film 144*a* and the sacrificial film 146*a* can be formed by a sputtering method, an ALD method (a thermal ALD method or a PEALD method), or a vacuum evaporation method, for example. A formation method that gives less damage to an EL layer is preferable, and an ALD method or a vacuum evaporation method is more suitable than a sputtering method for the formation of the sacrificial film 144*a* that is formed directly over the EL film 112Rf.

For example, an inorganic film such as a metal film, an alloy film, a metal oxide film, a semiconductor film, or an inorganic insulating film can be suitably used as the sacrificial film 144*a*.

Alternatively, an oxide film can be used as the sacrificial film 144*a*. Typically, an oxide film or an oxynitride film such as silicon oxide, silicon oxynitride, aluminum oxide, aluminum oxynitride, hafnium oxide, or hafnium oxynitride can be used. Alternatively, a nitride film can be used as the sacrificial film 144*a*, for example. Specifically, it is possible to use a nitride such as silicon nitride, aluminum nitride, hafnium nitride, titanium nitride, tantalum nitride, tungsten nitride, gallium nitride, or germanium nitride. A film containing such an inorganic insulating material can be formed by a film formation method such as a sputtering method, a CVD method, or an ALD method; the sacrificial film 144*a*, which is formed directly over the EL film 112Rf, is particularly preferably formed by an ALD method.

For the sacrificial film 144*a*, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, a metal oxide such as an indium gallium zinc oxide (In—Ga—Zn oxide, also referred to as IGZO)

can be used for the sacrificial film 144*a*. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Any of the above-described materials usable for the sacrificial film 144*a* can be used for the sacrificial film 146*a*. For example, from the above materials usable for the sacrificial film 144*a*, one material can be selected for the sacrificial film 144*a* and another material can be selected for the sacrificial film 146*a*. Alternatively, one or more materials can be selected for the sacrificial film 144*a* from the above materials usable for the sacrificial film 144*a*, and one or more materials can be selected for the sacrificial film 146*a* from the materials excluding the material(s) selected for the sacrificial film 144*a*.

As the sacrificial film 144*a*, it is possible to use a film highly resistant to etching treatment performed on various EL films such as the EL film 112Rf, i.e., a film having high etching selectivity. Moreover, as the sacrificial film 144*a*, it is particularly preferable to use a film that can be removed by a wet etching method that is less likely to cause damage to the EL film.

Moreover, a material that can be dissolved in a solvent chemically stable with respect to at least a film positioned in the uppermost portion of the EL film 112Rf may be used for the sacrificial film 144*a*. In particular, a material that is dissolved in water or alcohol can be suitably used for the sacrificial film 144*a*. In formation of the sacrificial film 144*a*, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

As a wet deposition method for forming the sacrificial film 144*a*, spin coating, dipping, spray coating, ink-jetting, dispensing, screen printing, offset printing, a doctor knife method, a slit coater, a roll coater, a curtain coater, a knife coater, or the like can be given.

For the sacrificial film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

As the sacrificial film 146*a*, a film having high etching selectivity with respect to the sacrificial film 144*a* is used.

For example, for the sacrificial film 144*a*, an inorganic insulating material, such as aluminum oxide, hafnium oxide, or silicon oxide, formed by an ALD method is particularly preferably used; and for the sacrificial film 146*a*, a metal oxide containing indium, such as indium gallium zinc oxide (also referred to as an In—Ga—Zn oxide or IGZO), formed by a sputtering method is particularly preferably used.

Alternatively, as the sacrificial film 146a, an organic film that can be used as the EL film 112Rf or the like can be used. For example, the organic film that is used as the EL film 112Rf, an EL film 112Gf, or an EL film 112Bf can be used as the sacrificial film 146a. The use of such an organic film is preferable, in which case the deposition apparatus for the EL film 112Rf or the like can be used in common. Furthermore, a sacrificial layer 147a can be removed at the same time as the etching of the EL film 112Rf; thus, the process can be simplified.

For example, in the case where dry etching using a gas containing fluorine (also referred to as a fluorine-based gas) is used for the etching of the sacrificial film 144a, silicon, silicon nitride, silicon oxide, tungsten, titanium, molybdenum, tantalum, tantalum nitride, an alloy containing molybdenum and niobium, an alloy containing molybdenum and tungsten, or the like can be used for the sacrificial film 146a. Here, for example, a metal oxide film such as IGZO or ITO is given as a film having high etching selectivity (that is, enabling low etching rate) in dry etching using the fluorine-based gas, and such a film can be used as the sacrificial film 144a.

[Formation of Resist Mask 143a]

Figure 2B:
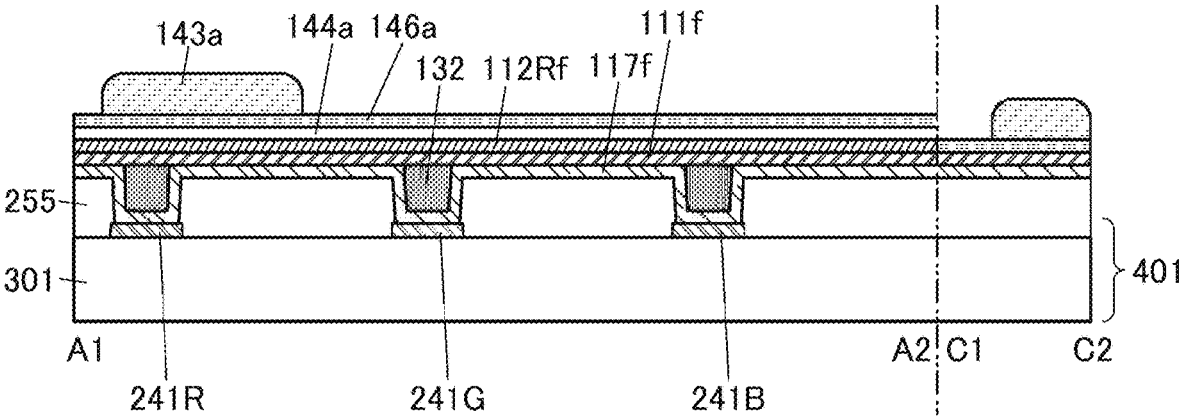

Next, a resist mask 143a is formed over the sacrificial film 146a (FIG. 2B). Note that FIG. 2B illustrates an example where the EL film 112Rf is not formed in the region 130. In the case where the region 130 is shielded in formation of the EL film 112Rf, a metal mask can be used. The metal mask used here does not need to shield a pixel region of the display portion; hence, a fine mask does not need to be used.

For the resist mask 143a, a resist material containing a photosensitive resin such as a positive resist material or a negative resist material can be used.

Here, in the case where the resist mask 143a is formed over the sacrificial film 146a, if a defect such as a pinhole exists in the sacrificial film 146a, the EL film 112Rf might be dissolved in a solvent of the resist material. With the use of an inorganic insulating material such as aluminum oxide, hafnium oxide, or silicon oxide formed by an ALD method for the sacrificial film 144a, a film with few pinholes can be formed and generation of such a defect can be prevented.

[Etching of Sacrificial Film 144a and Sacrificial Film 146a]

Next, parts of the sacrificial film 146a and the sacrificial film 144a that are not covered with the resist mask 143a are removed by etching, so that a sacrificial layer 145a and a sacrificial layer 147a having an island-like shape or a band-like shape are formed. Here, in FIG. 2C, the sacrificial layer 145a and the sacrificial layer 147a are formed over a region of the conductive film 111f to be the pixel electrode 111R and a region of the conductive film 111f to be the connection electrode 111C.

Preferably, part of the sacrificial film 146a is removed by etching using the resist mask 143a to form the sacrificial layer 147a, the resist mask 143a is removed, and then the sacrificial film 144a is etched using the sacrificial layer 147a as a hard mask. The etching of the sacrificial film 146b preferably employs etching conditions with high selectivity with respect to the sacrificial film 144a. Either wet etching or dry etching can be used for the etching for forming the hard mask film; the use of dry etching method is preferable can inhibit a shrinkage of the pattern. For example, in the case where an inorganic insulating material such as aluminum oxide, hafnium oxide, or silicon oxide formed by an ALD method is used for the sacrificial film 144a and a metal oxide containing indium, such as indium gallium zinc oxide (also referred to as an In—Ga—Zn oxide or IGZO), formed by a sputtering method is used for the sacrificial film 146a, the sacrificial film 146a formed by a sputtering method is etched here to form a hard mask.

The removal of the resist mask 143a can be performed by wet etching or dry etching. It is particularly preferable to perform dry etching (also referred to as plasma ashing) using an oxygen gas as an etching gas to remove the resist mask 143a.

When the sacrificial film 144a is etched using the sacrificial layer 147a as a hard mask, the removal of the resist mask 143a can be performed while the EL film 112Rf is covered with the sacrificial film 144a. This is particularly suitable in the case where etching using an oxygen gas, such as plasma ashing, is performed because the electrical characteristics might be adversely affected when the EL film 112Rf is exposed to oxygen.

Figure 2C:
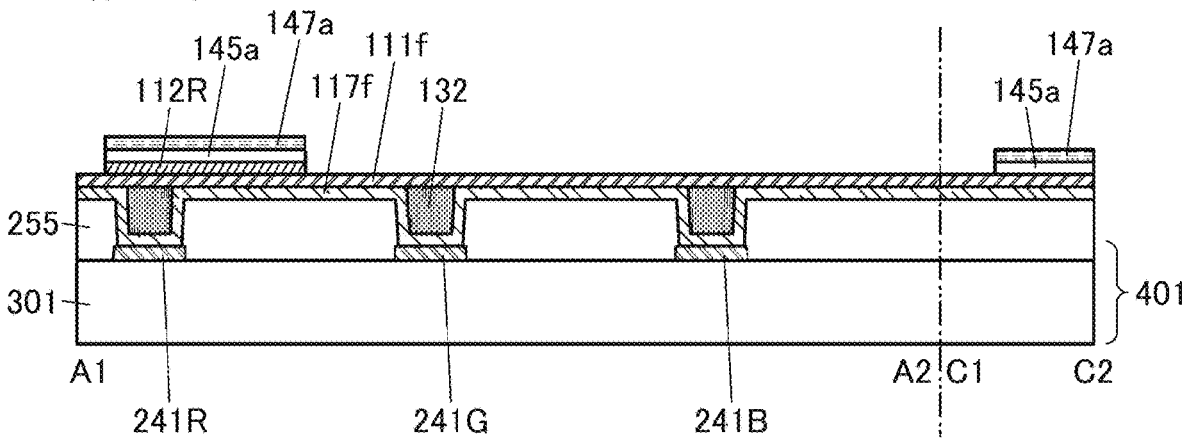

Next, the sacrificial film 144a is removed by etching using the sacrificial layer 147a as a mask, so that the sacrificial layer 145a having an island-like shape or a band-like shape is formed (FIG. 2C). Note that in the fabrication method of the display apparatus of one embodiment of the present invention, a structure may be employed where either the sacrificial layer 145a or the sacrificial layer 147a is not used.

[Etching of EL Film 112Rf]

Next, part of the EL film 112Rf that is not covered with the sacrificial layer 145a is removed by etching, so that the island-shaped or band-shaped EL layer 112R is formed.

For the etching of the EL film 112Rf, it is preferable to use dry etching using an etching gas that does not contain oxygen as its main component. This can inhibit the alteration of the EL film 112Rf to achieve a highly reliable display apparatus. Examples of the etching gas that does not contain oxygen as its main component include $CF_4$, $C_4F_8$, $SF_6$, $CHF_3$, $Cl_2$, $H_2O$, $BCl_3$, and a noble gas such as He. Alternatively, a mixed gas of the above gas and a dilution gas that does not contain oxygen can be used as the etching gas. In the etching of the EL film 112Rf, part of the sacrificial layer 145a may be removed. For example, in the case where the sacrificial film 144a has a two-layer structure where an inorganic insulating material such as aluminum oxide, hafnium oxide, or silicon oxide formed by an ALD method is used for the lower layer and a metal oxide containing indium, such as indium gallium zinc oxide (also referred to as an In—Ga—Zn oxide or IGZO), formed by a sputtering method is used for the upper layer, the upper layer may be etched in etching of the EL film 112Rf.

Note that etching of the EL film 112Rf is not limited to the above and may be performed by dry etching using another gas or wet etching.

When dry etching using an oxygen gas or an etching gas containing an oxygen gas is employed for the etching of the EL film 112Rf, the etching rate can be increased. Consequently, etching under a low-power condition can be performed while the etching rate is kept adequately high; hence, damage due to the etching can be reduced. Furthermore, a defect such as attachment of a reaction product generated in the etching can be inhibited. For example, an etching gas obtained by adding an oxygen gas to the etching gas that does not contain oxygen as its main component can be used.

[Formation of EL Layer 112G and EL Layer 112B]

Next, the EL film 112Gf to be the EL layer 112G is formed over the sacrificial layer 145a. For the EL film 112Gf, the description of the EL film 112Rf can be referred to.

Subsequently, a sacrificial film 144b is formed over the EL film 112Gf. For the sacrificial film 144b, the description of the sacrificial film 144a can be referred to.

Next, a protective film 146*b* is formed over the sacrificial film 144*b*. For the sacrificial film 146*b*, the description of the sacrificial film 146*a* can be referred to.

Figure 3A:
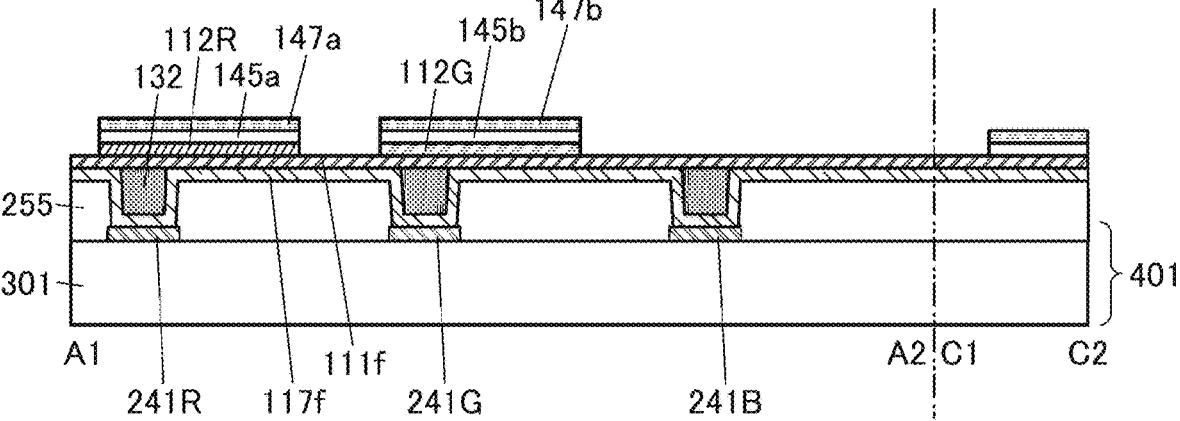
FIG. 3A to FIG. 3C are diagrams illustrating the fabrication method example of the display apparatus.

Next, a resist mask 143*b* is formed over the sacrificial film 146*b* (FIG. 3A).

Figure 3B:
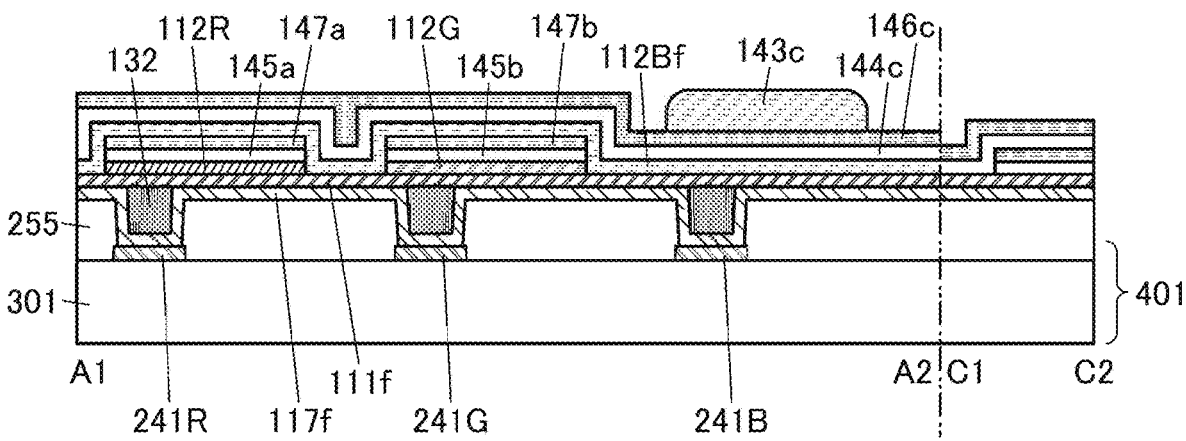

Subsequently, a sacrificial layer 145*b*, a sacrificial layer 147*b*, and the EL layer 112G are formed (FIG. 3B). For the formation of the sacrificial layer 145*b*, the sacrificial layer 147*b*, and the EL layer 112G, the formation of the sacrificial layer 145*a*, the sacrificial layer 147*a*, and the EL layer 112R can be referred to.

Next, the EL film 112Bf to be the EL layer 112B is formed over the sacrificial layer 147*a* and the sacrificial layer 147*b*. For the EL film 112Bf, the description of the EL film 112Rf can be referred to.

Subsequently, a sacrificial film 144*c* is formed over the EL film 112Bf. For the sacrificial film 144*c*, the description of the sacrificial film 144*a* can be referred to.

Next, a sacrificial film 146*c* is formed over the sacrificial film 144*c*. For the sacrificial film 146*c*, the description of the sacrificial film 146*a* can be referred to.

Figure 3C:
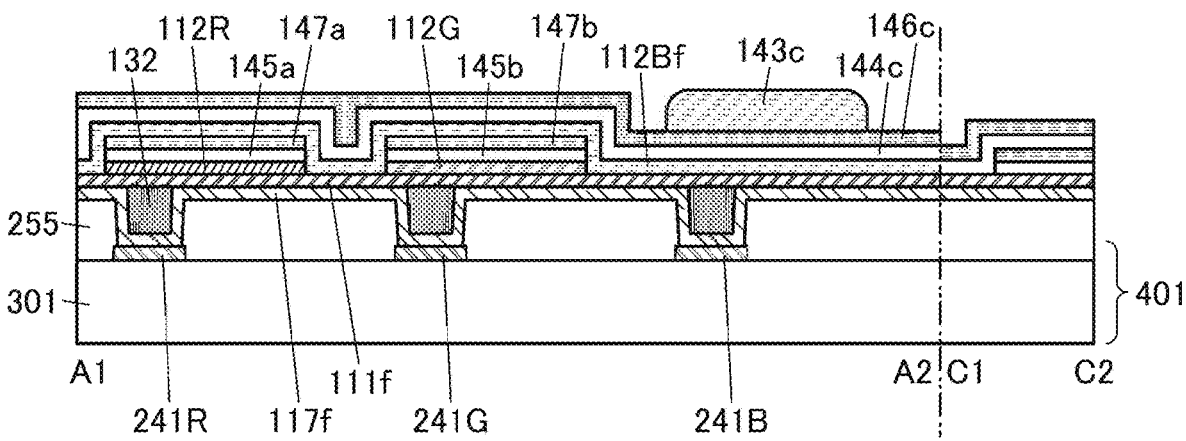

Next, a resist mask 143*c* is formed over the sacrificial film 146*c* (FIG. 3C).

Figure 4A:
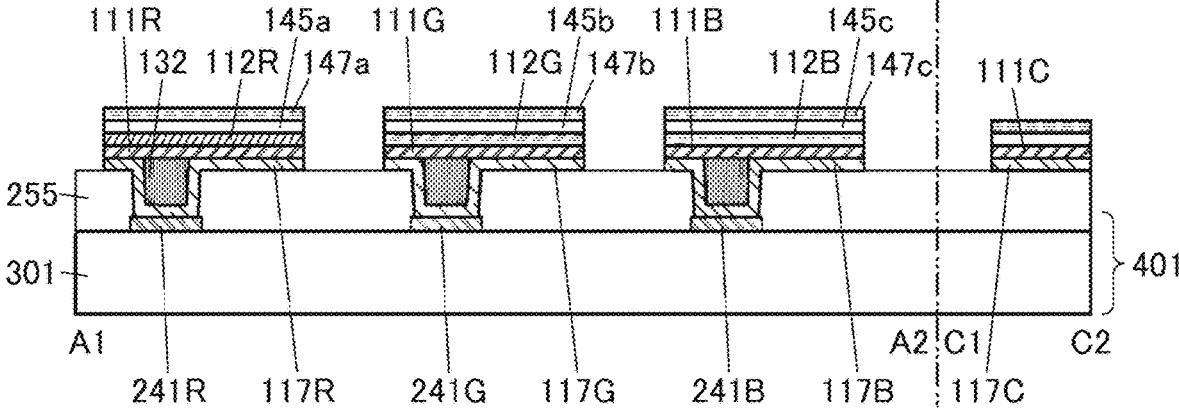
FIG. 4A to FIG. 4C are diagrams illustrating the fabrication method example of the display apparatus.

Subsequently, a sacrificial layer 145*c*, a sacrificial layer 147*c*, and the EL layer 112B are formed (FIG. 4A). For the formation of the sacrificial layer 145*c*, the sacrificial layer 147*c*, and the EL layer 112B, the formation of the sacrificial layer 145*a*, the sacrificial layer 147*a*, and the EL layer 112R can be referred to.

[Formation of Insulating Layer 131]

Figure 4B:
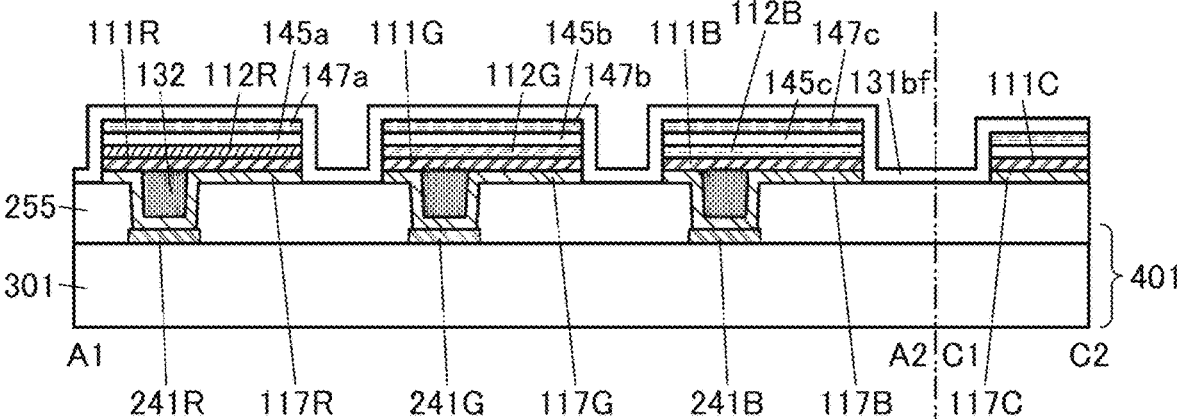

Next, an insulating film 131*bf* to be the insulating layer 131*b* is formed (FIG. 4B). A film containing an inorganic material is preferably used as the insulating film 131*bf*. The insulating film 131*bf* is provided to cover the sacrificial layer 145*a*, the sacrificial layer 145*b*, the sacrificial layer 145*c*, the EL layer 112, and the pixel electrode 111. For example, a single layer or stacked layers of a film containing aluminum oxide, magnesium oxide, hafnium oxide, gallium oxide, indium gallium zinc oxide, silicon oxide, silicon oxynitride, silicon nitride, silicon nitride oxide, or the like can be used.

For the formation of the insulating film 131*bf*, a sputtering method, a chemical vapor deposition (CVD) method, a molecular beam epitaxy (MBE) method, a pulsed laser deposition (PLD) method, an atomic layer deposition (ALD) method, or the like can be used. An ALD method achieving favorable coverage can be suitably used for formation of the insulating film 131*bf*.

As the insulating film 131*bf*, a single layer or stacked layers of aluminum oxide, magnesium oxide, hafnium oxide, gallium oxide, indium gallium zinc oxide, silicon oxide, silicon oxynitride, silicon nitride, silicon nitride oxide, or the like can be used. In particular, aluminum oxide is preferable because it has high selectivity with respect to the EL layer 112 in etching and has a function of protecting the EL layer 112 in forming the insulating layer 131*b* which is to be described later.

The insulating film 131*bf* formed by an ALD method can be a film with few pinholes, and the insulating layer 131*b* can have an excellent function of protecting the EL layer 112.

The formation temperature of the insulating film 131*bf* is preferably lower than the upper temperature limit of the EL layer 112.

Here, aluminum oxide is formed by an ALD method as the insulating film 131*bf*. The formation temperature of the insulating film 131*bf* by an ALD method is preferably higher than or equal to 60° C. and lower than or equal to 150° C., further preferably higher than or equal to 70° C. and lower than or equal to 115° C., still further preferably higher than or equal to 80° C. and lower than or equal to 100° C. By forming the insulating film 131*bf* at such a temperature, a dense insulating film can be obtained and damage to the EL layer 112 can be reduced.

Figure 4C:
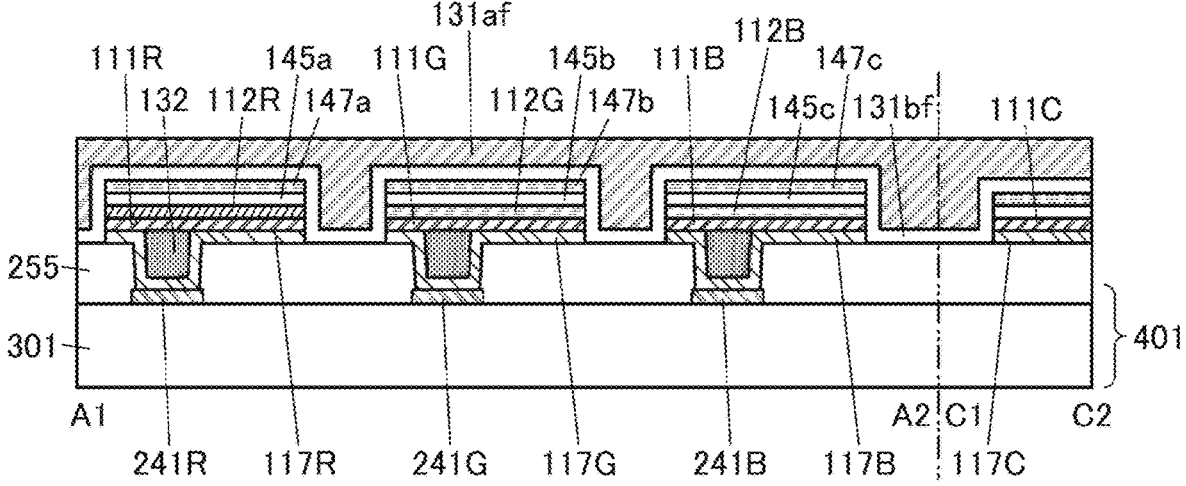

Next, an insulating film 131*af* to be the insulating layer 131*a* is formed (FIG. 4C). The insulating film 131*af* is provided so as to fill the depressed portion of the insulating film 131*bf*. The insulating film 131*af* is preferably a planarization film.

As the insulating film 131*af*, an insulating film containing an organic material is preferably used, and a resin is preferably used as the organic material.

As a material that can be used for the insulating film 131*af*, an acrylic resin, a polyimide resin, an epoxy resin, a polyamide resin, a polyimide-amide resin, a siloxane resin, a benzocyclobutene-based resin, a phenol resin, and precursors of these resins can be given, for example. A photosensitive resin can be used for the insulating film 131*af*. As the photosensitive resin, a positive material or a negative material can be used.

When the insulating film 131*af* is formed using a photosensitive resin, the insulating film 131*af* can be fabricated only by light exposure and development steps, so that damage to the layers included in the light-emitting element 110, especially the EL layers can be reduced. When the insulating layer 132 is formed using a negative photosensitive resin, the insulating layer 132 can sometimes be formed using the same photomask (light-exposure mask) as the photomask used for forming the opening portion 129.

Figure 5A:
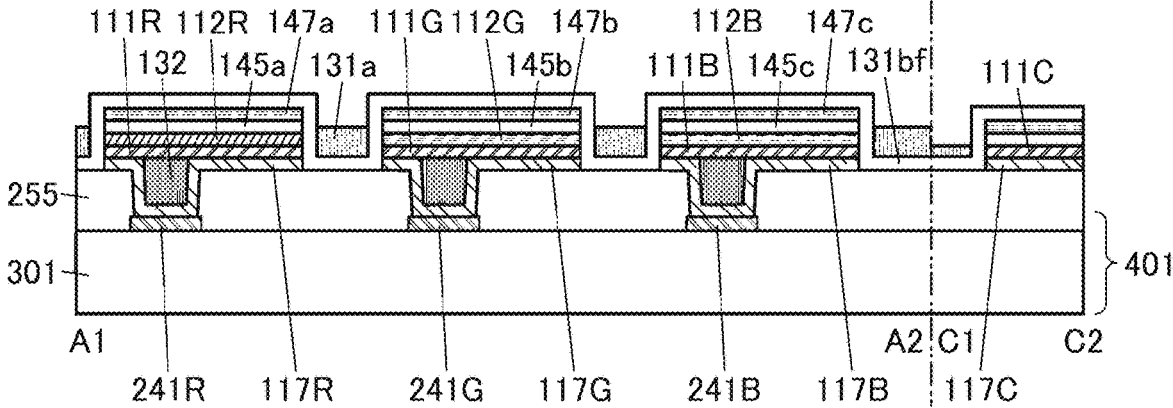
FIG. 5A to FIG. 5C are diagrams illustrating the fabrication method example of the display apparatus.

Next, the insulating layer 131*a* is formed (FIG. 5A). The insulating layer 131*a* can be formed by, for example, performing etching on the top surface of the insulating film 131*af* substantially uniformly. Such uniform etching for planarization is also referred to as etch back.

Alternatively, the insulating layer 131*a* can be formed by removing part of the insulating film 131*af* using a photomask. Here, when a photosensitive resin is used for the insulating film 131*af*, the insulating layer 131*a* can be formed without etching using an etching mask such as a resist mask or a hard mask. Since a photosensitive resin can be processed only by light exposure and development steps, the insulating layer 131*a* can be formed without using a dry etching method or the like. Thus, the process can be simplified. In addition, damage to the EL layer due to etching of the insulating film 131*af* can be reduced. Furthermore, an upper portion of the insulating layer 131*a* may be partly etched to adjust the level of the surface.

Subsequently, the insulating film 131*bf* is etched, so that the top surfaces of the sacrificial layer 145*a*, the sacrificial layer 145*b*, and the sacrificial layer 145*c* are exposed. Thus, the insulating layer 131*b* covering the side surfaces of the EL layer 112R, the EL layer 112G, and the EL layer 112B is formed.

A dry etching method or a wet etching method can be used for the etching of the insulating film 131*bf*. The etching may be performed by ashing using oxygen plasma or the like. Chemical mechanical polishing (CMP) may be used for the etching of the insulating film 131*bf*.

Note that at the time of etching the insulating film 131*bf*, damage to the EL layer 112 due to the etching is preferably reduced. Thus, the insulating film 131*bf* is preferably formed using a material having high etching selectivity with respect to the EL layer 112.

The use of an inorganic material for the insulating film 131*bf* can increase the selectivity with respect to the EL layer 112 in some cases. As the insulating layer 131*b*, a single layer or stacked layers of aluminum oxide, magnesium oxide, hafnium oxide, gallium oxide, indium gallium zinc oxide, silicon oxide, silicon oxynitride, silicon nitride, silicon nitride oxide, or the like can be used, for example. In particular, aluminum oxide is preferable because it has high selectivity with respect to the EL layer 112 in etching and has a function of protecting the EL layer 112 in forming the insulating layer 131*b* which is to be described later. In particular, with the use of an inorganic material such as aluminum oxide, hafnium oxide, or silicon oxide formed by an ALD method for the insulating layer 131*b*, the insulating layer 131*b* can be a film with few pinholes and can have an excellent function of protecting the EL layer 112.

In formation of the insulating film 131*af* and the insulating film 131*bf*, the top surface levels can be adjusted by the etching amounts. Here, the etching amount is preferably adjusted such that the insulating layer 131*b* covers the side surface of the EL layer 112. In particular, the etching amount is preferably adjusted such that the insulating layer 131*b* covers a side surface of the light-emitting layer included in the EL layer 112.

The surface planarity of the insulating film 131*bf* containing an organic material may change due to unevenness of the formation surface and the sparseness and density of the pattern formed on the formation surface. The planarity of the insulating film 131*bf* may change due to the viscosity or the like of a material used for the insulating film 131*bf*. For example, in some cases, the thickness of the insulating film 131*bf* in a region not overlapping with the EL layer 112 becomes smaller than the thickness of the insulating film 131*bf* in a region overlapping with the EL layer 112. In such a case, for example, etch back of the insulating film 131*bf* is performed, whereby the top surface level of the insulating layer 131 becomes lower than top surface levels of the sacrificial layer 147*a*, the sacrificial layer 147*b*, and the sacrificial layer 147*c* or the top surface levels of the sacrificial layer 145*a*, the sacrificial layer 145*b*, and the sacrificial layer 145*c* in some cases.

The insulating film 131*bf* has a shape having a concave (a hollow shape), a shape having a convex (a bulging shape), or the like in a region between the plurality of EL layers 112 in some cases.

[Removal of Sacrificial Layers]

Figure 5B:
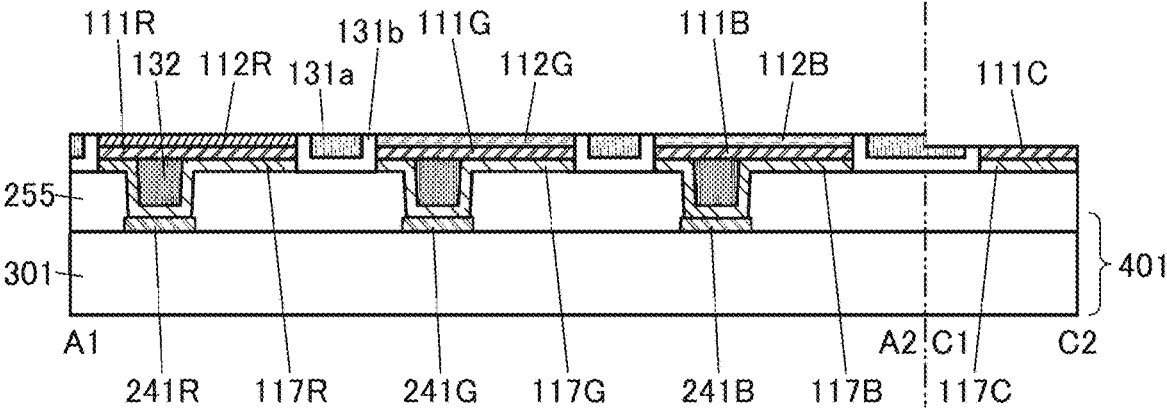

Next, the sacrificial layer 145*a*, the sacrificial layer 147*a*, the sacrificial layer 145*b*, the sacrificial layer 147*b*, the sacrificial layer 145*c*, and the sacrificial layer 147*c* are removed, whereby the top surfaces of the EL layer 112R, the EL layer 112G, and the EL layer 112B are exposed (FIG. 5B).

The sacrificial layer 145*a*, the sacrificial layer 147*a*, the sacrificial layer 145*b*, the sacrificial layer 147*b*, the sacrificial layer 145*c*, and the sacrificial layer 147*c* can be removed by wet etching or dry etching. At this time, a method that causes damage to the EL layer 112R, the EL layer 112G, and the EL layer 112B as little as possible is preferably employed.

In this manner, the EL layer 112R, the EL layer 112G, and the EL layer 112B can be formed separately.

Figure 5C:
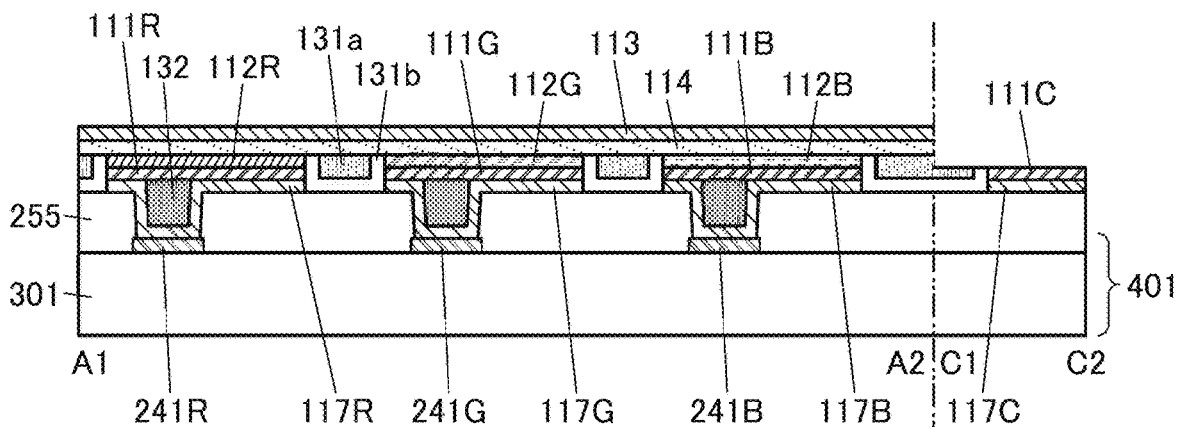

As illustrated in FIG. 5B, etching is performed so that the top surface of the insulating layer 131*a* and the top surface of the insulating layer 131*b* are substantially aligned with the top surface of the EL layer 112. When the top surface of the insulating layer 131*a* and the top surface of the insulating layer 131*b* are substantially aligned with the top surface of the EL layer, unevenness on the surface where the common electrode 113 is provided can be made small at the time of forming the common electrode 113, which is illustrated in FIG. 5C described later, and coverage can be increased.

[Formation of Common Layer 114]

Then, formation of the common layer 114 is performed. In the case of a structure not including the common layer 114, the common electrode 113 is formed to cover the EL layer 112R, the EL layer 112G, and the EL layer 112B.

[Formation of Common Electrode 113]

Next, the common electrode 113 is formed over the common layer 114 (FIG. 5C). The common electrode 113 can be formed by a sputtering method or an evaporation method, for example. Note that FIG. 5C illustrates an example where the common layer 114 is not formed in the region 130. In the case where the region 130 is shielded in formation of the common layer 114, a metal mask can be used. Since the metal used here does not need to shield a pixel region of the display portion, a fine mask does not need to be used. Note that the common electrode 113 may be provided after the common layer 114 is provided over the connection electrode 111C in the region 130. That is, the common layer 114 may be provided between the connection electrode 111C and the common electrode 113 in the region 130.

Through the above steps, the light-emitting element 110R, the light-emitting element 110G, and the light-emitting element 110B can be fabricated.

[Formation of Protective Layer 121]

Next, the protective layer 121 is formed over the common electrode 113. An inorganic insulating film used for the protective layer 121 is preferably formed by a sputtering method, a PECVD method, or an ALD method. In particular, an ALD method is preferable because it provides excellent step coverage and is less likely to cause a defect such as a pinhole. In addition, an organic insulating film is preferably formed by an inkjet method because a uniform film can be formed in a desired area.

Through the above steps, the display apparatus 100 illustrated in FIG. 1A can be fabricated.

Variation Example 1

Variation example 1 of the display apparatus 100 is described with reference to FIG. 6 and FIG. 7.

Figure 6A:
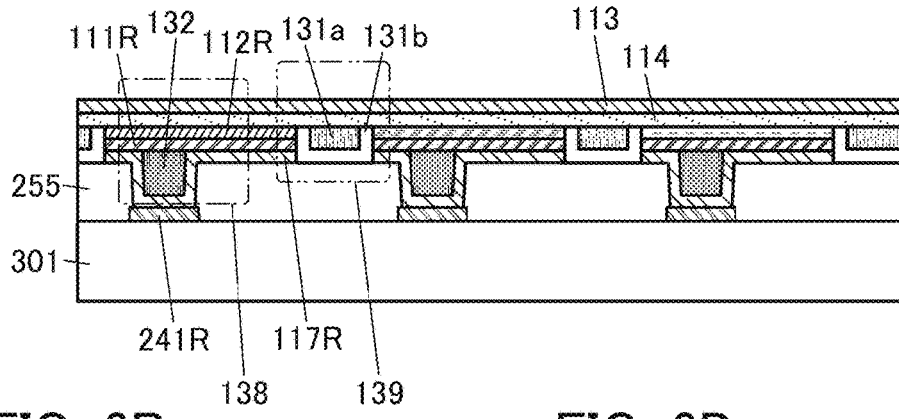
FIG. 6A to FIG. 6E are diagrams illustrating structure examples of a display apparatus.

FIG. 6A is a diagram illustrating an extracted part of the cross-sectional view of the display apparatus 100 illustrated in FIG. 1B.

Figure 6B:
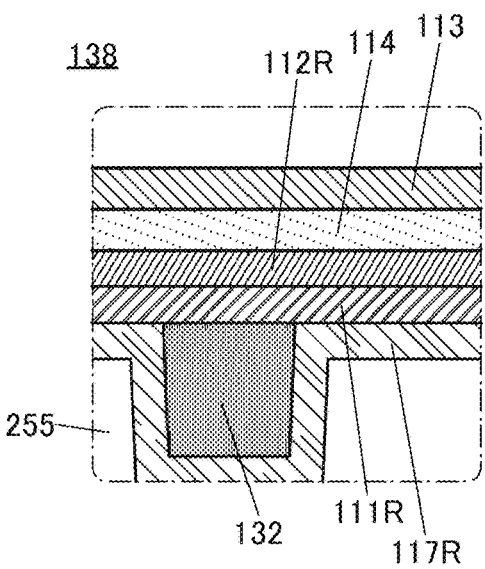
Figure 6C:
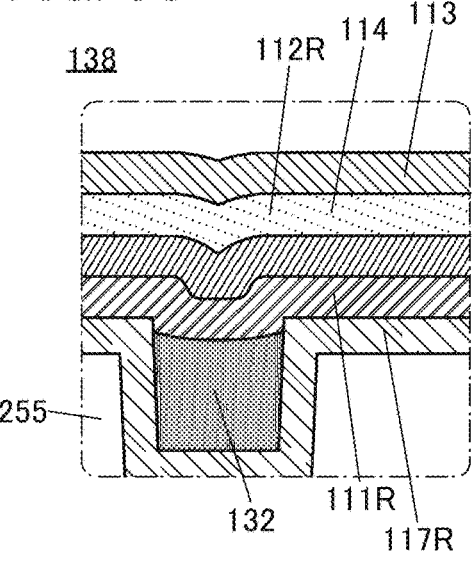
Figure 6D:
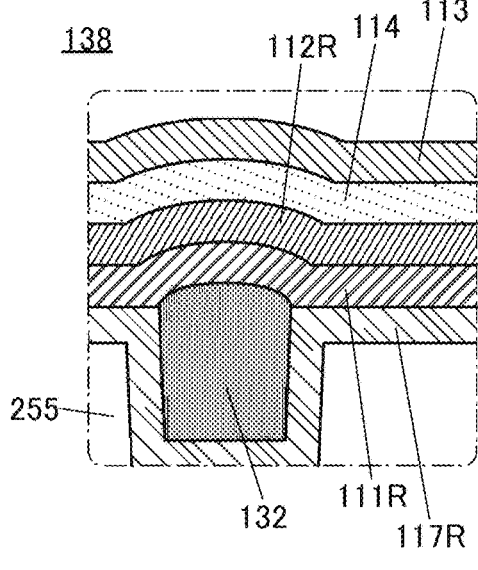
Figure 6E:
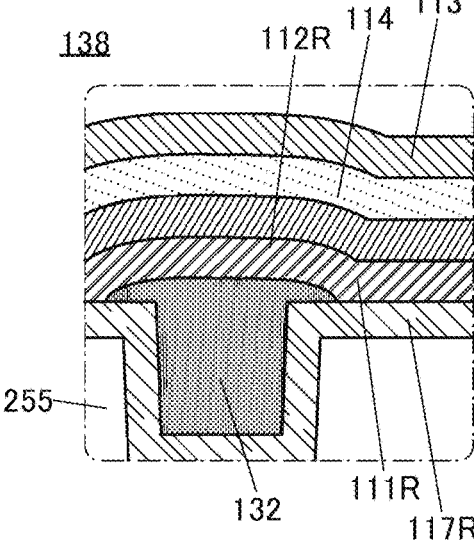

FIG. 6B is an enlarged view of a region 138 surrounded by a dashed-dotted line in FIG. 6A. FIG. 6C to FIG. 6E illustrate variation examples of FIG. 6B.

The pixel electrode 111R is provided over the conductive layer 117R and the insulating layer 132. The pixel electrode 111R preferably includes the first region in contact with the top surface of the conductive layer 117R and the second region in contact with the top surface of the insulating layer 132.

In FIG. 6C, the top surface level of the conductive layer 117R in contact with the first region is higher than the top surface level of the insulating layer 132 in contact with the second region. Moreover, the top surface of the insulating layer 132 has a concave shape that is gently recessed toward the center.

In FIG. 6D, the top surface level of the conductive layer 117R in contact with the first region is lower than the top surface level of the insulating layer 132 in contact with the second region. Moreover, the top surface of the insulating layer 132 has a convex shape that is gently bulged toward the center.

As illustrated in FIG. 6E, the insulating layer 132 includes a region higher than the top surface of the conductive layer 117R. In addition, the insulating layer 132 may be formed to be wider than the width of the depressed portion of the conductive layer 117R. At this time, the insulating layer 132 may be in contact with not only the inner wall of the depressed portion of the conductive layer 117R but also the top surface of the conductive layer 117R.

Figure 7A:
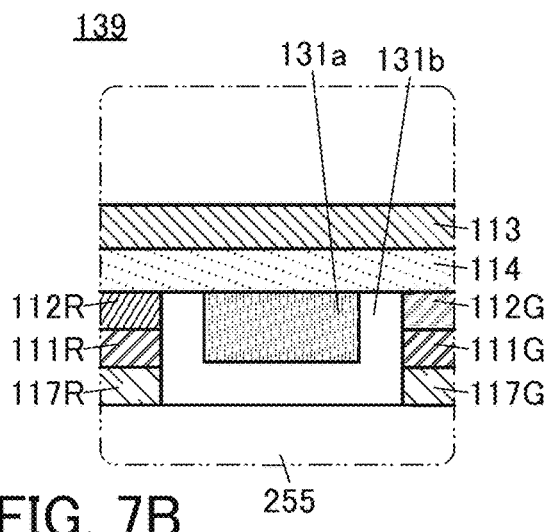
FIG. 7A to FIG. 7F are diagrams illustrating structure examples of a display apparatus.

FIG. 7A is an enlarged view of a region 139 surrounded by a dashed double-dotted line in FIG. 6A. FIG. 7B to FIG. 7F illustrate variation examples of FIG. 7A.

In FIG. 7A, the top surface of the insulating layer 131a is substantially aligned with the top surface of the EL layer 112R. The top surface of the insulating layer 131a is substantially aligned with the top surface of the EL layer 112G. The top surface of the insulating layer 131b is substantially aligned with the top surface of the EL layer 112R. The top surface of the insulating layer 131b is substantially aligned with the top surface of the EL layer 112G.

Figure 7D:
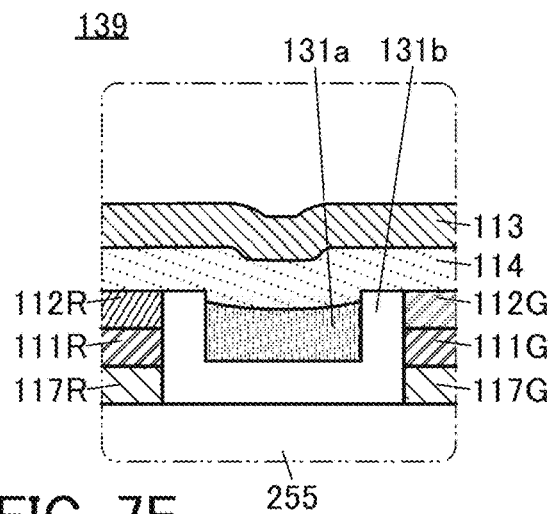
Figure 7B:
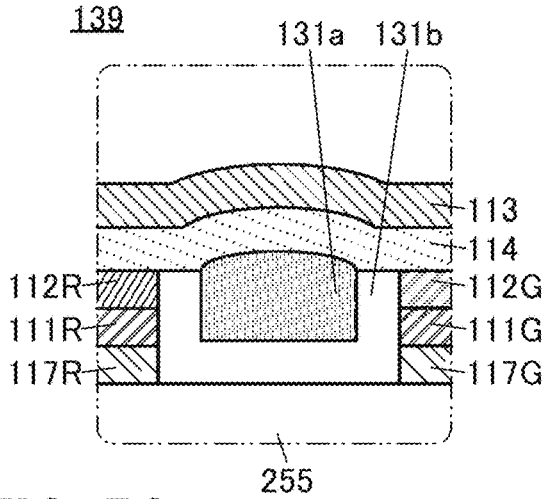

In FIG. 7B, the top surface of the insulating layer 131a includes a region higher than the top surface of the EL layer 112R. In addition, the top surface of the insulating layer 131a includes a region higher than the top surface of the EL layer 112G. Moreover, the top surface of the insulating layer 131a has a convex shape that is gently bulged toward the center.

Figure 7E:
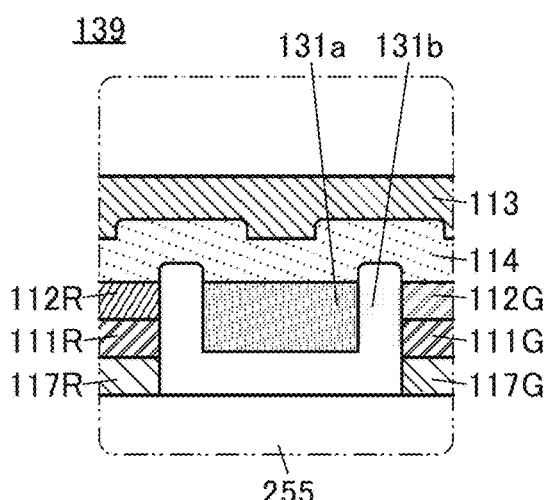
Figure 7C:
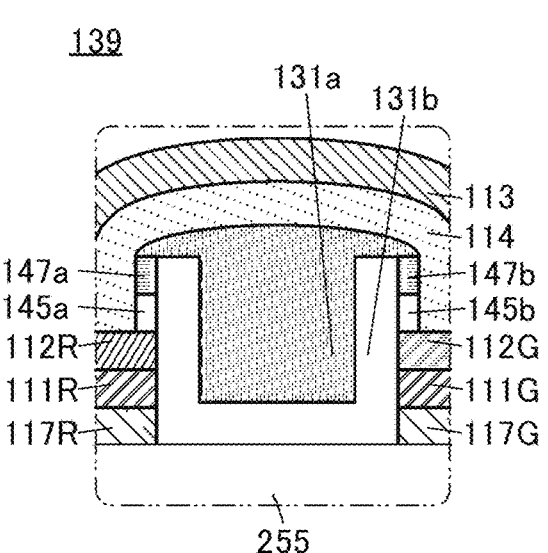

In FIG. 7C, the insulating layer 131a includes a region higher than the top surface of the EL layer 112R and the top surface of the EL layer 112G. In the region 139 of the display apparatus 100, at least one of the sacrificial layer 145a and the sacrificial layer 147a is included, the insulating layer 131a includes a first region that is higher than the top surface of the EL layer 112R and the top surface of the EL layer 112G and positioned outside the insulating layer 131b, and the first region is positioned over at least one of the sacrificial layer 145a and the sacrificial layer 147a. In addition, in the region 139 of the display apparatus 100, at least one of the sacrificial layer 145b and the sacrificial layer 147b is included, the insulating layer 131a includes a second region that is higher than the top surface of the EL layer 112R and the top surface of the EL layer 112G and positioned outside the insulating layer 131b, and the second region is positioned over at least one of the sacrificial layer 145b and the sacrificial layer 147b.

In FIG. 7D, the top surface of the insulating layer 131a is lower than the top surface of the EL layer 112R. In addition, the top surface of the insulating layer 131a includes a region lower than the top surface of the EL layer 112G. Moreover, the top surface of the insulating layer 131a has a concave shape that is gently recessed toward the center.

In FIG. 7E, the top surface of the insulating layer 131b includes a region higher than the top surface of the EL layer 112R. In addition, the top surface of the insulating layer 131b includes a region higher than the top surface of the EL layer 112G. That is, the insulating layer 131b protrudes from the formation surface of the common layer 114 and forms a projected portion.

In formation of the insulating layer 131b, in the case where the insulating layer 131b is formed to be substantially level with the sacrificial layer 145a, the sacrificial layer 145b, and the sacrificial layer 145c, for example, a protruding portion of the insulating layer 131b is sometimes formed as illustrated in FIG. 7E.

Figure 7F:
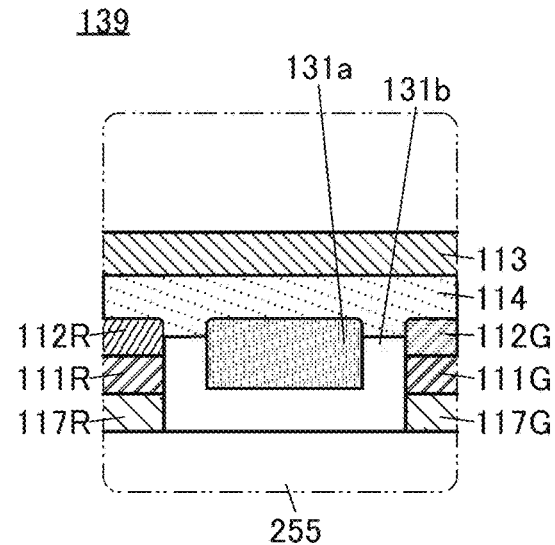

In FIG. 7F, the top surface of the insulating layer 131b is lower than the top surface of the EL layer 112R. In addition, the top surface of the insulating layer 131b is lower than the top surface of the EL layer 112G. That is, the insulating layer 131b forms a depressed portion on the formation surface of the common layer 114.

At least part of the structure examples, the drawings corresponding thereto, and the like described in this embodiment as an example can be combined with the other structure examples, the other drawings, and the like as appropriate.

Embodiment 2

In this embodiment, structure examples of a display apparatus of one embodiment of the present invention are described.

The display apparatus in this embodiment can be a high-definition display apparatus or a large-sized display apparatus. Accordingly, the display apparatus in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Structure Example 2 of Display Apparatus]

Figure 8:
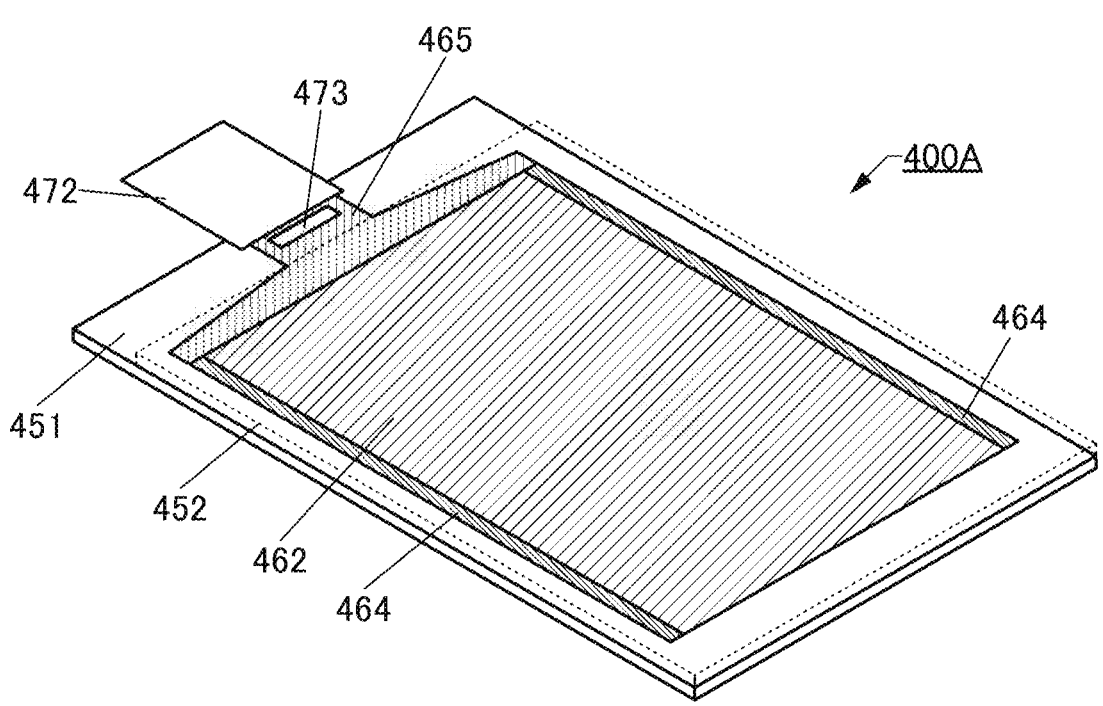
FIG. 8 is a perspective view illustrating an example of a display apparatus.
Figures 9A, 9B, 9C:
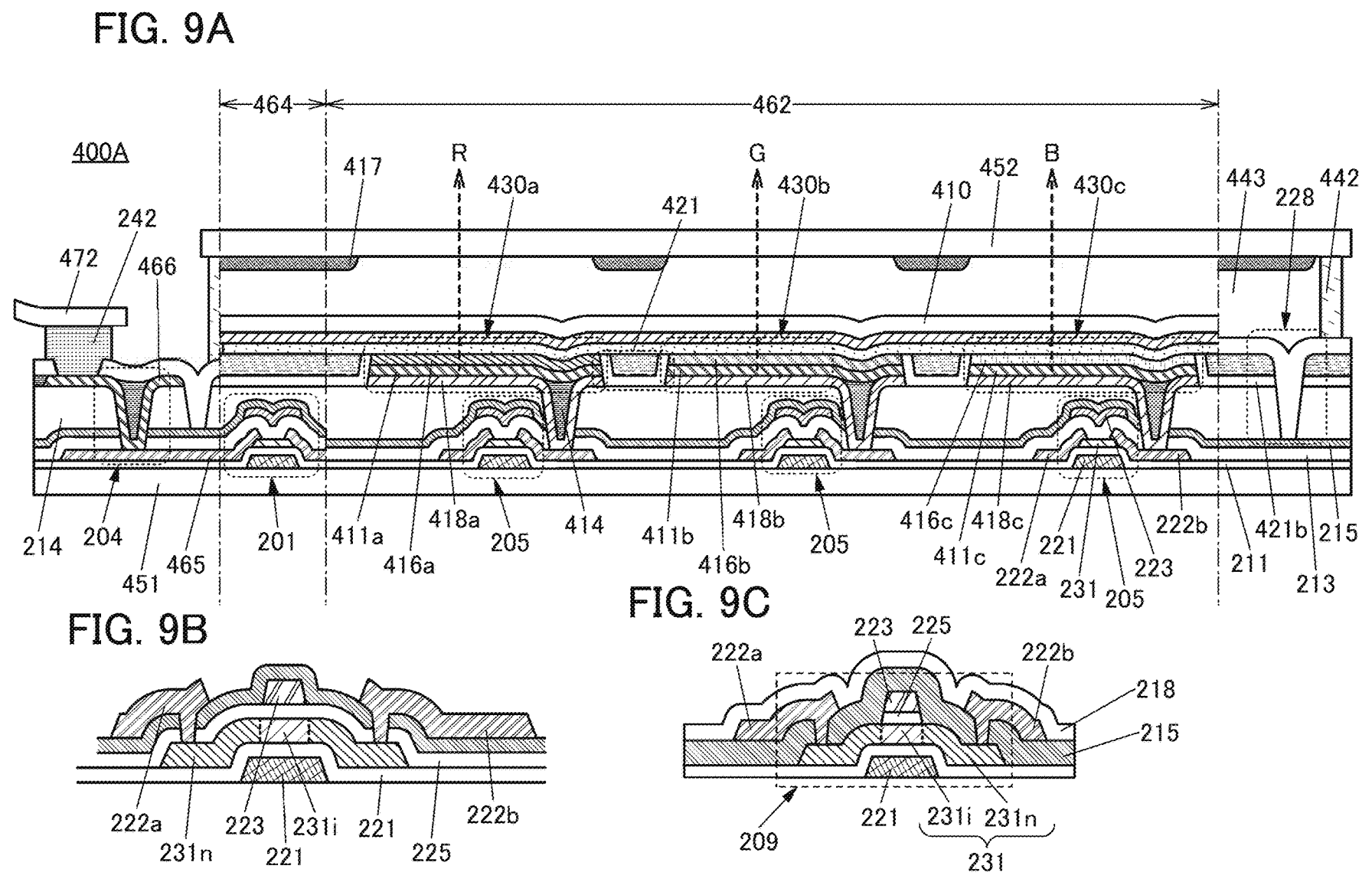

FIG. 8 illustrates a perspective view of a display apparatus 400A, and FIG. 9A illustrates a cross-sectional view of the display apparatus 400A.

The display apparatus 400A has a structure where a substrate 452 and a substrate 451 are bonded to each other. In FIG. 8, the substrate 452 is denoted by a dashed line.

The display apparatus 400A includes a display portion 462, a circuit 464, a wiring 465, and the like. FIG. 8 illustrates an example where an IC 473 and an FPC 472 are mounted on the display apparatus 400A. Thus, the structure illustrated in FIG. 8 can be regarded as a display module including the display apparatus 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or from the IC 473.

FIG. 8 illustrates an example where the IC 473 is provided over the substrate 451 by a COG (Chip On Glass) method, a COF (Chip On Film) method, or the like. An IC including a scan line driver circuit, a signal line driver circuit, or the like can be used as the IC 473, for example. Note that the display apparatus 400A and the display module are not necessarily provided with an IC. The IC may be mounted on the FPC by a COF method or the like.

FIG. 9A illustrates an example of cross sections of part of a region including the FPC 472, part of the circuit 464, part of the display portion 462, and part of a region including an end portion of the display apparatus 400A.

The display apparatus 400A illustrated in FIG. 9A includes a transistor 201, a transistor 205, a light-emitting element 430a that emits red light, a light-emitting element 430b that emits green light, a light-emitting element 430c that emits blue light, and the like between the substrate 451 and the substrate 452.

The light-emitting element described in Embodiment 1 can be used as the light-emitting element 430a, the light-emitting element 430b, and the light-emitting element 430c.

In the case where a pixel of the display apparatus includes three kinds of subpixels including light-emitting elements emitting different colors from each other, as the three subpixels, subpixels of three colors of R, G, and B, subpixels of three colors of yellow (Y), cyan (C), and magenta (M), and the like can be given. In the case where four subpixels are included, as the four subpixels, subpixels of four colors of R, G, B, and white (W), subpixels of four colors of R, G, B, and Y, and the like can be given.

A protective layer 410 and the substrate 452 are bonded to each other with an adhesive layer 442. A solid sealing structure, a hollow sealing structure, or the like can be employed to seal the light-emitting elements. In FIG. 9A, a hollow sealing structure is employed where a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

In an opening portion provided in an insulating layer 214 so as to expose the top surface of a conductive layer 222b included in the transistor 205, parts of a conductive layer 418a, a conductive layer 418b, and a conductive layer 418c are formed along the bottom surface and side surface of the opening portion. The conductive layer 418a, the conductive layer 418b, and the conductive layer 418c are each connected to the conductive layer 222b included in the transistor 205 through the opening provided in the insulating layer 214. The pixel electrodes each contain a material reflecting visible light, and a counter electrode contains a material transmitting visible light. In addition, other parts of the conductive layer 418a, the conductive layer 418b, and the conductive layer 418c are provided over the insulating layer 214.

The conductive layer 117 described in the above embodiment can be used as the conductive layer 418a, the conductive layer 418b, and the conductive layer 418c.

For the insulating layer 214, the insulating layer 255 described in the above embodiment can be referred to.

A conductive layer 411a, a conductive layer 411b, and a conductive layer 411c are provided over the conductive layer 418a, the conductive layer 418b, and the conductive layer 418c, respectively. An EL layer 416a included in the light-emitting element 430a, an EL layer 416b included in the light-emitting element 430b, and an EL layer 416c included in the light-emitting element 430c are provided over the conductive layer 411a, the conductive layer 411b, and the conductive layer 411c, respectively. An insulating layer 414 is provided in each of a depressed portion of the conductive layer 418a, a depressed portion of the conductive layer 418b, and a depressed portion of the conductive layer 418c. For the insulating layer 414, the insulating layer 132 described in the above embodiment can be referred to.

The pixel electrode 111 described in the above embodiment can be used as the conductive layer 411a, the conductive layer 411b, and the conductive layer 411c.

An insulating layer 421 is provided in each of a region that is between the light-emitting element 430a and the light-emitting element 430b and over the insulating layer 214, and a region that is between the light-emitting element 430b and the light-emitting element 430c and over the insulating layer 214. For the insulating layer 421, the insulating layer 131 described in the above embodiment can be referred to.

Light from the light-emitting element is emitted toward the substrate 452 side. For the substrate 452, a material having a high property of transmitting visible light is preferably used.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material through which impurities such as water and hydrogen do not easily diffuse is preferably used for at least one of the insulating layers covering the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display apparatus 400A. This can inhibit entry of impurities from the end portion of the display apparatus 400A through the organic insulating film. Alternatively, the organic insulating film may be formed such that its end portion is positioned on the inner side of the end portion of the display apparatus 400A, to prevent the organic insulating film from being exposed at the end portion of the display apparatus 400A.

An organic insulating film is suitable for the insulating layer 214 functioning as a planarization layer. Examples of a material that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 9A, an opening is formed in a two-layer stacked structure of the insulating layer 214 and the insulating layer 421b over the insulating layer 214. The insulating layer 421b can be formed using the same material as the insulating layer 421. In addition, the insulating layer 421b is formed using the same steps as the insulating layer 421, for example. The protective layer 410 is formed to cover the opening. The use of an inorganic layer as the protective layer 410 can inhibit entry of impurities into the display portion 462 from the outside through the insulating layer 214 even when an organic insulating film is used for the insulating layer 214. Consequently, the reliability of the display apparatus 400A can be increased.

Each of the transistor 201 and the transistor 205 includes a conductive layer 221 functioning as a gate, the insulating layer 211 functioning as a gate insulating layer, a conductive layer 222a functioning as one of a source and a drain, the conductive layer 222b functioning as other of the source and the drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structures of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because degradation of the transistor characteristics can be inhibited.

A semiconductor layer of a transistor preferably includes a metal oxide (also referred to as an oxide semiconductor). That is, a transistor including a metal oxide in its channel formation region (hereinafter, also referred to as an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic proportion of In is preferably greater than or equal to the atomic proportion of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case of describing an atomic ratio of In:Ga:Zn=4:2:3 or a composition in the neighborhood thereof, the case is included where with the atomic ratio of In being 4, the atomic ratio of Ga is greater than or equal to 1 and less than or equal to 3 and the atomic ratio of Zn is greater than or equal to 2 and less than or equal to 4. In the case of describing an atomic ratio of In:Ga:Zn=5:1:6 or a composition in the neighborhood thereof, the case is included where with the atomic ratio of In being 5, the atomic ratio of Ga is greater than 0.1 and less than or equal to 2 and the atomic ratio of Zn is greater than or equal to 5 and less than or equal to 7. In the case of describing an atomic ratio of In:Ga:Zn=1:1:1 or a composition in the neighborhood thereof, the case is included where with the atomic ratio of In being 1, the atomic ratio of Ga is greater than 0.1 and less than or equal to 2 and the atomic ratio of Zn is greater than 0.1 and less than or equal to 2.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 not overlapping with the substrate 452. In the connection portion 204, the wiring 465 is electrically connected to the FPC 472 through a conductive layer 466 and a connection layer 242. For the conductive layer 466, a conductive film obtained by processing the same conductive film as the pixel electrode or a conductive film obtained by processing a stacked-layer film of the same conductive film as the pixel electrode and the same conductive film as the optical adjustment layer can be used. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 410 covering the light-emitting elements inhibits entry of impurities such as water into the light-emitting elements, thereby increasing the reliability of the light-emitting elements.

In the region 228 in the vicinity of the end portion of the display apparatus 400A, the insulating layer 215 and the protective layer 410 are preferably in contact with each other through an opening in the insulating layer 214. In particular, the inorganic insulating film included in the insulating layer 215 and the inorganic insulating film included in the protective layer 410 are preferably in contact with each other. This can inhibit entry of impurities into the display portion 462 from the outside through the organic insulating film. Consequently, the reliability of the display apparatus 400A can be increased.

For each of the substrate 451 and the substrate 452, glass, quartz, ceramics, sapphire, a resin, a metal, an alloy, a semiconductor, or the like can be used. The substrate on the side where light from the light-emitting element is extracted is formed using a material that transmits the light. When the substrate 451 and the substrate 452 are formed using a flexible material, the flexibility of the display apparatus can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

In the case where a film is used for the substrate and the film absorbs water, the shape of the display panel might be changed, e.g., creases are generated. Thus, for the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-liquid-mixture-type resin may be used. An adhesive sheet or the like may be used.

As the connection layer 242, an anisotropic conductive film (ACF), an anisotropic conductive paste (ACP), or the like can be used.

As materials for the gate, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Furthermore, a stacked-layer film of the above materials can be used for a conductive layer. For example, a stacked-layer film of indium tin oxide and an alloy of silver and magnesium is preferably used because conductivity can be increased. They can also be used for conductive layers such as a variety of wirings and electrodes included in the display apparatus, and conductive layers (e.g., conductive layers functioning as the pixel electrode and the common electrode) included in the light-emitting element.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

The transistor 205 and the transistor 201 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the low-resistance regions 231n through openings provided in the insulating layer 215 and the insulating layer 225. One of the conductive layer 222a and the conductive layer 222b functions as a source, and the other functions as a drain.

FIG. 9B illustrates an example where the insulating layer 225 covers the top surface and the side surface of the semiconductor layer. The conductive layer 222a and the conductive layer 222b are connected to the low-resistance regions 231*n* through openings provided in the insulating layer 225 and the insulating layer 215.

Meanwhile, in a transistor 209 illustrated in FIG. 9C, the insulating layer 225 overlaps with the channel formation region 231*i* of the semiconductor layer 231 and does not overlap with the low-resistance regions 231*n*. The structure illustrated in FIG. 9C can be fabricated by processing the insulating layer 225 using the conductive layer 223 as a mask, for example. In FIG. 9C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided. The structure of the transistor 209 illustrated in FIG. 9C can be used for the transistor 205 and the transistor 201.

Transistors containing silicon in their semiconductor layers where channels are formed may be used as all transistors included in the pixel circuit for driving the light-emitting element. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display apparatus can be simplified, whereby parts costs and mounting costs can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display apparatus can be reduced with the use of an OS transistor.

When an LTPS transistor is used as one or more of the transistors included in the pixel circuit and an OS transistor is used as the rest, a display apparatus with low power consumption and high driving capability can be achieved. Note that a structure where an LTPS transistor and an OS transistor are used in combination is referred to as LTPO in some cases. Note that as a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel circuit functions as a transistor for controlling current flowing through the light-emitting element and can be referred to as a driving transistor. One of a source and a drain of the driving transistor is electrically connected to the pixel electrode of the light-emitting element. An LTPS transistor is preferably used as the driving transistor. In this case, the amount of current flowing through the light-emitting element can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, a high resolution, high display quality, and low power consumption.

More specific structure examples are described below with reference to drawings.

[Structure Example 3 of Display Apparatus]

Figure 10A:
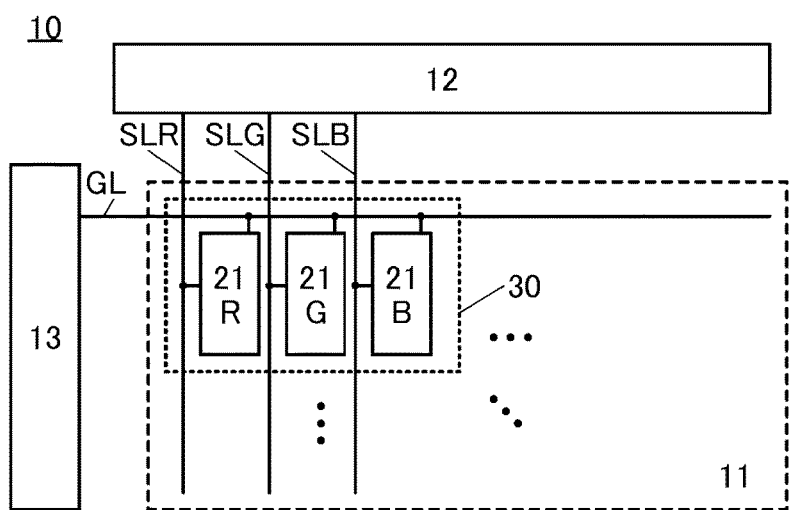
FIG. 10A is a diagram illustrating a structure example of a display apparatus.

FIG. 10A illustrates a block diagram of a display apparatus 10. The display apparatus 10 includes a display portion 11, a driver circuit portion 12, a driver circuit portion 13, and the like.

The display portion 11 includes a plurality of pixels 30 arranged in a matrix. The pixels 30 each include a subpixel 21R, a subpixel 21G, and a subpixel 21B. The subpixel 21R, the subpixel 21G, and the subpixel 21B each include a light-emitting element functioning as a display element.

The pixel 30 is electrically connected to a wiring GL, a wiring SLR, a wiring SLG, and a wiring SLB. The wiring SLR, the wiring SLG, and the wiring SLB are electrically connected to the driver circuit portion 12. The wiring GL is electrically connected to the driver circuit portion 13. The driver circuit portion 12 functions as a source line driver circuit (also referred to as a source driver), and the driver circuit portion 13 functions as a gate line driver circuit (also referred to as a gate driver). The wiring GL functions as a gate line, and the wiring SLR, the wiring SLG, and the wiring SLB each function as a source line.

The subpixel 21R includes a light-emitting element emitting red light. The subpixel 21G includes a light-emitting element emitting green light. The subpixel 21B includes a light-emitting element emitting blue light. Thus, the display apparatus 10 can perform full-color display. Note that the pixel 30 may include a subpixel including a light-emitting element emitting light of another color. For example, the pixel 30 may include, in addition to the three subpixels, a subpixel including a light-emitting element emitting white light, a subpixel including a light-emitting element emitting yellow light, or the like.

The wiring GL is electrically connected to the subpixel 21R, the subpixel 21G, and the subpixel 21B arranged in a row direction (an extending direction of the wiring GL). The wiring SLR, the wiring SLG, and the wiring SLB are electrically connected to the subpixels 21R, the subpixels 21G, and the subpixels 21B arranged in a column direction (an extending direction of the wiring SLR and the like), respectively.

[Structure Example of Pixel Circuit]

Figure 10B:
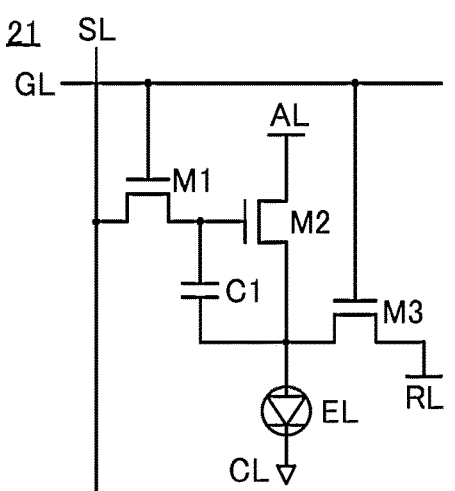
FIG. 10B to FIG. 10D are diagrams illustrating structure examples of a pixel circuit.

FIG. 10B illustrates an example of a circuit diagram of a pixel 21 that can be used as the subpixel 21R, the subpixel 21G, and the subpixel 21B. The pixel 21 includes a transistor M1, a transistor M2, a transistor M3, a capacitor C1, and a light-emitting element EL. The wiring GL and a wiring SL are electrically connected to the pixel 21. The wiring SL corresponds to any of the wiring SLR, the wiring SLG, and the wiring SLB illustrated in FIG. 10A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting element EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting element EL is electrically connected to a wiring CL.

The transistor M1 and the transistor M3 each function as a switch. For example, the transistor M2 functions as a transistor for controlling current flowing through the light-emitting element EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 12 and a plurality of transistors included in the driver circuit portion 13, and OS transistors can be used as the other transistors. For example, OS transistors can be used as the transistors provided in the display portion 11, and LTPS transistors can be used as the transistors provided in the driver circuit portion 12 and the driver circuit portion 13.

As the OS transistor, a transistor including an oxide semiconductor in its semiconductor layer where a channel is formed can be used. The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium (In), gallium (Ga), and zinc (Zn) (also referred to as IGZO) for the semiconductor layer of the OS transistor. Alternatively, it is preferable to use an oxide containing indium (In), tin (Sn), and zinc (Zn). Further alternatively, it is preferable to use an oxide containing indium (In), gallium (Ga), tin (Sn), and zinc (Zn).

A transistor using an oxide semiconductor having a wider band gap and a lower carrier density than silicon can achieve an extremely low off-state current. Thus, such a low off-state current enables long-term retention of electric charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 21.

A data potential D is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 21, the anode potential is a potential higher than the cathode potential. The reset potential supplied to the wiring RL can be set such that a potential difference between the reset potential and the cathode potential is lower than the threshold voltage of the light-emitting element EL. The reset potential can be a potential higher than the cathode potential, a potential equal to the cathode potential, or a potential lower than the cathode potential.

Note that although the transistor is illustrated as an n-channel transistor in FIG. 10B, a p-channel transistor can also be used.

The transistors included in the pixel 21 are preferably formed to be arranged over the same substrate.

Note that transistors each including a pair of gates overlapping with each other with a semiconductor layer therebetween can be used as the transistors included in the pixel 21.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 10C:
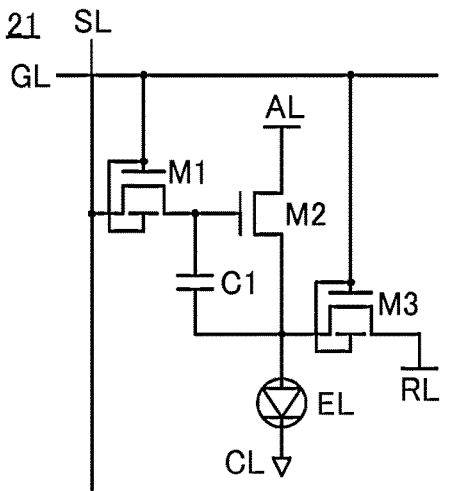

The pixel 21 illustrated in FIG. 10C is an example where a transistor including a pair of gates is used as each of the transistor M1 and the transistor M3. In each of the transistor M1 and the transistor M3, the pair of gates are electrically connected each other. Such a structure can shorten the period in which data is written to the pixel 21.

Figure 10D:
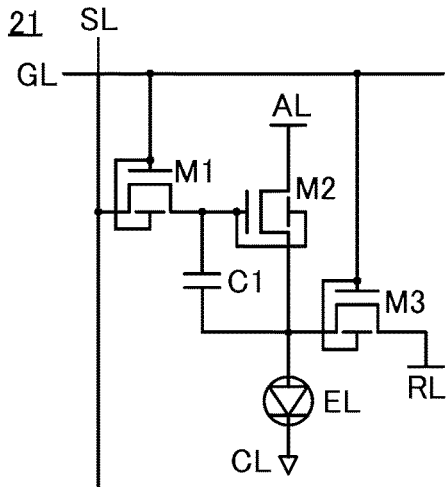

The pixel 21 illustrated in FIG. 10D is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting element EL can be controlled easily and the display quality can be increased.

[Cross-Sectional Structure Example of Display Apparatus]

Structure examples of a transistor and a light-emitting element that can be used in the above display apparatus will be described below.

Structure Example 1

Figure 11A:
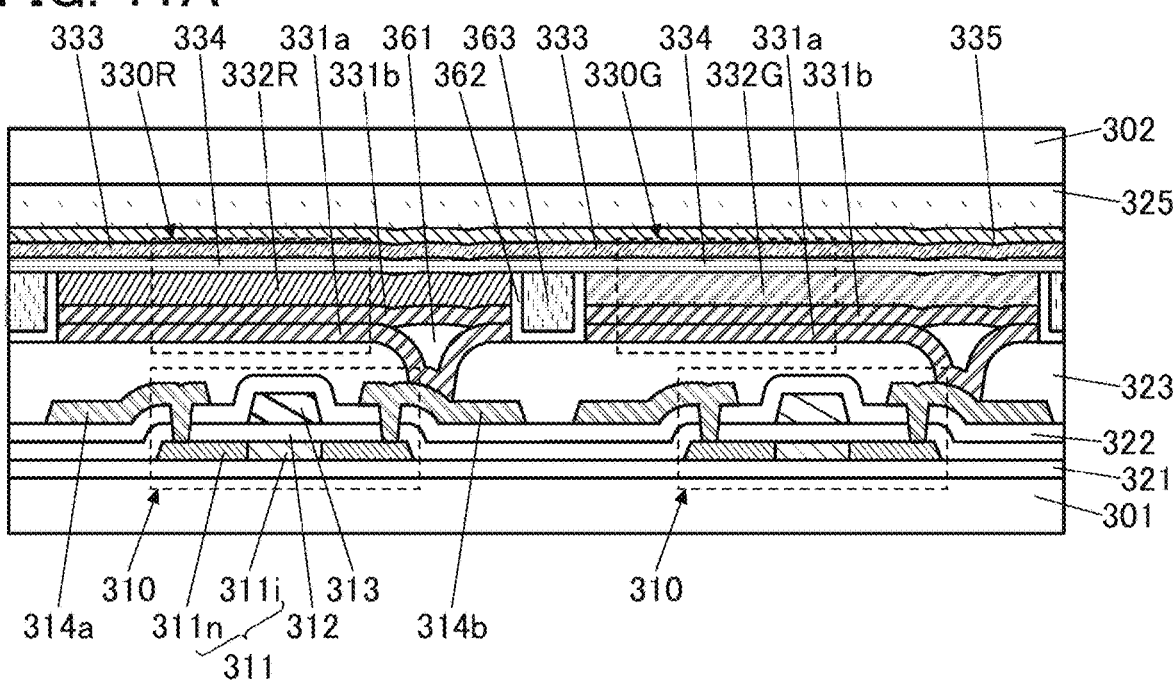
FIG. 11A and FIG. 11B are diagrams illustrating structure examples of a display apparatus.

FIG. 11A is a cross-sectional view including a light-emitting element 330R and a light-emitting element 330G (hereinafter, collectively referred to as a light-emitting element 330), and a transistor 310.

The transistor 310 is a transistor containing polycrystalline silicon in its semiconductor layer. In the structure illustrated in FIG. 11A, the transistor 310 corresponds to the transistor M2 in the pixel 21, and the light-emitting element 330R and the light-emitting element 330G correspond to the light-emitting element EL, for example. In other words, FIG. 11A illustrates an example where one of a source and a drain of the transistor 310 is electrically connected to a pixel electrode of the light-emitting element 330.

In FIG. 11A, the light-emitting element 330R, the light-emitting element 330G, and the transistor 310 are provided between the substrate 301 and a substrate 302.

The transistor 310 includes a semiconductor layer 311, an insulating layer 312, a conductive layer 313, and the like. The semiconductor layer 311 includes a channel formation region 311*i* and low-resistance regions 311*n*. The semiconductor layer 311 contains silicon. The semiconductor layer 311 preferably contains polycrystalline silicon. Part of the insulating layer 312 functions as a gate insulating layer. Part of the conductive layer 313 functions as a gate electrode.

Note that the semiconductor layer 311 can include a metal oxide exhibiting semiconductor characteristics (also referred to as an oxide semiconductor). In this case, the transistor 310 can be referred to as an OS transistor.

The low-resistance region 311*n* is a region containing an impurity element. For example, in the case where the transistor 310 is an n-channel transistor, phosphorus, arsenic, or the like is added to the low-resistance region 311*n*. Meanwhile, in the case where the transistor 310 is a p-channel transistor, boron, aluminum, or the like is added to the low-resistance region 311*n*. In addition, in order to control the threshold voltage of the transistor 310, the above-described impurity may be added to the channel formation region 311*i*.

An insulating layer 321 is provided over the substrate 301. The semiconductor layer 311 is provided over the insulating layer 321. The insulating layer 312 is provided to cover the semiconductor layer 311 and the insulating layer 321. The conductive layer 313 is provided at a position that is over the insulating layer 312 and overlaps with the semiconductor layer 311.

An insulating layer 322 is provided to cover the conductive layer 313 and the insulating layer 312. A conductive layer 314*a* and a conductive layer 314*b* are provided over the insulating layer 322. The conductive layer 314*a* and the conductive layer 314*b* are electrically connected to the low-resistance regions 311*n* in opening portions provided in the insulating layer 322 and the insulating layer 312. Part of the conductive layer 314*a* functions as one of a source electrode and a drain electrode and part of the conductive layer 314*b* functions as the other of the source electrode and the drain electrode. An insulating layer 323 is provided to cover the conductive layer 314*a*, the conductive layer 314*b*, and the insulating layer 322.

The light-emitting element 330R includes a conductive layer 331*a*, a conductive layer 331*b*, an EL layer 332R, a common layer 334, and a conductive layer 333 from the substrate 301 side. The conductive layer 331*a* and the conductive layer 331*b* function as the pixel electrode. The conductive layer 331*a* functions as a connection electrode that electrically connects the conductive layer 314*b* and the conductive layer 331*b*. The conductive layer 333 functions as a common electrode. The light-emitting element 330G is similar to the light-emitting element 330R except that an EL layer 332G is included instead of the EL layer 332R.

The conductive layer 331*a* is provided over the insulating layer 323, and the conductive layer 331*a* is electrically connected to the conductive layer 314*b* through an opening provided in the insulating layer 323. In addition, an insulating layer 361 is provided to fill a depressed portion (hollow) of the conductive layer 331*a* which is positioned at the connection portion for the conductive layer 314*b*. The insulating layer 361 preferably contains an organic resin material. The conductive layer 331*b* is provided to cover the conductive layer 331*a* and the insulating layer 361. The conductive layer 331*b* is provided to be in contact with the top surface of the conductive layer 331*a*, and the conductive layers are electrically connected to each other. The conductive layer 331*b* functions as a reflective electrode, and thus preferably has a top surface with a high reflectance with respect to visible light.

The EL layer 332R or the EL layer 332G is provided over the conductive layer 331*b*.

Here, an insulating layer 362 and an insulating layer 363 are provided between the EL layer 332R and the EL layer 332G.

The insulating layer 362 is provided to be in contact with the side surfaces of the EL layer 332R, the conductive layer 331*b*, and the conductive layer 331*a* included in light-emitting element 330R, the side surfaces of the EL layer 332G, the conductive layer 331*b*, and the conductive layer 331*a* included in the light-emitting element 330G, and the top surface of the insulating layer 323.

The insulating layer 362 has a U-shaped cross-section. The insulating layer 363 is provided to fill the depressed portion (hollow) of the insulating layer 362. Like the insulating layer 361, the insulating layer 363 preferably contains an organic resin material.

The insulating layer 361 and the insulating layer 363 may each be formed using a nonphotosensitive organic resin or a photosensitive organic resin. Examples of a material that can be used for the insulating layer 361 and the insulating layer 363 include an acrylic resin, a polyimide resin, an epoxy resin, a polyamide resin, a polyimide-amide resin, a siloxane resin, a benzocyclobutene-based resin, a phenol resin, and precursors of these resins.

Furthermore, the common layer 334 is provided to cover the EL layer 332R, the EL layer 332G, the insulating layer 362, and the insulating layer 363, and the conductive layer 333 is provided to cover the common layer 334. An insulating layer 335 is provided to cover the conductive layer 333.

The insulating layer 335 functions as a barrier film inhibiting diffusion of impurities such as water into the light-emitting element 330R and the light-emitting element 330G. The insulating layer 335 preferably includes at least an inorganic insulating film.

An adhesive layer 325 is provided over the insulating layer 335, and the substrate 301 and the substrate 302 are bonded to each other with the adhesive layer 325.

Here, the EL layer 332R and the EL layer 332G are each formed without using a metal mask. Thus, the EL layer 332R and the EL layer 332G each have a substantially uniform thickness from the center to the end portion. Furthermore, the EL layer 332R and the EL layer 332G are processed such that their side surfaces face each other over the insulating layer 323. Meanwhile, in the case of using a metal mask, for example, the EL layer 332R and the EL layer 332R tend to be thinner toward their end portions and have unclear outlines; thus, clear side surfaces are not formed in many cases.

A distance between the side surface of the EL layer 332R and the side surface of the EL layer 332G can be decreased to, for example, less than 10 μm, less than or equal to 8 μm, less than or equal to 5 μm, less than or equal to 3 μm, less than or equal to 2 μm, or less than or equal to 1 μm.

The EL layer 332R can include at least a light-emitting layer exhibiting a first color. The EL layer 332G can include at least a light-emitting layer exhibiting a second color that is different from the first color.

The EL layer 332R and the EL layer 332G can each have a structure where at least two or more light-emitting layers are stacked. In this case, a charge generation layer may be provided between the stacked light-emitting layers. In this case, the charge generation layer included in the EL layer 332R and the charge generation layer included in the EL layer 332G preferably include the same compound.

In addition, in that case, the two light-emitting layers included in the EL layer 332R or the EL layer 332G can contain light-emitting materials exhibiting different colors. At this time, light-emitting layers containing the same light-emitting material are preferably used for the EL layer 332R and the EL layer 332G. For example, with the use of a plurality of light-emitting layers emitting light of complementary colors, a light-emitting element emitting while light can be obtained. For example, by stacking a light-emitting layer emitting red light, a light-emitting layer emitting blue light, and a light-emitting layer emitting green light, while light emission can be obtained.

Alternatively, the two light-emitting layers included in the EL layer 332R or the EL layer 332G can contain light-emitting materials exhibiting the same color. In particular, the two light-emitting layers preferably contain the same light-emitting material. For example, the EL layer 332R can have a structure where light-emitting layers emitting red light are stacked, and the EL layer 332G can have a structure where light-emitting layers emitting green light are stacked.

Structure Example 2

Figure 11B:
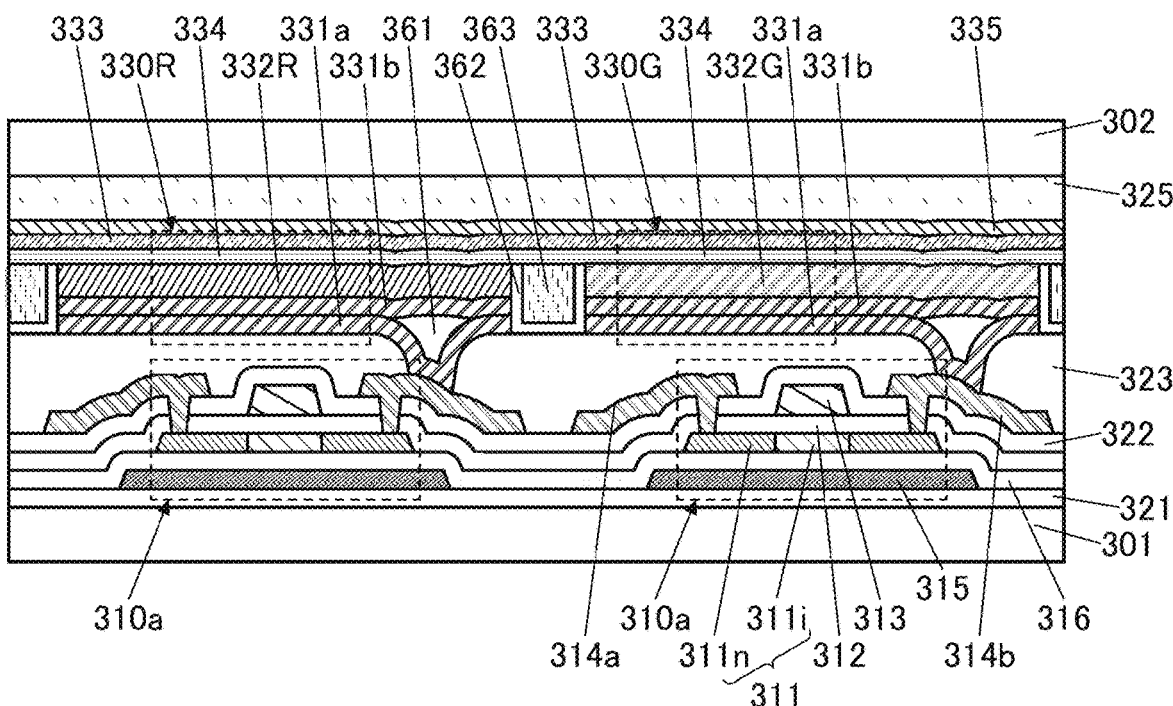

FIG. 11B illustrates a transistor 310a including a pair of gate electrodes. The transistor 310a illustrated in FIG. 11B is different from the transistor 310 illustrated in FIG. 11A mainly in including a conductive layer 315 and an insulating layer 316.

The conductive layer 315 is provided over the insulating layer 321. The insulating layer 316 is provided to cover the conductive layer 315 and the insulating layer 321. The semiconductor layer 311 is provided such that at least the channel formation region 311i overlaps with the conductive layer 315 with the insulating layer 316 therebetween.

In the transistor 310a illustrated in FIG. 11B, part of the conductive layer 313 functions as a first gate electrode, and part of the conductive layer 315 functions as a second gate electrode. At this time, part of the insulating layer 312 functions as a first gate insulating layer, and part of the insulating layer 316 functions as a second gate insulating layer.

Here, to electrically connect the first gate electrode to the second gate electrode, the conductive layer 313 is electrically connected to the conductive layer 315 through an opening portion provided in the insulating layer 312 and the insulating layer 316 in a region not illustrated. To electrically connect the second gate electrode to a source or a drain, the conductive layer 315 is electrically connected to the conductive layer 314a or the conductive layer 314b through an opening portion provided in the insulating layer 322, the insulating layer 312, and the insulating layer 316 in a region not illustrated.

In the case where LTPS transistors are used as all of the transistors included in the pixel 21, the transistor 310 illustrated in FIG. 11A as an example or the transistor 310a illustrated in FIG. 11B as an example can be used. In this case, the transistors 310a may be used as all of the transistors included in the pixels 21, the transistors 310 may be used as all of the transistors, or the transistors 310a and the transistors 310 may be used in combination.

Structure Example 3

Described below is an example of a structure including both a transistor containing silicon in its semiconductor layer and a transistor containing a metal oxide in its semiconductor layer.

Figures 12A, 12B:
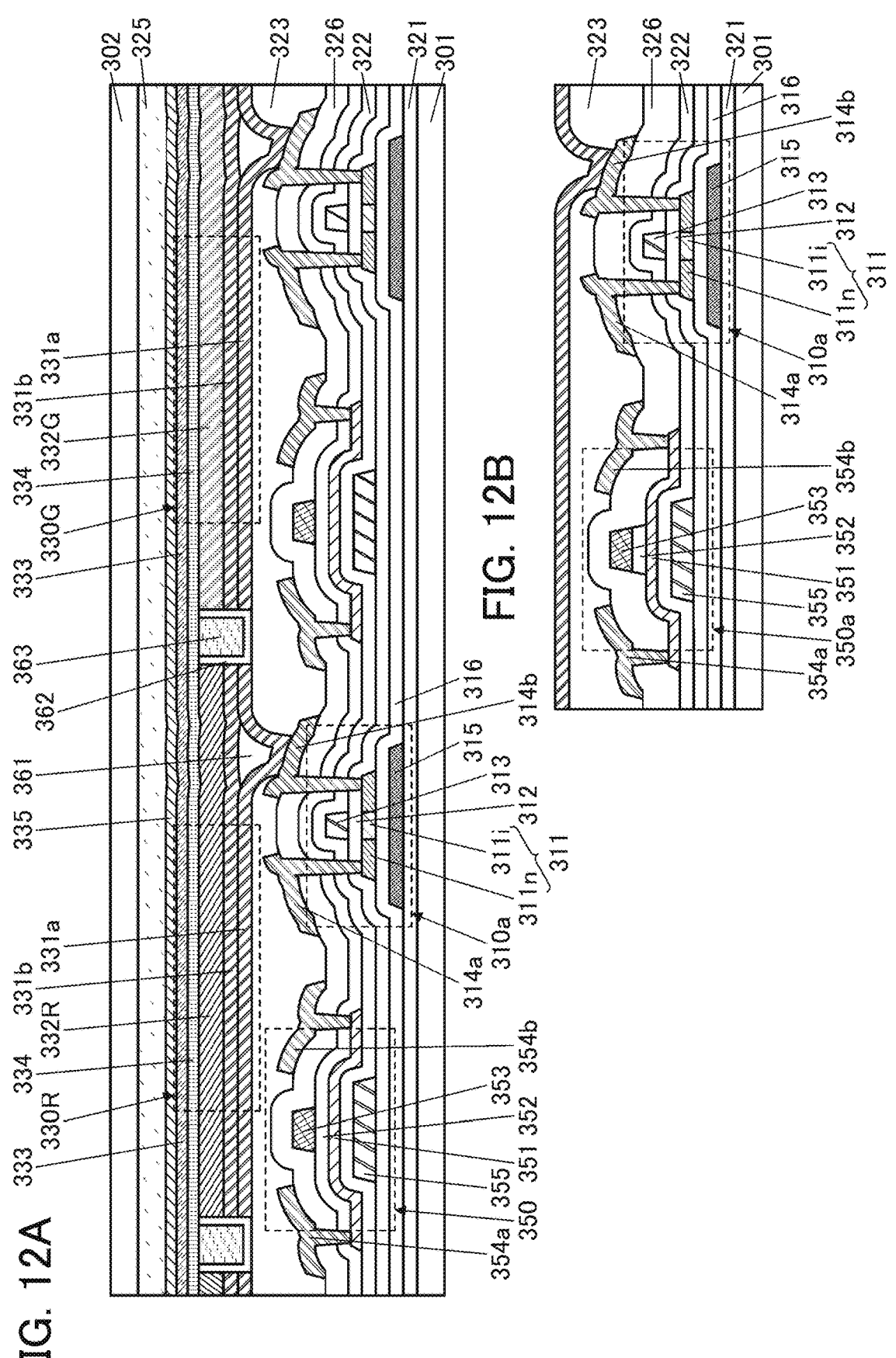
FIG. 12A and FIG. 12B are diagrams illustrating structure examples of a display apparatus.

FIG. 12A is a schematic cross-sectional view including the transistor 310a, a transistor 350, the light-emitting element 330R, and the light-emitting element 330G.

Structure example 1 and Structure example 2 described above can be referred to for the transistor 310a, the light-emitting element 330R, and the light-emitting element 330G.

The transistor 350 is a transistor including a metal oxide in its semiconductor layer. The structure illustrated in FIG. 12A is an example where the transistor 350 corresponds to the transistor M1 in the pixel 21, for example. In other words, FIG. 12A illustrates an example where one of a source and a drain of the transistor 310a is electrically connected to the conductive layer 331a of the light-emitting element 330R or the light-emitting element 330G.

FIG. 12A illustrates an example where the transistor 350 includes a pair of gates.

The transistor 350 includes a conductive layer 355, the insulating layer 322, a semiconductor layer 351, an insulating layer 352, a conductive layer 353, and the like. Part of the conductive layer 353 functions as a first gate of the transistor 350, and part of the conductive layer 355 functions as a second gate of the transistor 350. Part of the insulating layer 352 functions as a first gate insulating layer of the transistor 350, and part of the insulating layer 322 functions as a second gate insulating layer of the transistor 350.

The conductive layer 355 is provided over the insulating layer 312. The insulating layer 322 is provided to cover the conductive layer 355. The semiconductor layer 351 is provided over the insulating layer 322. The insulating layer 352 is provided to cover the semiconductor layer 351 and the insulating layer 322. The conductive layer 353 is provided over the insulating layer 352 and includes a region overlapping with the semiconductor layer 351 and the conductive layer 355.

An insulating layer 326 is provided to cover the insulating layer 352 and the conductive layer 353. A conductive layer 354a and a conductive layer 354b are provided over the insulating layer 326. The conductive layer 354a and the conductive layer 354b are electrically connected to the semiconductor layer 351 in opening portions provided in the insulating layer 326 and the insulating layer 352. Part of the conductive layer 354a functions as one of a source electrode and a drain electrode and part of the conductive layer 354b functions as the other of the source electrode and the drain electrode. The insulating layer 323 is provided to cover the conductive layer 354a, the conductive layer 354b, and the insulating layer 326.

Here, the conductive layer 314a and the conductive layer 314b electrically connected to the transistor 310a are preferably formed by processing the same conductive film as the conductive layer 354a and the conductive layer 354b. FIG. 12A illustrates a structure where the conductive layer 314a, the conductive layer 314b, the conductive layer 354a, and the conductive layer 354b are formed on the same plane (i.e., in contact with the top surface of the insulating layer 326)

and contain the same metal element. In this case, the conductive layer 314a and the conductive layer 314b are electrically connected to the low-resistance regions 311n through openings provided in the insulating layer 326, the insulating layer 352, the insulating layer 322, and the insulating layer 312. This is preferable because the fabrication process can be simplified.

Moreover, the conductive layer 313 functioning as the first gate electrode of the transistor 310a and the conductive layer 355 functioning as the second gate electrode of the transistor 350 are preferably formed by processing the same conductive film. FIG. 12A illustrates a structure where the conductive layer 313 and the conductive layer 355 are formed on the same plane (i.e., in contact with the top surface of the insulating layer 312) and contain the same metal element. This is preferable because the fabrication process can be simplified.

In the structure in FIG. 12A, the insulating layer 352 functioning as the first gate insulating layer of the transistor 350 covers an end portion of the semiconductor layer 351; however, the insulating layer 352 may be processed to have substantially the same top surface shape as the conductive layer 353 as in the transistor 350a illustrated in FIG. 12B.

Note that in this specification and the like, the expression "top surface shapes are substantially the same" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such cases are also represented by the expression "top surface shapes are substantially the same".

Structure Example 4

Figure 13:
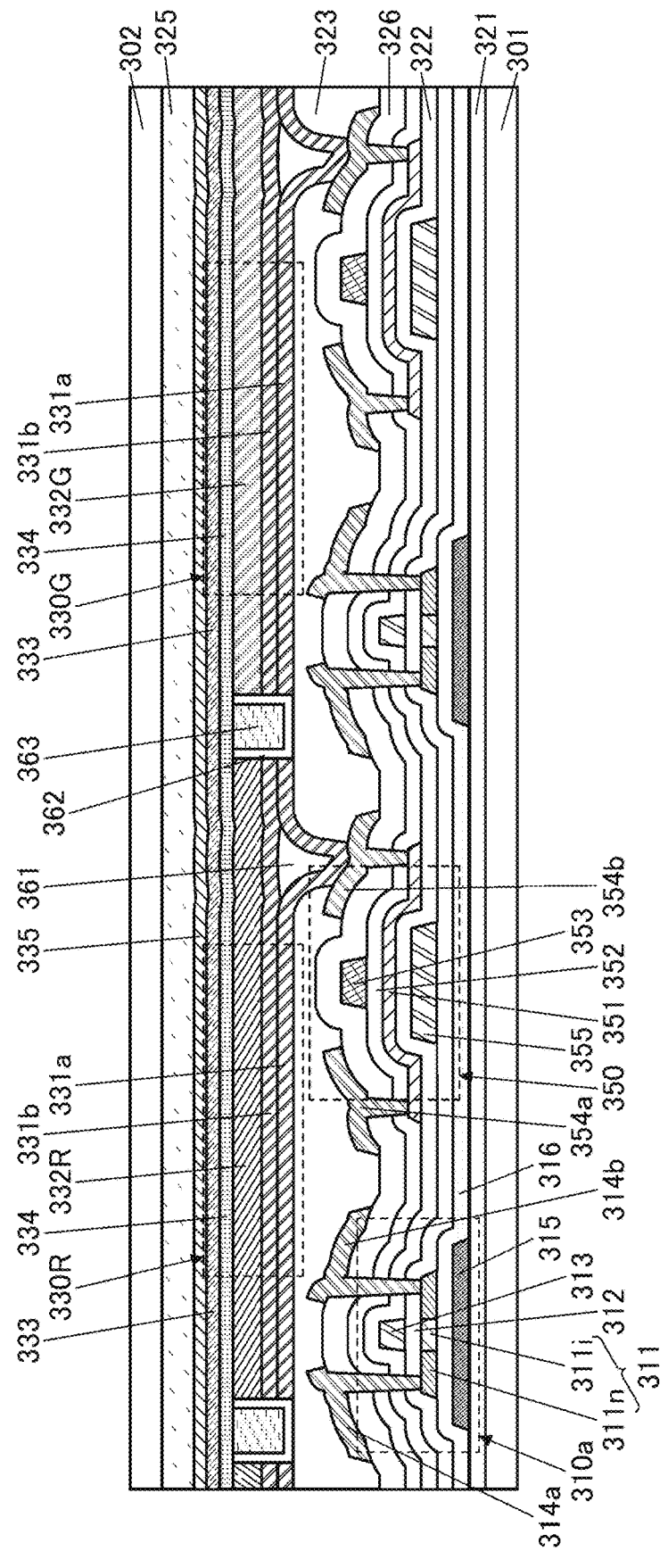
FIG. 13 is a diagram illustrating a structure example of a display apparatus.

FIG. 13 illustrates a structure example different from the above structure. The display apparatus illustrated in FIG. 13 is different from the above display apparatus mainly in that the transistor 310a and the transistor 350 are replaced with each other, for example.

In FIG. 13, the transistor 350 is electrically connected to the pixel electrode. That is, in the example, the transistor 350 corresponds to the transistor M2 in the pixel 21. In this case, the transistor 310a corresponds to the transistor M1, the transistor M3, or another transistor.

With such a structure, a display apparatus having all of a high aperture ratio, a high resolution, high display quality, and low power consumption can be achieved.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, a structure example of a display apparatus different from those described above will be described.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 14A:
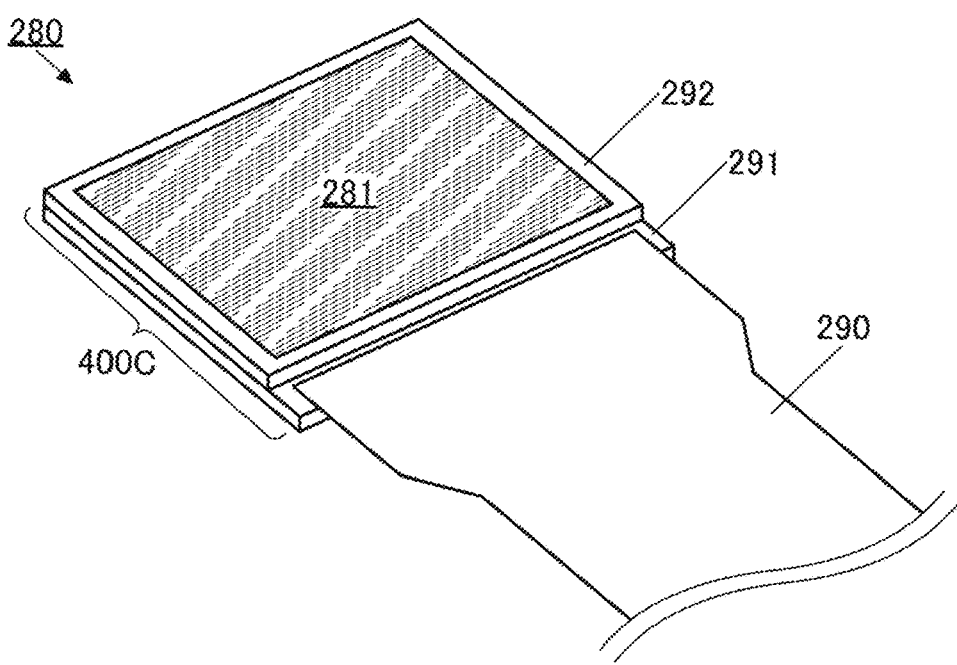
FIG. 14A and FIG. 14B are perspective views illustrating an example of a display module.

FIG. 14A is a perspective view of a display module 280. The display module 280 includes a display apparatus 400C and an FPC 290.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 14B:
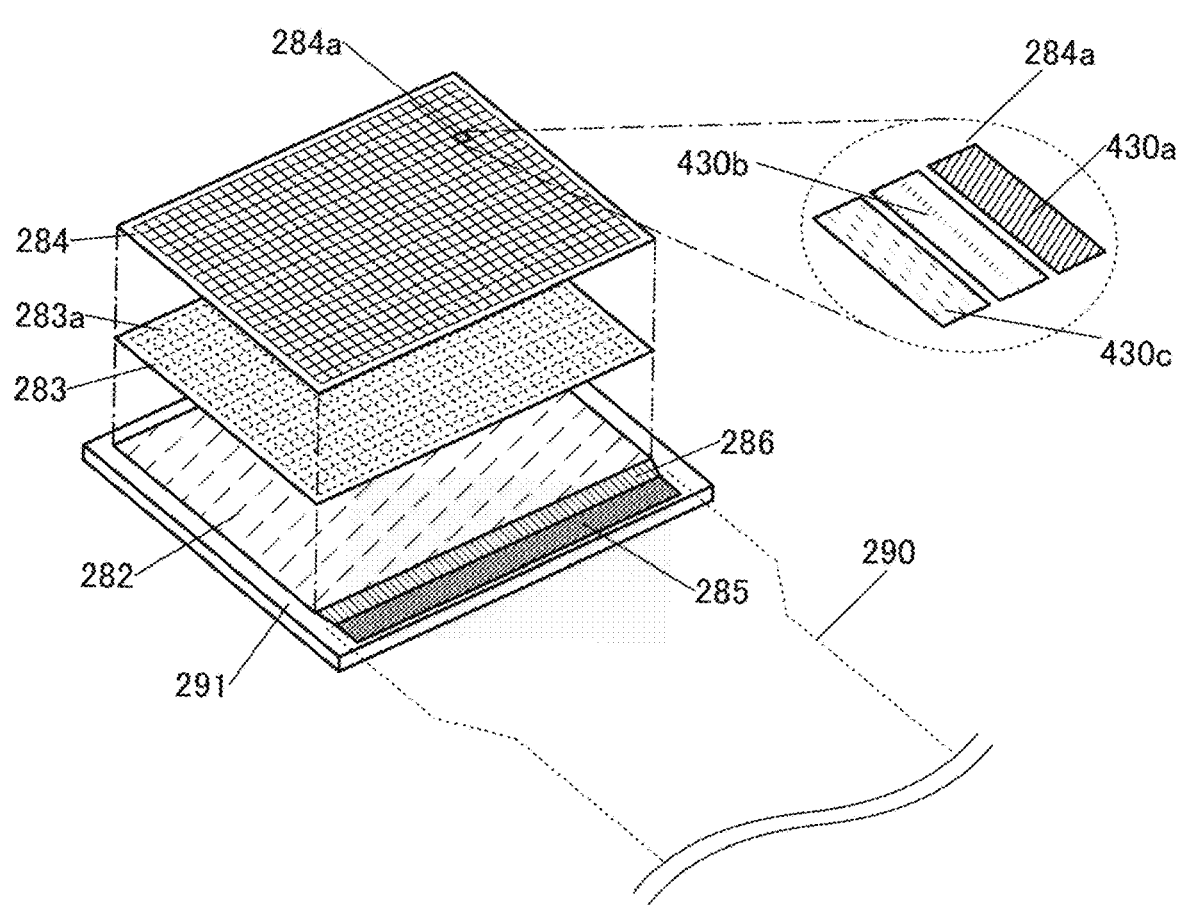

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 14B. The pixel 284a includes the light-emitting elements 430a, 430b, and 430c that emit light of different colors. The plurality of light-emitting elements are preferably arranged in a stripe pattern as illustrated in FIG. 14B. With the stripe pattern that enables high-density arrangement of the light-emitting elements of one embodiment of the present invention or pixel circuits, a high-resolution display apparatus can be provided. Alternatively, any of a variety of arrangement methods such as delta arrangement and PenTile arrangement can be employed.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. In this case, a gate signal is input to a gate of the selection transistor and a source signal is input to one of a source and a drain thereof. With such a structure, an active-matrix display apparatus is achieved.

The circuit portion 282 includes a circuit for driving the pixel circuits 283a in the pixel circuit portion 283. For example, one or both of a gate line driver circuit and a source line driver circuit are preferably included. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have an extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such the display module 280 has an extremely high resolution, and thus can be suitably used for a VR device such as a head-mounted display or a glasses-type AR device. For example, even with a structure where the display portion of the display module 280 is seen through a lens, pixels of the extremely-high-resolution the display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

A pixel 103 illustrated in FIG. 1A employs stripe arrangement. The pixel 103 illustrated in FIG. 1A is composed of three subpixels of subpixels R, G, and B. The subpixels R, G, and B include light-emitting devices that emit light of different colors. For example, the subpixels R, G, and B can be subpixels of red, green, and blue.

Figures 15A, 15B, 15C, 15D, 15E:
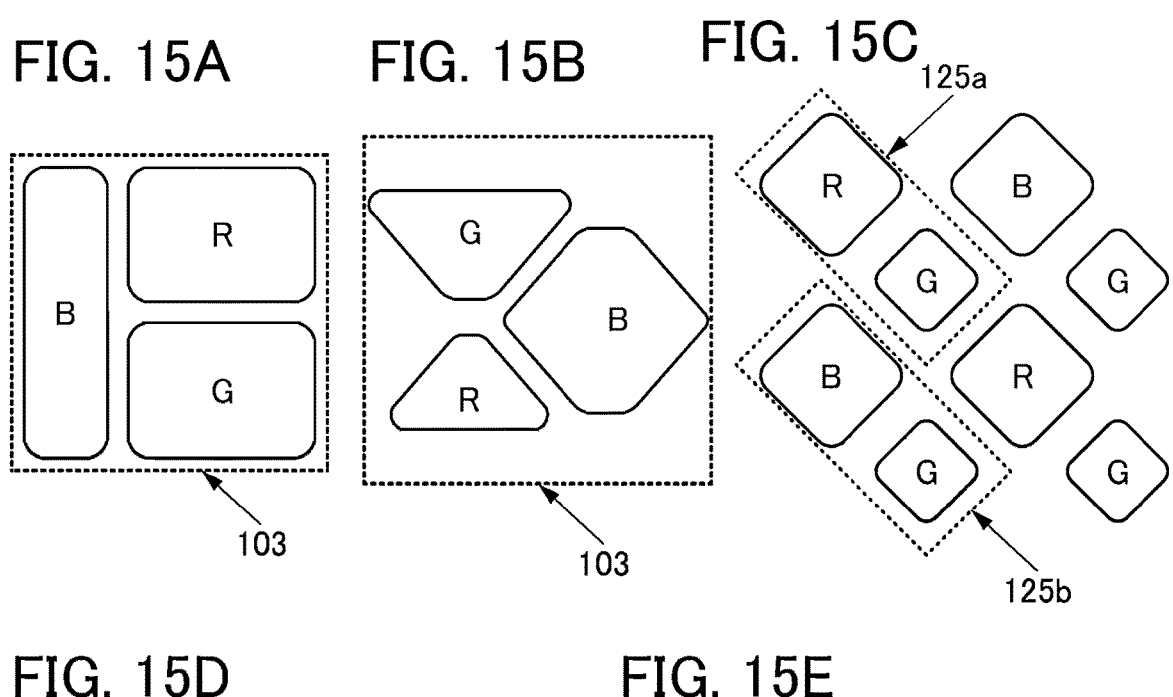
FIG. 15A to FIG. 15E are diagrams illustrating examples of a pixel of a display apparatus.

The pixel 103 illustrated in FIG. 15A employs S stripe arrangement. The pixel 103 illustrated in FIG. 15A is composed of three subpixels of the subpixels R, G, and B.

The pixel 103 illustrated in FIG. 15B includes the subpixel G whose top surface has a rough trapezoidal shape with rounded corners, the subpixel R whose top surface has a rough triangle shape with rounded corners, and the subpixel B whose top surface has a rough tetragonal or rough hexagonal shape with rounded corners. The subpixel G has a larger light-emitting area than the subpixel R. In this manner, the shapes and sizes of the subpixels can be determined independently. For example, the size of a subpixel including a light-emitting device with higher reliability can be smaller. For example, the subpixel R may be a red subpixel, the subpixel G may be a green subpixel, and the subpixel B may be a blue subpixel.

Pixels 125a and 125b illustrated in FIG. 15C employ PenTile arrangement. FIG. 15C illustrates an example where the pixels 125a including the subpixel R and the subpixel G and the pixels 125b including the subpixel G and the subpixel B are alternately arranged. For example, the subpixel R may be a red subpixel, the subpixel G may be a green subpixel, and the subpixel B may be a blue subpixel.

The pixels 125a and 125b illustrated in FIG. 15D and FIG. 15E employ delta arrangement. The pixel 125a includes two subpixels (the subpixels R and G) in the upper row (first row) and one subpixel (the subpixel B) in the lower row (second row). The pixel 125b includes one subpixel (the subpixel B) in the upper row (first row) and two subpixels (the subpixels R and G) in the lower row (second row).

FIG. 15D illustrates an example where the top surface of each subpixel has a rough tetragonal shape with rounded corners, and FIG. 15E illustrates an example where the top surface of each subpixel has a circular shape.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Furthermore, in the method for fabricating the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape when processed. As a result, a top surface of the EL layer sometimes has a polygonal shape with rounded corners, an elliptical shape, a circular shape, or the like. For example, when a resist mask with a square top surface is intended to be formed, a resist mask with a circular top surface might be formed and the top surface of the EL layer might be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

The pixel 103 illustrated in FIG. 16A to FIG. 16C employs stripe arrangement. The pixel 103 illustrated in FIG. 16A to FIG. 16C is composed of four subpixels of the subpixels R, G, and B and a subpixel W. The subpixels R, G, B, and W include light-emitting devices that emit light of different colors. For example, the subpixels R, G, B, and W can be subpixels of red, green, blue, and white.

FIG. 16A illustrates an example where each subpixel has a rectangular top surface, FIG. 16B illustrates an example where each subpixel has a top surface shape where two half circles and a rectangle are combined, and FIG. 16C illustrates an example where each subpixel has an elliptical top surface.

The pixel 103 illustrated in FIG. 16D to FIG. 16F employs matrix arrangement. The pixel 103 illustrated in FIG. 16D to FIG. 16F is composed of four subpixels of the subpixels R, G, B, and W.

FIG. 16D illustrates an example where each subpixel has a square top surface, FIG. 16E illustrates an example where each subpixel has a substantially square top surface with rounded corners, and FIG. 16F illustrates an example where each subpixel has a circular top surface. FIG. 16G includes the subpixels R, G, and B in the upper row (first row) and three subpixels W in the lower row (second row). In other words, FIG. 16G includes the subpixel R and the subpixel W in the left column (first column), the subpixel G and the subpixel W in the middle column (second column), and the subpixel B and the subpixel W in the right column (third column).

An electronic device including the display apparatus of one embodiment of the present invention can have one or both of a flashlight function using subpixels (W) and a lighting function using the subpixels (W).

Here, white light emitted from the subpixel (W) may be light that instantaneously has high luminance, such as a flashlight or a strobe light, or may be light with high rendering properties, such as a reading light. In the case where white light is used for a reading light or the like, the color temperature of white light is set low. For example, when white light is made to have incandescent light color (e.g., higher than or equal to 2500 K and lower than 3250 K) or warm white (e.g., higher than or equal to 3250 K and lower than 3800 K), a light source that is easy on the user's eyes can be obtained.

A strobe light function can be obtained, for example, with a structure where light emission and non-light emission are repeated at short intervals. A flashlight function can be obtained, for example, with a structure where flash of light is caused by instantaneous discharge using principles of an electric double layer.

Figure 17A:
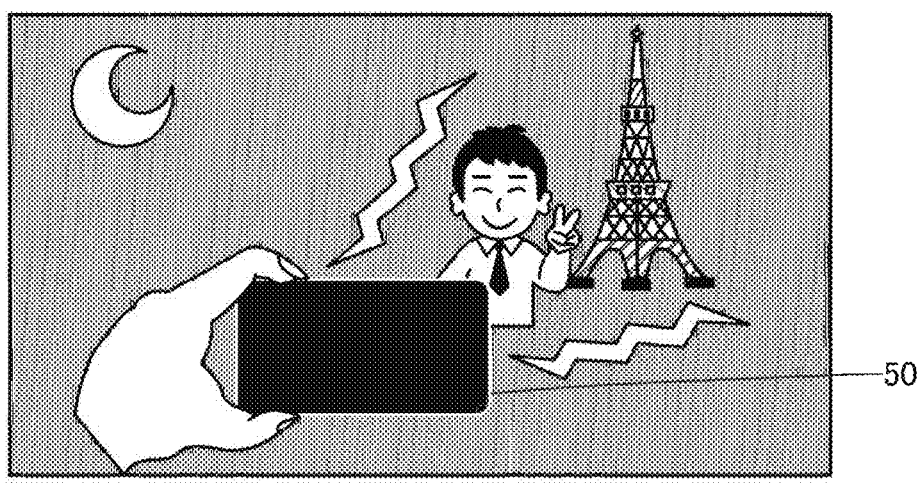
FIG. 17A to FIG. 17C are schematic diagrams illustrating examples of an electronic device.

For example, in the case where an electronic device 50 has a camera function, the electronic device 50 can take images at night by using a strobe light function or a flashlight function, as illustrated in FIG. 17A. Here, the display apparatus in the electronic device 50 functions as a planar light source, so that a subject is less likely to be shadowed; thus, a clear image can be taken. Note that a strobe light function or a flashlight function can be used not only at night. In the case where the electronic device 50 has a strobe light function or a flashlight function, the color temperature of white light can be set high. For example, the color temperature of light emitted from the electronic device 50 can be set to white (e.g., higher than or equal to 3800 K and lower than 4500 K), neutral white (e.g., higher than or equal to 4500 K and lower than 5500 K), or daylight white (e.g., higher than or equal to 5500 K and lower than 7100 K).

When the intensity of light emitted from a flash is excessively high, portions that originally have different brightnesses might be uniformly white in an image (i.e., blown-out highlights). On the other hand, when the intensity of light emitted from a flash is too low, dark portions might be uniformly black in an image (i.e., blocked up shadows). In view of the above, a structure may be employed where a light-receiving device included in the display apparatus senses brightness around a subject and the amount of light emitted from the light-emitting device included in the subpixel can be adjusted to be optimal. That is, the electronic device 50 can be regarded as having a function of an exposure meter.

Figure 17B:
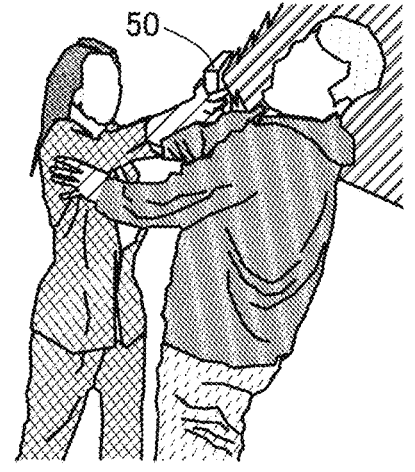

A strobe light function and a flashlight function can be used for crime prevention, self-defense, or the like. For example, as illustrated in FIG. 17B, making the electronic device 50 emit light toward an attacker can hold back the attacker. In case of emergency such as an attack, it is sometimes difficult to deal with the attacker calmly and aim light from a self-defense light with a narrow illuminating range at the face of the attacker. Meanwhile, since the display apparatus of the electronic device 50 is a planar light source, the attacker will see light emitted from the display apparatus even when the direction of the display apparatus is slightly off the attacker.

Note that in the case where the display apparatus of the electronic device 50 functions as a flashlight for crime prevention or self-defense as illustrated in FIG. 17B, the luminance is preferably made higher than that in the case of taking images at night illustrated in FIG. 17A. Making the display apparatus emit light intermittently a plurality of times can more easily hold back an attacker. Furthermore, the electronic device 50 may emit a sound, such as a buzzer sound with a relatively large volume, to ask for help from nearby people. When a sound is emitted around the face of an attacker, not only light but also a sound can hold back the attacker, which is preferable.

To improve the color-rendering properties of light emitted from the light-emitting device included in the subpixel W, it is preferable to increase the number of light-emitting layers included in the light-emitting device or the number of kinds of light-emitting substances contained in the light-emitting layer. Accordingly, a broad light emission spectrum having intensities in a wider wavelength range can be obtained; thus, light that is close to sunlight and has higher color-rendering properties can be emitted.

Figure 17C:
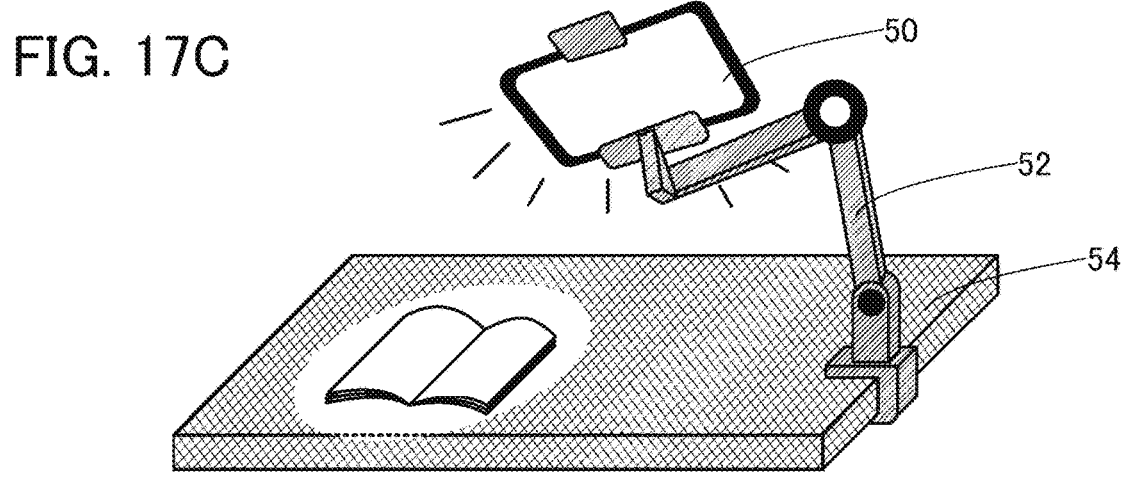

For example, the electronic device 50 that can emit light with high color-rendering properties may be used as a reading light or the like as illustrated in FIG. 17C. In FIG. 17C, the electronic device 50 is fixed to a desk 54 with a support 52. The use of the support 52 enables the electronic device 50 to be used as a reading light. Since the display apparatus of the electronic device 50 functions as a planar light source, an object (a book in FIG. 17C) is less likely to be shadowed, and light reflected by the object is distributed broadly. This increases visibility of the object and makes the object easy to see. In addition, the emission spectrum of the light-emitting device that emits white light is broad; hence, blue light is relatively reduced. Thus, eye fatigue and the like of the user of the electronic device 50 can be reduced.

Note that the structure of the support 52 is not limited to that illustrated in FIG. 17C. An arm, a movable portion, or the like can be provided as appropriate so that the range of motion increases as much as possible. In FIG. 17C, the support 52 holds the electronic device 50 so as to put the electronic device 50 between its parts; however, the present invention is not limited thereto. For example, a magnet, a suction cup, or the like may be used as appropriate.

The emission color for the lighting use is preferably white. However, there is no particular limitation on the emission color for the lighting use; the practitioner can appropriately select one or more optimal emission colors from white, blue, violet, bluish violet, green, yellowish green, yellow, orange, red, and the like.

This embodiment can be combined with the other embodiments as appropriate.

Embodiment 4

In this embodiment, examples where a display apparatus of one embodiment of the present invention includes a light-receiving device or the like will be described.

In the display apparatus of this embodiment, a pixel can include a plurality of types of subpixels including light-emitting devices that emit light of different colors. For example, a pixel can include three types of subpixels. As the three subpixels, subpixels of three colors of red (R), green (G), and blue (B) and subpixels of three colors of yellow (Y), cyan (C), and magenta (M) can be given. Alternatively, a pixel can include four types of subpixels. As the four subpixels, subpixels of four colors of R, G, B, and white (W) and subpixels of four colors of R, G, B, and Y can be given.

There is no particular limitation on the arrangement of subpixels, and a variety of methods can be employed. Examples of the arrangement of subpixels include stripe arrangement, S stripe arrangement, matrix arrangement, delta arrangement, Bayer arrangement, and pentile arrangement.

The top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. Here, the top surface shape of the subpixel corresponds to the top surface shape of a light-emitting region of the light-emitting device.

The display apparatus of one embodiment of the present invention may include a light-receiving device (also referred to as a light-receiving element) in the pixel.

In the display apparatus including the light-emitting device and the light-receiving device in the pixel, the pixel has a light-receiving function, which enables detection of a touch or approach of an object while an image is displayed. For example, all the subpixels included in the display apparatus can display an image; alternatively, some subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect an approach or touch of an object with the use of the light-receiving devices.

For example, a pn or pin photodiode can be used as the light-receiving device. The light-receiving devices function as photoelectric conversion devices (also referred to as photoelectric conversion elements) that detect light entering the light-receiving devices and generate electric charge. The amount of electric charge generated from the light-receiving devices depends on the amount of light entering the light-receiving devices.

As the light-receiving device, it is particularly preferable to use an organic photodiode including a layer containing an organic compound. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus including the organic EL device.

Figure 18A:
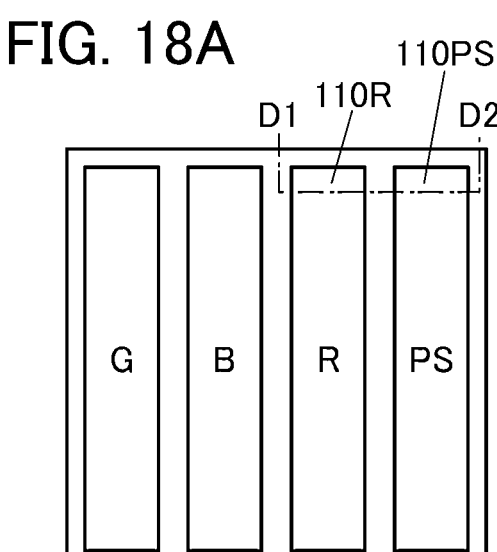
FIG. 18A to FIG. 18D are diagrams illustrating examples of a pixel of a display apparatus.
Figure 18B:
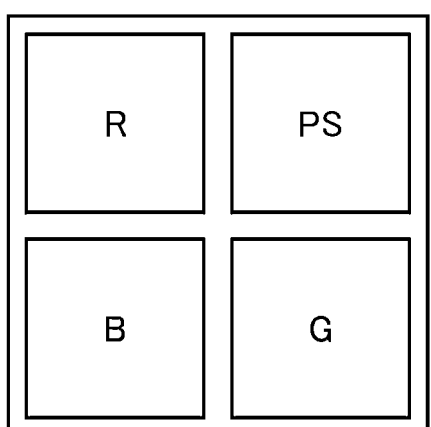

Pixels illustrated in FIG. 18A and FIG. 18B each include the subpixel G, the subpixel B, the subpixel R, and a subpixel PS.

The pixel illustrated in FIG. 18A employs stripe arrangement. The pixel illustrated in FIG. 18B employs matrix arrangement.

Figure 18C:
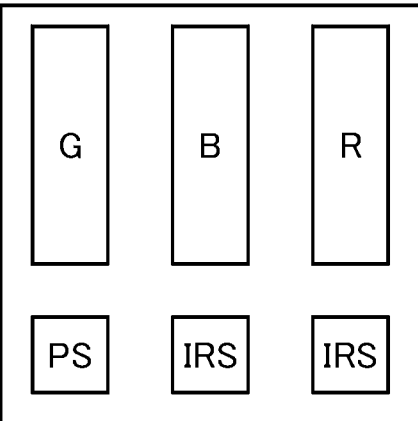
Figure 18D:
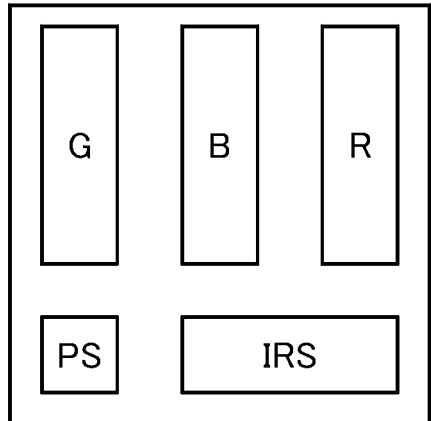

Pixels illustrated in FIG. 18C and FIG. 18D each include the subpixel G, the subpixel B, the subpixel R, the subpixel PS, and a subpixel IRS.

FIG. 18C and FIG. 18D each illustrate an example where one pixel is provided in two rows and three columns. Three subpixels (the subpixel G, the subpixel B, and the subpixel R) are provided in the upper row (first row). In FIG. 18C, three subpixels (one subpixel PS and two subpixels IRS) are provided in the lower row (second row). Meanwhile, in FIG. 18D, two subpixels (one subpixel PS and one subpixel IRS) are provided in the lower row (second row). Note that the layout of the subpixels is not limited to the structure in FIG. 18A to FIG. 18D.

The subpixel R includes a light-emitting device that emits red light. The subpixel G includes a light-emitting device that emits green light. The subpixel B includes a light-emitting device that emits blue light.

The subpixel PS and the subpixel IRS each include a light-receiving device. There is no particular limitation on the wavelength of light detected by the subpixel PS and the subpixel IRS.

The light-receiving area of the subpixel PS is smaller than the light-receiving area of the subpixel IRS. A smaller light-receiving area leads to a narrower image-capturing range, inhibits a blur in a captured image, and improves the definition. Thus, the use of the subpixel PS enables higher-resolution or higher-definition image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably detects visible light, and preferably detects one or more of blue light, violet light, bluish violet light, green light, yellowish green light, yellow light, orange light, red light, and the like. The light-receiving device included in the subpixel PS may detect infrared light.

The subpixel IRS can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel IRS can be determined depending on the application purpose. For example, the subpixel IRS preferably detects infrared light. Thus, a touch can be detected even in a dark place.

Here, the touch sensor or the near touch sensor can detect an approach or contact of an object (e.g., a finger, a hand, or a pen). The touch sensor can detect the object when the display apparatus and the object come in direct contact with each other. Furthermore, even when an object is not in contact with the display apparatus, the near touch sensor can detect the object. For example, the display apparatus is preferably capable of detecting an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

When one pixel includes two kinds of light-receiving devices, the display apparatus can have two additional functions as well as a display function, enabling a multifunctional display apparatus.

For high-resolution image capturing, the subpixel PS is preferably provided in all pixels included in the display apparatus. In contrast, the subpixel IRS used for a touch sensor, a near touch sensor, or the like only needs to be provided in some pixels included in the display apparatus because detection with the subpixel IRS is not required to have high accuracy as compared to detection with the subpixel PS. When the number of subpixels IRS included in the display apparatus is smaller than the number of subpixels PS, higher detection speed can be achieved.

Here, a structure of the light-receiving device that can be used for the subpixel PS and the subpixel IRS will be described.

The light-receiving device includes at least an active layer functioning as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. In other words, when the light-receiving device is driven by application of reverse bias between the pixel electrode and the common electrode, light entering the light-receiving device can be detected and electric charge can be generated and extracted as current.

A fabrication method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a pattern of a metal mask; thus, the island-shaped active layer with a uniform thickness can be formed. In addition, a sacrificial layer provided over the active layer can reduce damage to the active layer in the fabrication process of the display apparatus, increasing the reliability of the light-receiving device.

Here, a layer shared by the light-receiving device and the light-emitting device sometimes have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device sometimes have the same function in both the light-emitting device and the light-receiving device. For example, the hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment shows an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1", 4',4"-tetrahydro-di[1,4]methanonaphthaleno[1,2:2',3', 56,60:2",3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a substance with a high hole-injection property, a hole-blocking material, a material with a high electron-injection property, an electron-blocking material, and the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The above is the description of the light-receiving device.

Figure 19A:
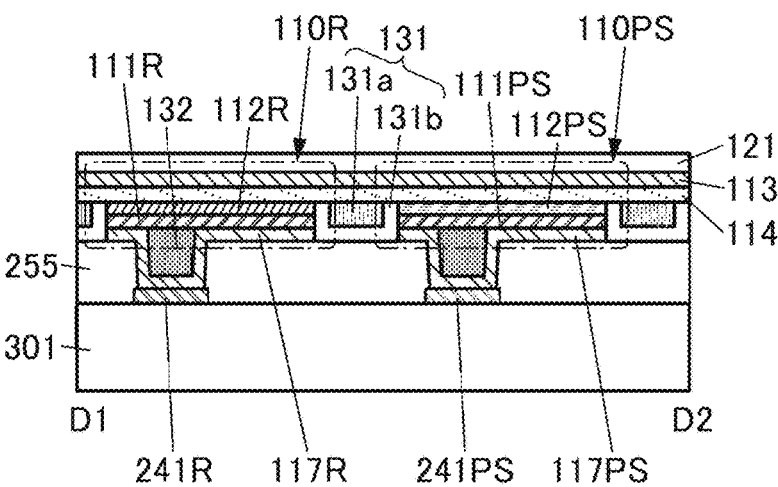
FIG. 19A is a cross-sectional view illustrating an example of a display apparatus.

FIG. 19A illustrates a structure example of a cross section along a dashed-dotted line D1-D2 shown in FIG. 18A.

By replacing the EL layer with an active layer that can be used for a light-receiving element in the structure of the light-emitting element 110 described in the above embodiment, the light-receiving element can be formed.

FIG. 18A and FIG. 19A illustrate an example where the light-emitting element 110R is used as the light-emitting element (light-emitting device) included in the subpixel R and a light-receiving element 110PS having a function of detecting visible light is used as the light-receiving element (light-receiving device) included in the subpixel PS. The light-receiving element 110PS has a structure where the EL layer 112 in the structure of the light-emitting element 110 described in the above embodiment is replaced with an active layer 112PS that can be used for the light-receiving element having a function of detecting visible light. The light-receiving element 110PS includes a conductive layer 117PS, the insulating layer 132 over the conductive layer 117PS, a pixel electrode 111PS over the conductive layer 117PS and the insulating layer 132, and the active layer 112PS over the pixel electrode 111PS. The common electrode 113 is provided over the active layer 112PS. The common layer 114 may be provided between the common electrode 113 and the active layer 112PS. Note that the conductive layer 117PS is provided over the insulating layer 255 and in an opening portion of the insulating layer 255. The conductive layer 117PS is electrically connected to the conductive layer 241 (the conductive layer 241PS here) provided in a semiconductor circuit 401.

Figures 19B, 19C:
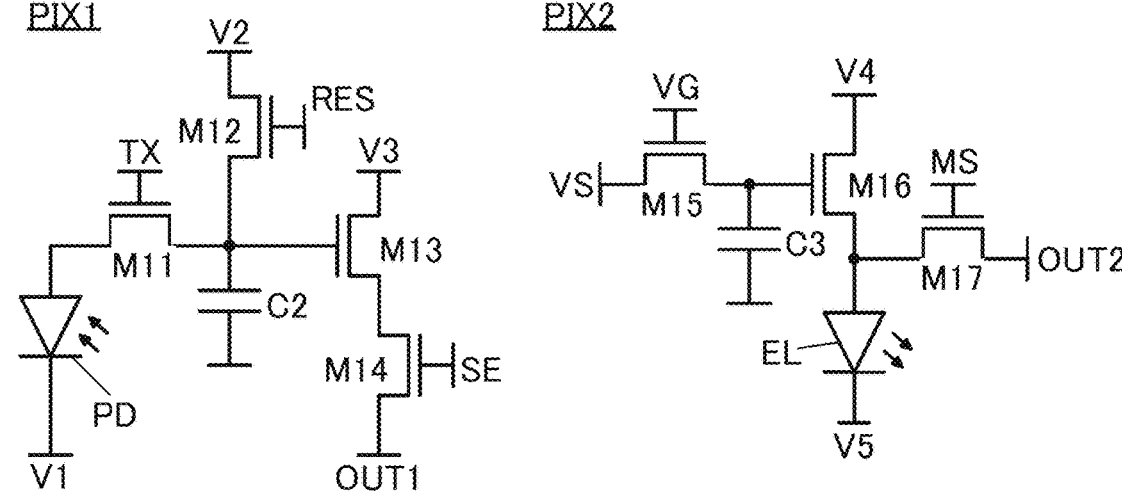
FIG. 19B and FIG. 19C are diagrams illustrating examples of a circuit diagram of a pixel of a display apparatus.

FIG. 19B illustrates an example of a pixel circuit of a subpixel including a light-receiving device, and FIG. 19C illustrates an example of a pixel circuit of a subpixel including a light-emitting device.

A pixel circuit PIX1 illustrated in FIG. 19B includes a light-receiving device PD, a transistor M11, a transistor M12, a transistor M13, a transistor M14, and a capacitor C2. Here, an example where a photodiode is used as the light-receiving device PD is illustrated.

A cathode of the light-receiving device PD is electrically connected to a wiring V1, and an anode thereof is electrically connected to one of a source and a drain of the transistor M11. A gate of the transistor M11 is electrically connected to a wiring TX, and the other of the source and the drain thereof is electrically connected to one electrode of the capacitor C2, one of a source and a drain of the transistor M12, and a gate of the transistor M13. A gate of the transistor M12 is electrically connected to a wiring RES, and the other of the source and the drain thereof is electrically connected to a wiring V2. One of a source and a drain of the transistor M13 is electrically connected to a wiring V3, and the other of the source and the drain thereof is electrically connected to one of a source and a drain of the transistor M14. A gate of the transistor M14 is electrically connected to a wiring SE, and the other of the source and the drain thereof is electrically connected to a wiring OUT1.

A constant potential is supplied to the wiring V1, the wiring V2, and the wiring V3. When the light-receiving device PD is driven with a reverse bias, a potential lower than the potential of the wiring V1 is supplied to the wiring V2. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output in response to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 19C includes a light-emitting device EL, a transistor M15, a transistor M16, a transistor M17, and a capacitor C3. Here, an example where a light-emitting diode is used as the light-emitting device EL is illustrated. In particular, an organic EL element is preferably used as the light-emitting device EL.

A gate of the transistor M15 is electrically connected to a wiring VG, one of a source and a drain thereof is electrically connected to a wiring VS, and the other of the source and the drain thereof is electrically connected to one electrode of the capacitor C3 and a gate of the transistor M16. One of a source and a drain of the transistor M16 is electrically connected to a wiring V4, and the other of the source and the drain thereof is electrically connected to an anode of the light-emitting device EL and one of a source and a drain of the transistor M17. A gate of the transistor M17 is electrically connected to a wiring MS, and the other of the source and the drain thereof is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL, in accordance with a potential supplied to the gate. When the transistor M15 is in a conduction state, a potential supplied to the wiring VS is supplied to the gate of the transistor M16, and the emission luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Note that in a display panel of this embodiment, the light-emitting device may be made to emit light in a pulsed manner so as to display an image. A reduction in the driving time of the light-emitting device can reduce power consumption of the display panel and inhibit heat generation of the display panel. An organic EL element is particularly preferable because of its favorable frequency characteristics. The frequency can be higher than or equal to 1 kHz and lower than or equal to 100 MHz, for example.

A transistor using a metal oxide (an oxide semiconductor) in a semiconductor layer where a channel is formed is preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon can achieve an extremely low off-state current. Thus, such a low off-state current enables long-term retention of electric charge accumulated in a capacitor that is connected in series with the transistor. Therefore, it is particularly preferable to use a transistor using an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the fabrication cost.

Alternatively, transistors using silicon as a semiconductor where a channel is formed can be used as the transistor M11 to the transistor M17. In particular, the use of silicon with high crystallinity, such as single crystal silicon or polycrystalline silicon, is preferable because high field-effect mobility is achieved and a higher-speed operation is possible.

Alternatively, a transistor using an oxide semiconductor may be used as one or more of the transistor M11 to the transistor M17, and transistors using silicon may be used as the other transistors.

Although n-channel transistors are shown as the transistors in FIG. 19B and FIG. 19C, p-channel transistors can also be used.

The transistors included in the pixel circuit PIX1 and the transistors included in the pixel circuit PIX2 are preferably formed to be arranged over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided at a position overlapping with the light-receiving device PD or the light-emitting device EL. Thus, the effective area of each pixel circuit can be reduced, and a high-resolution light-receiving portion or display portion can be achieved.

As described above, one pixel includes two kinds of light-receiving devices in the display apparatus of this embodiment, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

This embodiment can be combined with the other embodiments as appropriate.

Embodiment 5

In this embodiment, a light-emitting device that can be used for the display apparatus of one embodiment of the present invention is described.

[Structure Example of Light-Emitting Device]

As illustrated in FIG. 20A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 20A is referred to as a single structure in this specification.

FIG. 20B is a variation example of the EL layer 786 included in the light-emitting device illustrated in FIG. 20A. Specifically, the light-emitting device illustrated in FIG. 20B includes a layer 4430-1 over the lower electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Note that the structure where a plurality of light-emitting layers (light-emitting layers 4411, 4412, and 4413) are provided between the layer 4420 and the layer 4430 as illustrated in FIG. 20C and FIG. 20D is a variation of the single structure.

The structure where a plurality of light-emitting units (an EL layer 786a and an EL layer 786b) is connected in series with an intermediate layer (charge generation layer) 4440 therebetween as illustrated in FIG. 20E and FIG. 20F is referred to as a tandem structure in this specification. In this specification and the like, the structure illustrated in FIG. 20E and FIG. 20F is referred to as a tandem structure; however, without being limited to this, a tandem structure may be referred to as a stack structure, for example. Note that the tandem structure enables a light-emitting device capable of high-luminance light emission.

In FIG. 20C, light-emitting material that emit light of the same color may be used for the light-emitting layer 4411, the light-emitting layer 4412, and the light-emitting layer 4413.

Alternatively, different light-emitting materials may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. FIG. 20D illustrates an example where a coloring layer 785 functioning as a color filter is provided. When white light passes through a color filter, light of a desired color can be obtained.

In FIG. 20E, the same light-emitting material may be used for the light-emitting layer 4411 and the light-emitting layer 4412. Alternatively, light-emitting materials that emit light of different colors may be used for the light-emitting layer

4411 and the light-emitting layer 4412. White light emission can be obtained when the light-emitting layer 4411 and the light-emitting layer 4412 emit light of complementary colors. FIG. 20F illustrates an example where the coloring layer 785 is further provided.

Note that also in FIG. 20C, FIG. 20D, FIG. 20E, and FIG. 20F, the layer 4420 and the layer 4430 may each have a stacked-layer structure of two or more layers as illustrated in FIG. 20B.

A structure where light-emitting layers (here, blue (B), green (G), and red (R)) of light-emitting devices are separately formed is referred to as an SBS (Side By Side) structure in some cases.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer are complementary colors, the light-emitting device can be configured to emit white light as a whole. The same applies to a light-emitting device including three or more light-emitting layers.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

A specific structure example of the light-emitting device will be described here.

The light-emitting devices include at least the light-emitting layer. The light-emitting device may further include, as a layer other than the light-emitting layer, a layer including a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. Examples of a material with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. As the hole-transport material, a substance having a hole mobility higher than or equal to $1\times10^{-6}$ cm$^2$/Vs is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility higher than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate can be used.

Alternatively, as the above-described electron-injection layer, an electron-transport material may be used. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of the lowest-energy-side absorption band of the light-emitting substance, energy can be transferred smoothly and light emission can be obtained efficiently. With this structure, high efficiency, low-voltage driving, and a long lifetime of a light-emitting device can be achieved at the same time.

[Structure Example 4 of Display Apparatus]

Structure examples of light-emitting devices are described with reference to FIG. 21 and FIG. 22.

Figure 21A:
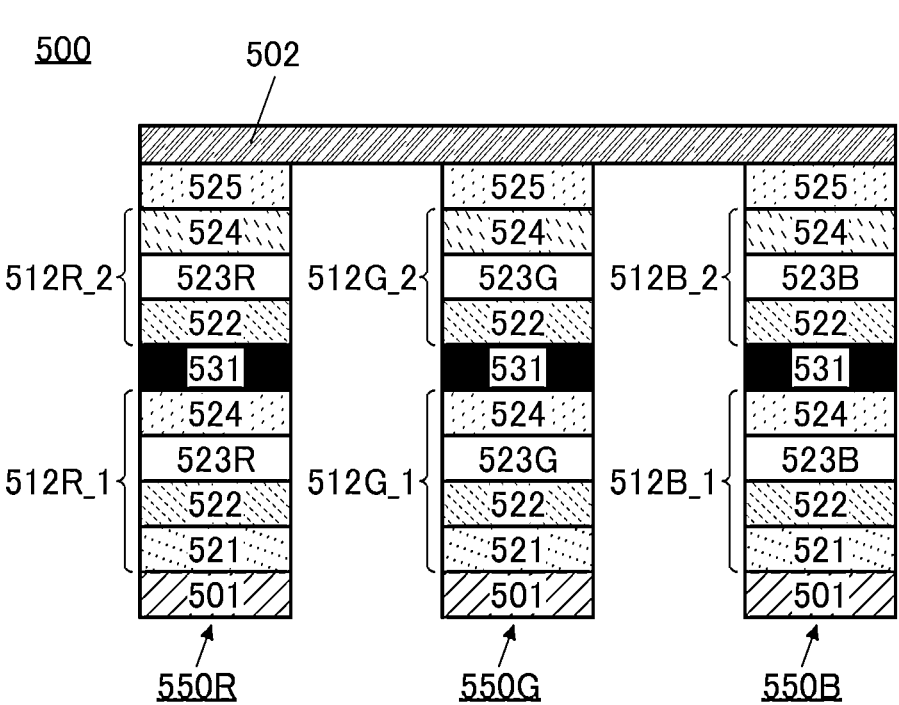
FIG. 21A and FIG. 21B are cross-sectional views illustrating examples of a display apparatus.

FIG. 21A is a schematic cross-sectional view of a display apparatus 500. The display apparatus 500 includes a light-emitting device 550R that emits red light, a light-emitting device 550G that emits green light, and a light-emitting device 550B that emits blue light. Note that the description of the light-receiving device included in the display apparatus is omitted in this embodiment.

The light-emitting device 550R has a structure where between a pair of electrodes (an electrode 501 and an electrode 502), two light-emitting units (a light-emitting unit 512R_1 and a light-emitting unit 512R_2) are stacked with an intermediate layer 531 therebetween. Similarly, the light-emitting device 550G includes a light-emitting unit 512G_1 and a light-emitting unit 512G_2, and the light-emitting device 550B includes a light-emitting unit 512B_1 and a light-emitting unit 512B_2.

The electrode 501 functions as a pixel electrode and is provided in every light-emitting device. The electrode 502 functions as a common electrode and is shared by a plurality of light-emitting devices.

The light-emitting unit 512R_1 includes a layer 521, a layer 522, a light-emitting layer 523R, a layer 524, and the like. The light-emitting unit 512R_2 includes the layer 522, the light-emitting layer 523R, the layer 524, and the like. The light-emitting device 550R includes a layer 525 and the like between the light-emitting unit 512R_2 and the electrode 502. Note that the layer 525 can also be regarded as part of the light-emitting unit 512R_2.

The layer 521 includes, for example, a layer containing a substance with a high hole-injection property (a hole-injection layer). The layer 522 includes, for example, a layer containing a substance with a high hole-transport property (a hole-transport layer). The layer 524 includes, for example, a layer containing a substance with a high electron-transport property (an electron-transport layer). The layer 525 includes, for example, a layer containing a substance with a high electron-injection property (an electron-injection layer).

Alternatively, the layer 521 may include an electron-injection layer, the layer 522 may include an electron-transport layer, the layer 524 may include a hole-transport layer, and the layer 525 may include a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

FIG. 21A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The intermediate layer 531 has a function of injecting electrons into one of the light-emitting unit 512R_1 and the light-emitting unit 512R_2 and injecting holes into the other when voltage is applied between the electrode 501 and the electrode 502. The intermediate layer 531 can also be referred to as a charge generation layer.

For example, the intermediate layer 531 can be suitably formed using a material that can be used for the electron-injection layer, such as lithium. Alternatively, as another example, the intermediate layer can be suitably formed using a material that can be used for the hole-injection layer. Alternatively, a layer containing a hole-transport material and an acceptor material (electron-accepting material) can be used for the intermediate layer. Alternatively, a layer containing an electron-transport material and a donor material can be used for the intermediate layer. Forming the intermediate layer with such a layer can inhibit an increase in drive voltage in the case of stacking light-emitting units.

Note that the light-emitting layer 523R included in the light-emitting device 550R contains a light-emitting substance that emits red light, the light-emitting layer 523G included in the light-emitting device 550G contains a light-emitting substance that emits green light, and the light-emitting layer 523B included in the light-emitting device 550B contains a light-emitting substance that emits blue light. Note that the light-emitting device 550G and the light-emitting device 550B have a structure where the light-emitting layer 523R included in the light-emitting device 550R is replaced with the light-emitting layer 523G and the light-emitting layer 523B, respectively, and the other components are similar to those of the light-emitting device 550R.

The structures (material, thickness, and the like) of the layer 521, the layer 522, the layer 524, and the layer 525 may be the same or different among the light-emitting devices of different colors.

A structure where a plurality of light-emitting units are connected in series with the intermediate layer 531 therebetween as in the light-emitting device 550R, the light-emitting device 550G, and the light-emitting device 550B is referred to as a tandem structure in this specification. On the other hand, a structure where one light-emitting unit is included between a pair of electrodes is referred to as a single structure. Note that in this specification and the like, the term "tandem structure" is used; however, without being limited to this, the tandem structure may be referred to as a stack structure, for example. The tandem structure enables a light-emitting device capable of high-luminance light emission. Furthermore, the tandem structure reduces the amount of current needed for obtaining the same luminance as compared with a single structure, and thus can improve the reliability.

A structure where light-emitting layers of light-emitting devices are separately formed as in the light-emitting device 550R, the light-emitting device 550G, and the light-emitting device 550B is referred to as a side-by-side (SBS) structure in some cases. The SBS structure can optimize materials and structures of light-emitting devices and thus can extend freedom of choice of materials and structures, whereby the luminance and the reliability can be easily improved.

It can be said that the display apparatus 500 employs a tandem structure and an SBS structure. Thus, the display apparatus 500 can take advantages of both the tandem structure and the SBS structure. As illustrated in FIG. 21A, two light-emitting units are formed in series in the display apparatus 500, and this structure may be referred to as a two-unit tandem structure. In addition, a two-unit tandem structure illustrated in FIG. 21A is a structure where a second light-emitting unit including a red light-emitting layer is stacked over a first light-emitting unit including a red light-emitting layer. Similarly, the two-unit tandem structure illustrated in FIG. 21A is a structure where a second light-emitting unit including a green light-emitting layer is stacked over a first light-emitting unit including a green light-emitting layer and a second light-emitting unit including a blue light-emitting layer is stacked over a first light-emitting unit including a blue light-emitting layer.

In FIG. 21A, the light-emitting unit 512R_1, the intermediate layer 531, the light-emitting unit 512R_2, and the layer 525 can be formed as an island-shaped layer. The light-emitting unit 512G_1, the intermediate layer 531, the light-emitting unit 512G_2, and the layer 525 can be formed as an island-shaped layer. The light-emitting unit 512B_1, the intermediate layer 531, the light-emitting unit 512B_2, and the layer 525 can be formed as an island-shaped layer.

Figure 21B:
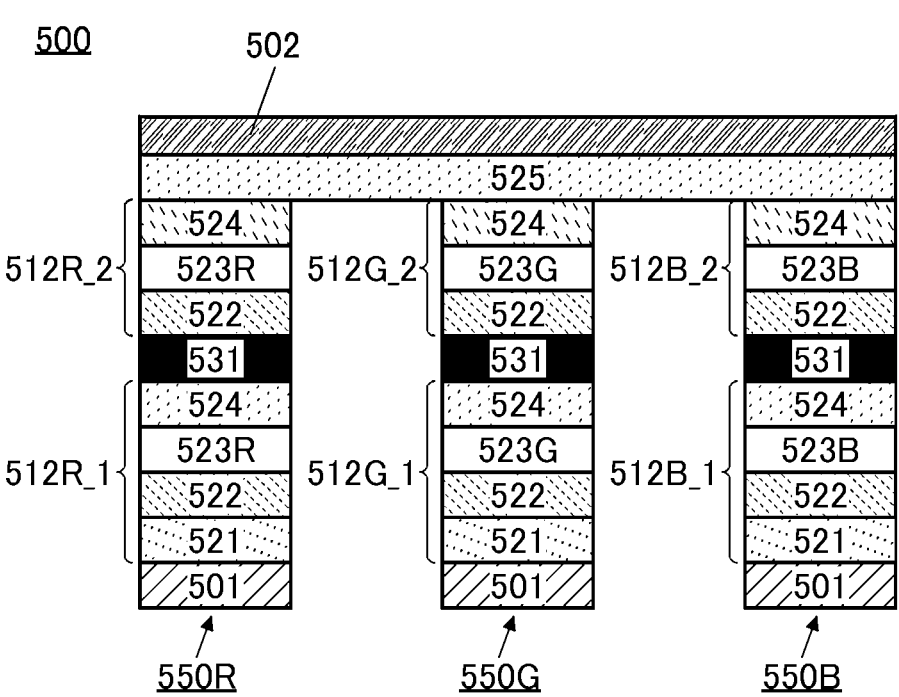

FIG. 21B illustrates a variation example of the display apparatus 500 illustrated in FIG. 21A. The display apparatus 500 illustrated in FIG. 21B is an example of the case where like the electrode 502, the layer 525 is provided to be shared by the light-emitting devices. At this time, the layer 525 can be referred to as a common layer. By providing one or more common layers for a plurality of light-emitting devices in this manner, the manufacturing process can be simplified, resulting in a reduction in manufacturing cost.

In FIG. 21B, the light-emitting unit 512R_1, the intermediate layer 531, and the light-emitting unit 512R_2 can be formed as an island-shaped layer. The light-emitting unit 512G_1, the intermediate layer 531, and the light-emitting unit 512G_2 can be formed as an island-shaped layer. The light-emitting unit 512B_1, the intermediate layer 531, and the light-emitting unit 512B_2 can be formed as an island-shaped layer.

Figure 22A:
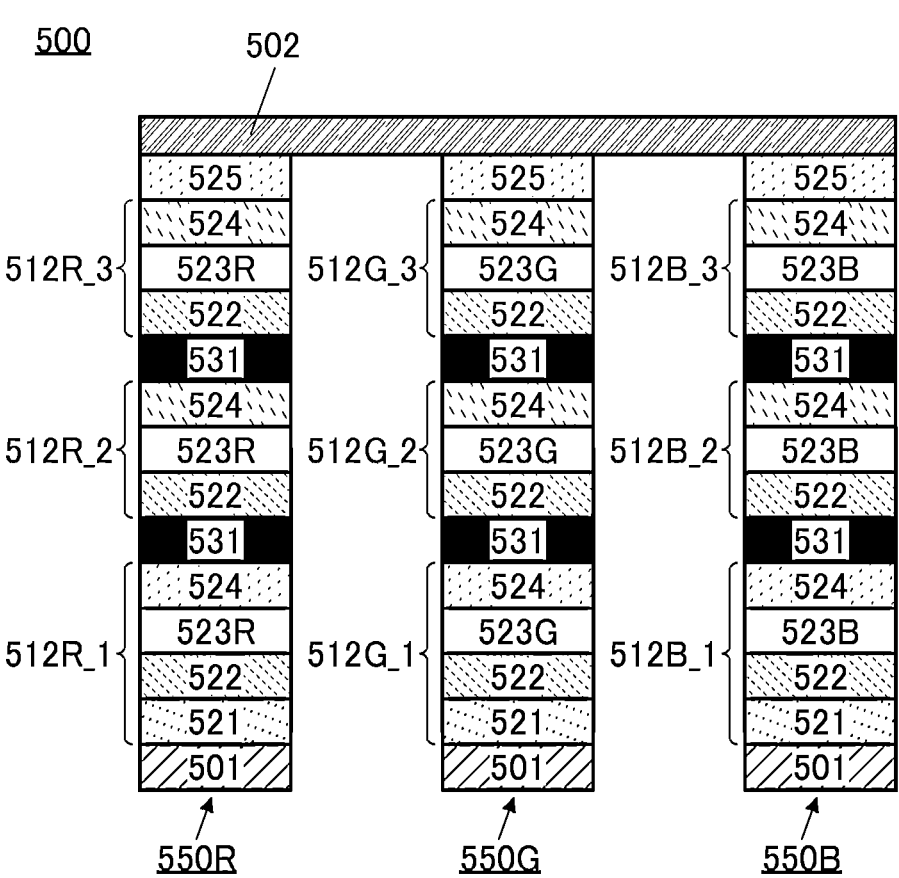
FIG. 22A and FIG. 22B are cross-sectional views illustrating examples of a display apparatus.

The display apparatus 500 illustrated in FIG. 22A is an example of the case where three light-emitting units are stacked. In the light-emitting device 550R in FIG. 22A, a light-emitting unit 512R_3 is further stacked over the light-emitting unit 512R_2 with another the intermediate layer 531 therebetween. The light-emitting unit 512R_3 includes the layer 522, the light-emitting layer 523R, the layer 524, and the like. The light-emitting unit 512R_3 can employ a structure similar to that of the light-emitting unit 512R_2. The same applies to a light-emitting unit 512G_3 included in the light-emitting device 550G and a light-emitting unit 512B_3 included in the light-emitting device 550B.

Figure 22B:
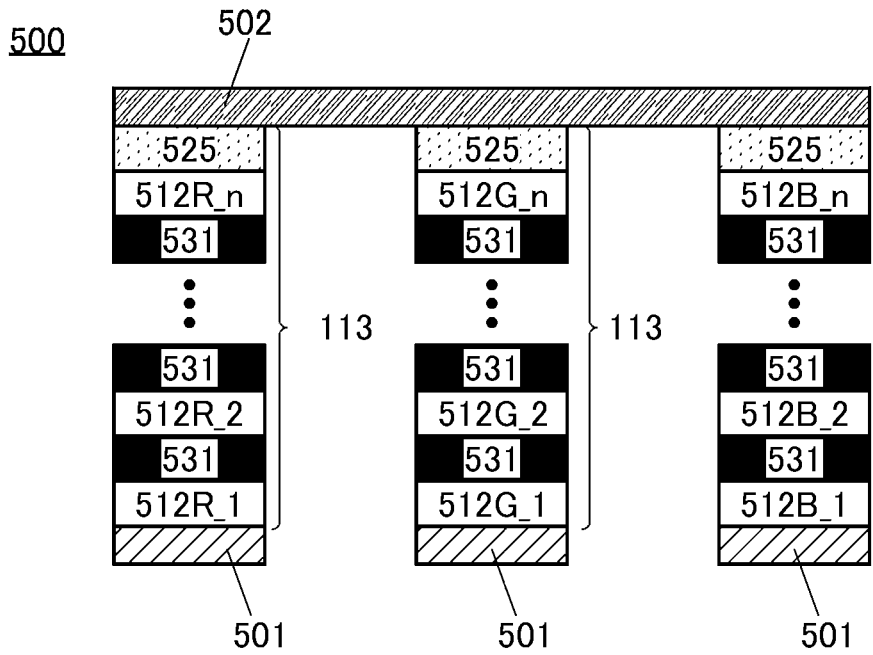

FIG. 22B illustrates an example where n light-emitting units (n is an integer greater than or equal to 2) are stacked.

When the number of stacked light-emitting units is increased in the above manner, luminance obtained from the light-emitting device with the same amount of current can be increased in accordance with the number of stacked layers. Moreover, increasing the number of stacked light-emitting units can reduce current needed for obtaining the same luminance; thus, power consumption of the light-emitting device can be reduced in accordance with the number of stacked layers.

There is no particular limitation on the light-emitting material of the light-emitting layer in the display apparatus 500. For example, in the display apparatus 500 illustrated in FIG. 21A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a fluorescent material, the light-emitting layer 523G included in the light-emitting unit 512G_2 contains a fluorescent material, the light-emitting layer 523B included in the light-emitting unit 512B_1 contains a fluorescent material, and the light-emitting layer 523B included in the light-emitting unit 512B_2 contains a fluorescent material.

Alternatively, in the display apparatus 500 illustrated in FIG. 21A, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a phosphorescent material, the light-emitting layer 523G included in the light-emitting unit 512G_2 contains a phosphorescent material, the light-emitting layer 523B included in the light-emitting unit 512B_1 contains a fluorescent material, and the light-emitting layer 523B included in the light-emitting unit 512B_2 contains a fluorescent material.

Note that in the display apparatus of one embodiment of the present invention, all the light-emitting layers may contain fluorescent materials or all the light-emitting layers may contain phosphorescent materials.

Alternatively, the display apparatus 500 illustrated in FIG. 21A may have a structure where the light-emitting layer 523R included in the light-emitting unit 512R_1 contains a phosphorescent material and the light-emitting layer 523R included in the light-emitting unit 512R_2 contains a fluorescent material, or a structure where the light-emitting layer 523R included in the light-emitting unit 512R_1 contains a fluorescent material and the light-emitting layer 523R included in the light-emitting unit 512R_2 contains a phosphorescent material, i.e., a structure where a light-emitting layer in a first unit and a light-emitting layer in a second unit are formed using different light-emitting materials. Note that although the light-emitting unit 512R_1 and the light-emitting unit 512R_2 are explicitly described here, a structure similar to the light-emitting unit 512R_1 and the light-emitting unit 512R_2 can also be employed for the light-emitting unit 512G_1 and the light-emitting unit 512G_2, and the light-emitting unit 512B_1 and the light-emitting unit 512B_2.

This embodiment can be combined with the other embodiments as appropriate.

Embodiment 6

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film formed at room temperature is in an intermediate state, which is neither a crystal state nor an amorphous state, and it cannot be concluded that the IGZO film is in an amorphous state.

«Structure of Oxide Semiconductor»

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an inter-atomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

«Structure of Oxide Semiconductor»

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^{3}$, preferably lower than or equal to $2\times10^{17}$ atoms/cm$^{3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^{3}$, preferably lower than or equal to $2\times10^{16}$ atoms/cm$^{3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier in some cases. Thus, a transistor including an oxide semiconductor containing hydrogen tends to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 7

In this embodiment, electronic devices of one embodiment of the present invention will be described with reference to FIG. 23 to FIG. 26.

An electronic device in this embodiment includes the display apparatus of one embodiment of the present invention. Resolution, definition, and sizes of the display apparatus of one embodiment of the present invention are easily increased. Thus, the display apparatus of one embodiment of the present invention can be used for display portions of a variety of electronic devices.

The display apparatus of one embodiment of the present invention can be fabricated at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display apparatus of one embodiment of the present invention can have a high resolution, and thus can be suitably used for an electronic device having a relatively small display portion. As such an electronic device, a watch-type or bracelet-type information terminal (wearable device); and a wearable device worn on a head, such as a device for VR such as a head-mounted display and a glasses-type device for AR can be given, for example. Examples of wearable devices include a device for SR and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display apparatus with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
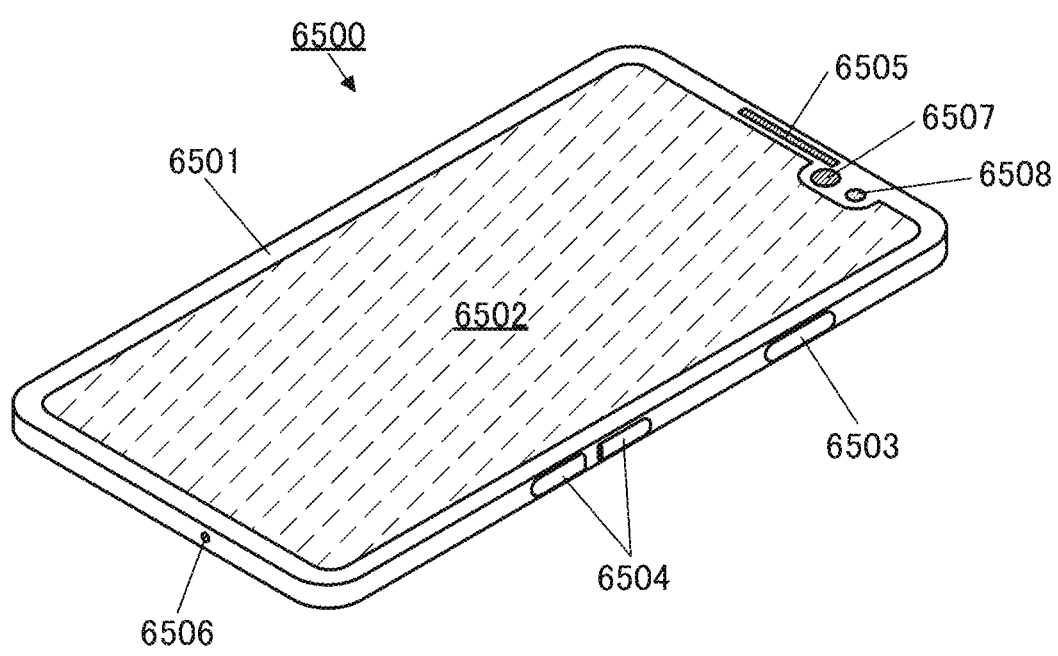
FIG. 23A and FIG. 23B are diagrams illustrating an example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 23B:
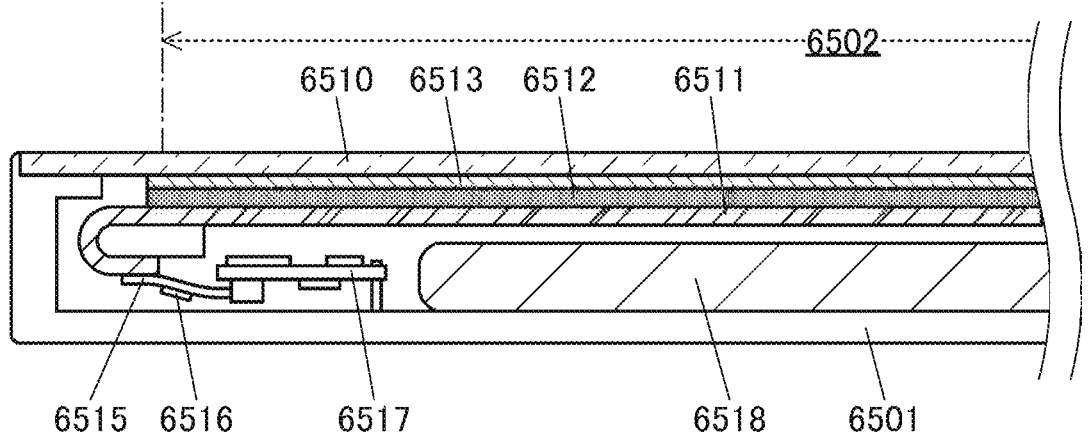

FIG. 23B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

FIG. 24A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 24A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

FIG. 24B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 24C and FIG. 24D illustrate examples of digital signage.

Digital signage 7300 illustrated in FIG. 24C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 24D illustrates digital signage 7400 mounted on a cylindrical pillar 7401. The digital signage 7400 includes the display portion 7000 provided along a curved surface of the pillar 7401.

The display apparatus of one embodiment of the present invention can be used in the display portion 7000 in each of FIG. 24C and FIG. 24D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 24C and FIG. 24D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 25A:
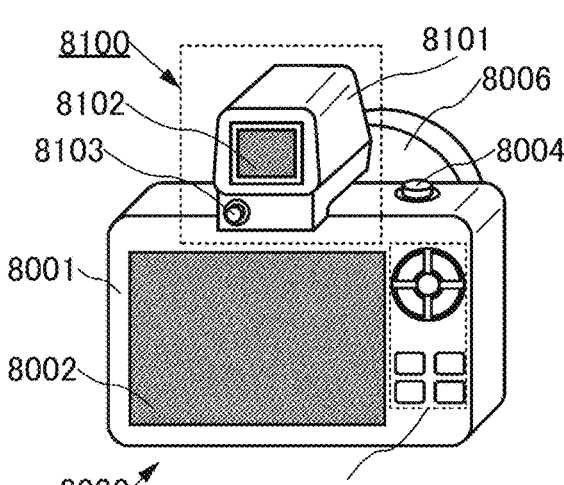
FIG. 25A to FIG. 25F are diagrams illustrating examples of an electronic device.

FIG. 25A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power button or the like.

The display apparatus of one embodiment of the present invention can be used in the display portion 8002 of the camera 8000 and the display portion 8102 of the finder 8100. Note that a finder may be incorporated in the camera 8000.

Figure 25B:
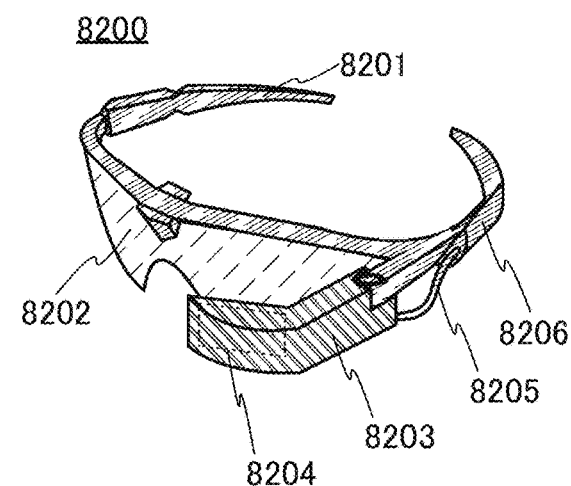

FIG. 25B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display apparatus of one embodiment of the present invention can be used in the display portion 8204.

Figure 25C:
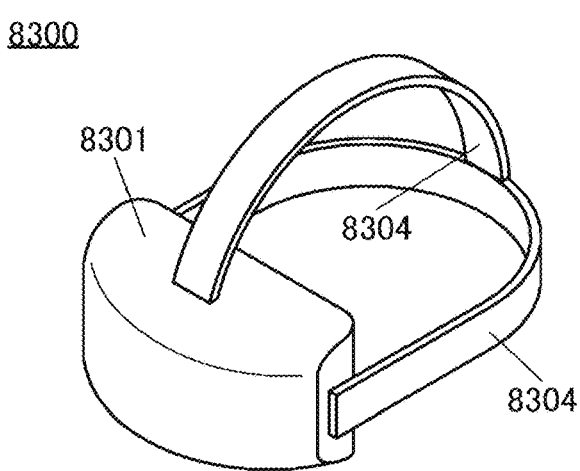
Figure 25D:
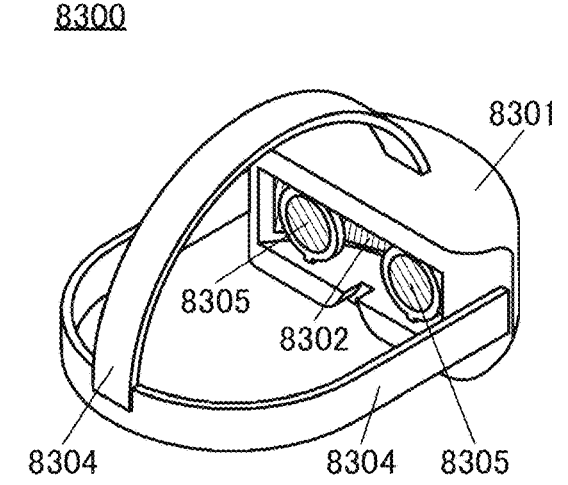
Figure 25E:
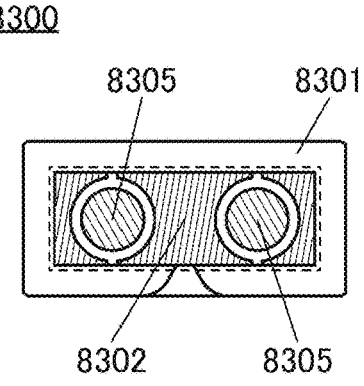

FIG. 25C to FIG. 25E are diagrams illustrating the appearance of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display apparatus of one embodiment of the present invention can be used for the display portion 8302. The display apparatus of one embodiment of the present invention achieves an extremely high resolution. For example, a pixel is not easily seen by the user even when the user sees display that is magnified by the use of the lenses 8305 as illustrated in FIG. 25E. In other words, a video with a strong sense of reality can be seen by the user with use of the display portion 8302.

Figure 25F:
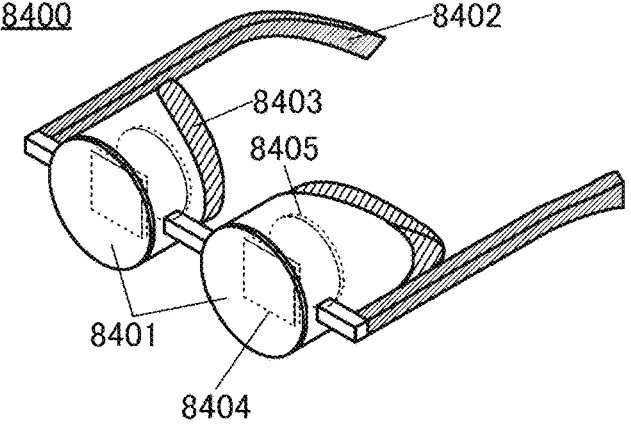

FIG. 25F is an external view of a goggles-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only when wearing the head-mounted display 8400.

Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 26A to FIG. 26G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays), a microphone 9008, and the like.

The electronic devices illustrated in FIG. 26A to FIG. 26G have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used for the display portion 9001.

The electronic devices illustrated in FIG. 26A to FIG. 26G will be described in detail below.

Figure 26A:
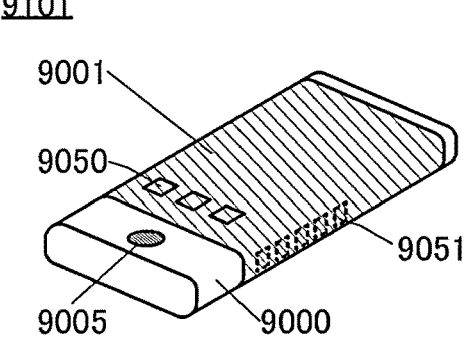
FIG. 26A to FIG. 26G are diagrams illustrating examples of an electronic device.

FIG. 26A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 26A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the reception strength of an antenna. Alternatively, the icon 9050 or the like may be displayed at the position where the information 9051 is displayed.

Figure 26B:
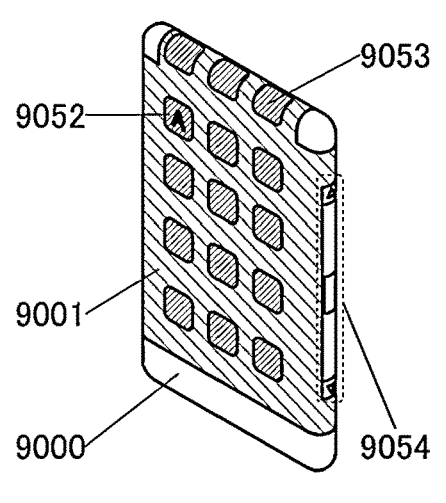

FIG. 26B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 26C:
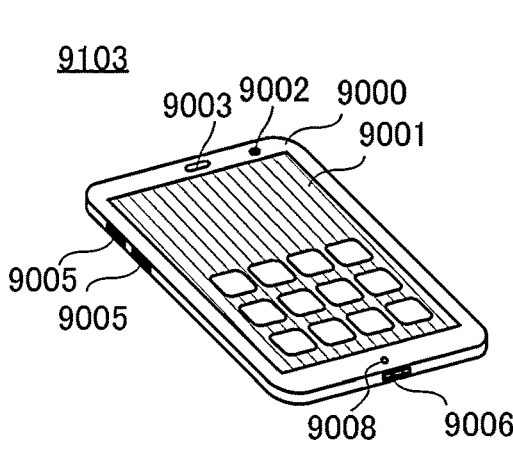

FIG. 26C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 26D:
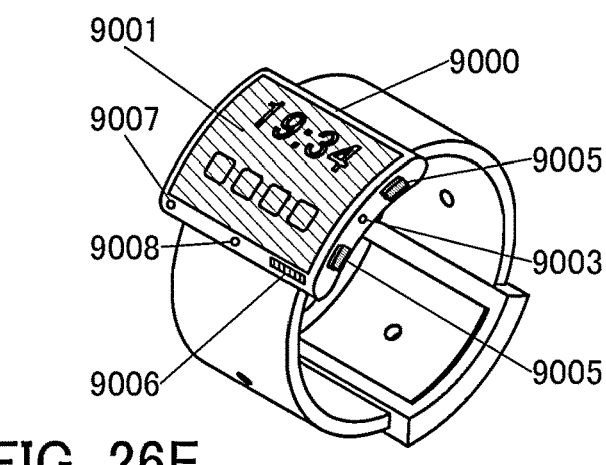

FIG. 26D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 26E:
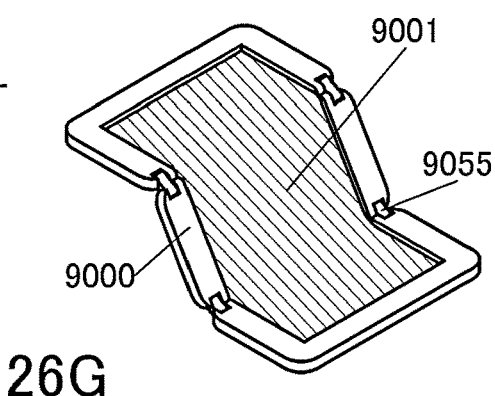
Figure 26F:
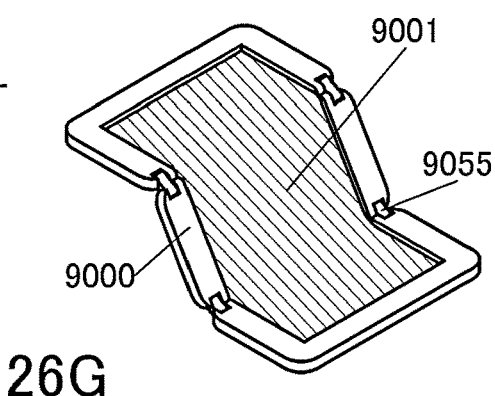
Figure 26G:
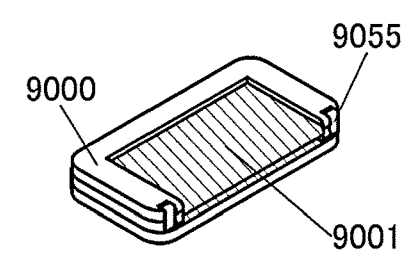

FIG. 26E to FIG. 26G are perspective views illustrating a foldable portable information terminal 9201. FIG. 26E is a perspective view of an opened state of the portable information terminal 9201, FIG. 26G is a perspective view of a folded state thereof, and FIG. 26F is a perspective view of a state in the middle of change from one of FIG. 26E and FIG. 26G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

REFERENCE NUMERALS

C1: capacitor, C2: capacitor, C3: capacitor, M1: transistor, M2: transistor, M3: transistor, M11: transistor, M12: transistor, M13: transistor, M14: transistor, M15: transistor, M16: transistor, M17: transistor, OUT1: wiring, OUT2: wiring, PIX1: pixel circuit, PIX2: pixel circuit, V1: wiring, V2: wiring, V3: wiring, V4: wiring, V5: wiring, 10: display apparatus, 11: display portion, 12: driver circuit portion, 13: driver circuit portion, 21: pixel, 21B: subpixel, 21G: subpixel, 21R: subpixel, 30: pixel, 50: electronic device, 52: support, 54: desk, 100: display apparatus, 103: pixel, 110: light-emitting element, 110B: light-emitting element, 110G: light-emitting element, 110PS: light-receiving element, 110R: light-emitting element, 111: pixel electrode, 111B: pixel electrode, 111C: connection electrode, 111f: conductive film, 111G: pixel electrode, 111PS: pixel electrode, 111R: pixel electrode, 112: EL layer, 112B: EL layer, 112Bf: EL film, 112G: EL layer, 112Gf: EL film, 112PS: active layer, 112R: EL layer, 112Rf: EL film, 113: common electrode, 114: common layer, 117: conductive layer, 117B: conductive layer, 117C: conductive layer, 117f: conductive film, 117G: conductive layer, 117PS: conductive layer, 117R: conductive layer, 121: protective layer, 125a: pixel, 125b: pixel, 129: opening portion, 129B: opening portion, 129G: opening portion, 129R: opening portion, 130: region, 131: insulating layer, 131a: insulating layer, 131af: insulating film, 131b: insulating layer, 131bf: insulating film, 132: insulating layer, 138: region, 139: region, 143a: resist mask, 143b: resist mask, 143c: resist mask, 144a: sacrificial film, 144b: sacrificial film, 144c: sacrificial film, 145a: sacrificial layer, 145b: sacrificial layer, 145c: sacrificial layer, 146a: sacrificial film, 146b: sacrificial film, 146c: sacrificial film, 147a: sacrificial layer, 147b: sacrificial layer, 147c: sacrificial layer, 201: transistor, 204: connection portion, 205: transistor, 209: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 241: conductive layer, 241B: conductive layer, 241G: conductive layer, 241PS: conductive layer, 241R: conductive layer, 242: connection layer, 255: insulating layer, 280: display module, 281: display portion, 282: circuit portion, 283: pixel circuit portion, 283a: pixel circuit, 284: pixel portion, 284a: pixel, 285: terminal portion, 286: wiring portion, 290: FPC, 291: substrate, 292: substrate, 301: substrate, 302: substrate, 310: transistor, 310a: transistor, 311: semiconductor layer, 311i: channel formation region, 311n: low-resistance region, 312: insulating layer, 313: conductive layer, 314a: conductive layer, 314b: conductive layer, 315: conductive layer, 316: insulating layer, 321: insulating layer, 322: insulating layer, 323: insulating layer, 325: adhesive layer, 326: insulating layer, 330: light-emitting element, 330G: light-emitting element, 330R: light-emitting element, 331a: conductive layer, 331b: conductive layer, 332G: EL layer, 332R: EL layer, 333: conductive layer, 334: common layer, 335: insulating layer, 350: transistor, 350a: transistor, 351: semiconductor layer, 352: insulating layer, 353: conductive layer, 354a: conductive layer, 354b: conductive layer, 355: conductive layer, 361: insulating layer, 362: insulating layer, 363: insulating layer, 400A: display apparatus, 400C: display apparatus, 401: layer, 410: protective layer, 411a: conductive layer, 411b: conductive layer, 411c: conductive layer, 414: insulating layer, 416a: EL layer, 416b: EL layer, 416c: EL layer, 417: light-blocking layer, 418a: conductive layer, 418b: conductive layer, 418c: conductive layer, 421: insulating layer, 421b: insulating layer, 430a: light-emitting element, 430b: light-emitting element, 430c: light-emitting element, 442: adhesive layer,

443: space, 451: substrate, 452: substrate, 462: display portion, 464: circuit, 465: wiring, 466: conductive layer, 472: FPC, 473: IC, 500: display apparatus, 501: electrode, 502: electrode, 512B_1: light-emitting unit, 512B_2: light-emitting unit, 512B_3: light-emitting unit, 512G_1: light-emitting unit, 512G_2: light-emitting unit, 512G_3: light-emitting unit, 512R_1: light-emitting unit, 512R_2: light-emitting unit, 512R_3: light-emitting unit, 521: layer, 522: layer, 523B: light-emitting layer, 523G: light-emitting layer, 523R: light-emitting layer, 524: layer, 525: layer, 531: intermediate layer, 550B: light-emitting device, 550G: light-emitting device, 550R: light-emitting device, 772: lower electrode, 785: coloring layer, 786: EL layer, 786a: EL layer, 786b: EL layer, 788: upper electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power source button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9002: camera, 9003: speaker, 9005: control key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising a plurality of pixels over a first insulating layer, wherein each of the plurality of pixels comprises a first conductive layer provided along an opening portion of the first insulating layer, a second insulating layer over the first conductive layer, an EL layer over the first conductive layer and the second insulating layer, and a common electrode over the EL layer, wherein the common electrode is shared by the plurality of pixels, wherein the second insulating layer is over and in contact with the first conductive layer and placed below the EL layer, wherein the first conductive layers of adjacent pixels among the plurality of pixels are separated by a third insulating layer comprising an inorganic material and a fourth insulating layer comprising an organic material, wherein a side surface of the first conductive layer and a side surface of the EL layer each comprise a region in contact with the third insulating layer, and wherein the fourth insulating layer is over and in contact with the third insulating layer and placed below the common electrode.

2. The display apparatus according to claim 1,
wherein the third insulating layer comprises aluminum and oxygen.

3. A display apparatus comprising a first pixel and a second pixel placed to be adjacent to the first pixel over a first insulating layer,
wherein the first pixel comprises a first light-emitting element comprising a first conductive layer provided along a first opening portion of the first insulating layer, a second insulating layer over the first conductive layer, a first EL layer over the first conductive layer and the second insulating layer, and a common electrode over the first EL layer,
wherein the second pixel comprises a second light-emitting element comprising a second conductive layer provided along a second opening portion of the first insulating layer, a third insulating layer over the second conductive layer, a second EL layer over the second conductive layer and the third insulating layer, and the common electrode over the second EL layer,
wherein a fourth insulating layer is further included,
wherein a side surface of the first conductive layer, a side surface of the first EL layer, a side surface of the second conductive layer, and a side surface of the second EL layer each comprise a region in contact with the fourth insulating layer,
wherein a fifth insulating layer provided over and in contact with the fourth insulating layer and placed below the common electrode is further included,
wherein the second insulating layer is provided over and in contact with the first conductive layer and placed below the first EL layer,
wherein the third insulating layer is over and in contact with the second conductive layer and placed below the second EL layer,
wherein the fourth insulating layer comprises an inorganic material, and
wherein the fifth insulating layer comprises an organic material.

4. The display apparatus according to claim 3,
wherein the fourth insulating layer comprises aluminum and oxygen.

5. A display apparatus comprising a plurality of pixels over a first insulating layer,
wherein each of the plurality of pixels comprises a light-emitting device and a light-receiving device,
wherein the light-emitting device comprises a first conductive layer provided along an opening portion of the first insulating layer, a second insulating layer over the first conductive layer, an EL layer over the first conductive layer and the second insulating layer, and a common electrode over the EL layer,
wherein the common electrode is shared by the plurality of pixels, wherein the second insulating layer is over and in contact with the first conductive layer and placed below the EL layer,
wherein the first conductive layers of adjacent pixels among the plurality of pixels are separated by a third insulating layer comprising an inorganic material and a fourth insulating layer comprising an organic material,
wherein a side surface of the first conductive layer and a side surface of the EL layer each comprise a region in contact with the third insulating layer,
wherein the fourth insulating layer is over and in contact with the third insulating layer and placed below the common electrode, and
wherein the light-receiving device is configured to detect at least one of visible light and infrared light.

6. The display apparatus according to claim 5,
wherein the light-receiving device functions as an image sensor.

7. The display apparatus according to claim 5,
wherein the light-receiving device functions as a touch sensor or a near touch sensor.

8. A display apparatus comprising a first pixel and a second pixel placed to be adjacent to the first pixel over a first insulating layer,
wherein the first pixel comprises a light-emitting device comprising a first conductive layer provided along a first opening portion of the first insulating layer, a second insulating layer over the first conductive layer, and an EL layer over the first conductive layer and the second insulating layer,
wherein the second pixel comprises a light-receiving device comprising a second conductive layer provided along a second opening portion of the first insulating layer, a third insulating layer over the second conductive layer, and an active layer over the second conductive layer and the third insulating layer,
wherein a side surface of the first conductive layer, a side surface of the EL layer, and a side surface of the second conductive layer each comprise a region in contact with the fourth insulating layer,
wherein a fifth insulating layer provided over and in contact with the fourth insulating layer is further included,
wherein the second insulating layer is over and in contact with the first conductive layer and placed below the EL layer,
wherein the third insulating layer is over and in contact with the second conductive layer and placed below the active layer,
wherein the fourth insulating layer comprises an inorganic material, and
wherein the fifth insulating layer comprises an organic material.

9. The display apparatus according to claim 8, further comprising a common electrode over the EL layer and the active layer,
wherein the third insulating layer and the fifth insulating layer are placed below the common electrode.

* * * * *